US012660250B2

(12) United States Patent (10) Patent No.: US 12,660,250 B2
Chien et al. (45) Date of Patent: Jun. 16, 2026

(54) THREE-DIMENSIONAL MEMORY STRING ARRAY OF THIN-FILM FERROELECTRIC TRANSISTORS FORMED WITH AN OXIDE SEMICONDUCTOR CHANNEL IN A CHANNEL LAST PROCESS

(71) Applicant: SUNRISE MEMORY CORPORATION, San Jose, CA (US)

(72) Inventors: Wu-Yi Henry Chien, San Jose, CA (US); Christopher J. Petti, Mountain View, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 805 days.

(21) Appl. No.: 17/823,464

(22) Filed: Aug. 30, 2022

(65) Prior Publication Data

US 2023/0078883 A1 Mar. 16, 2023

Related U.S. Application Data

(60) Provisional application No. 63/243,856, filed on Sep. 14, 2021.

(51) Int. Cl.
*H10D 30/67* (2025.01)
*H10B 51/10* (2023.01)
(Continued)

(52) U.S. Cl.
CPC ......... *H10D 30/6756* (2025.01); *H10B 51/10* (2023.02); *H10B 51/20* (2023.02);
(Continued)

(58) Field of Classification Search
CPC ........... H10D 30/6756; H10D 30/6755; H10D 30/701; H10B 51/20; H10B 51/30
See application file for complete search history.

(56) References Cited

U.S. PATENT DOCUMENTS

| 4,213,139 A | 7/1980 | Rao |
| 4,984,153 A | 1/1991 | Kregness et al. |
| (Continued) | | |

FOREIGN PATENT DOCUMENTS

| CN | 111799263 A | 10/2020 |
| JP | 1998-269789 A2 | 10/1998 |
| (Continued) | | |

OTHER PUBLICATIONS

"EP Extended Search Report EP168690149.3", Oct. 18, 2019.
(Continued)

*Primary Examiner* — Vincent Wall

(57) ABSTRACT

A memory structure includes storage transistors organized as horizontal NOR memory strings where the storage transistors are thin-film ferroelectric field-effect transistors (FeFETs) having a ferroelectric gate dielectric layer formed adjacent an oxide semiconductor channel region. The ferroelectric storage transistors thus formed are junctionless transistors having no p/n junction in the channel. In some embodiments, the ferroelectric storage transistors in each NOR memory string share a common source line and a common bit line that are formed on a first side of the channel region, away from the ferroelectric gate dielectric layer, and in electrical contact with the oxide semiconductor channel region. The ferroelectric storage transistors in a NOR memory string are controlled by individual control gate electrodes that are formed adjacent the ferroelectric gate dielectric layer on a second side, opposite the first side, of the channel region.

20 Claims, 28 Drawing Sheets

(51) Int. Cl.

| | |
|---|---|
| *H10B 51/20* | (2023.01) |
| *H10B 51/30* | (2023.01) |
| *H10B 51/40* | (2023.01) |
| *H10D 30/69* | (2025.01) |
| *H10D 62/13* | (2025.01) |
| *H10D 64/68* | (2025.01) |
| *H10D 99/00* | (2025.01) |

(52) U.S. Cl.
CPC ............. *H10B 51/30* (2023.02); *H10B 51/40* (2023.02); *H10D 30/6757* (2025.01); *H10D 30/701* (2025.01); *H10D 62/151* (2025.01); *H10D 64/689* (2025.01); *H10D 99/00* (2025.01)

(56) References Cited

U.S. PATENT DOCUMENTS

| | | | |
|---|---|---|---|
| 5,388,246 A | 2/1995 | Kasai | |
| 5,583,808 A | 12/1996 | Brahmbhatt | |
| 5,646,886 A | 7/1997 | Brahmbhatt | |
| 5,656,842 A | 8/1997 | Iwamatsu | |
| 5,768,192 A | 6/1998 | Eitan | |
| 5,789,776 A | 8/1998 | Lancaster et al. | |
| 5,880,993 A | 3/1999 | Kramer et al. | |
| 5,915,167 A | 6/1999 | Leedy | |
| 6,040,605 A | 3/2000 | Sano et al. | |
| 6,057,862 A | 5/2000 | Margulis | |
| 6,107,133 A | 8/2000 | Furukawa | |
| 6,118,171 A | 9/2000 | Davies et al. | |
| 6,130,838 A | 10/2000 | Kim et al. | |
| 6,313,518 B1 | 11/2001 | Ahn et al. | |
| 6,314,046 B1 | 11/2001 | Kamiya et al. | |
| 6,362,508 B1 | 3/2002 | Rasovaky et al. | |
| 6,434,053 B1 | 8/2002 | Fujiwara | |
| 6,580,124 B1 | 6/2003 | Cleeves et al. | |
| 6,587,365 B1 | 7/2003 | Salling | |
| 6,627,503 B2 | 9/2003 | Ma | |
| 6,744,094 B2 | 6/2004 | Forbes | |
| 6,754,105 B1 | 6/2004 | Chang et al. | |
| 6,774,458 B2 | 8/2004 | Fricke et al. | |
| 6,873,004 B1 | 3/2005 | Han et al. | |
| 6,881,994 B2 | 4/2005 | Lee et al. | |
| 6,946,703 B2 * | 9/2005 | Ryu | H10D 30/69 |
| | | | 257/E29.322 |
| 7,005,350 B2 | 2/2006 | Walker et al. | |
| 7,223,653 B2 | 5/2007 | Cheng et al. | |
| 7,307,308 B2 | 12/2007 | Lee | |
| 7,426,141 B2 | 9/2008 | Takeuchi | |
| 7,465,980 B2 | 12/2008 | Arimoto et al. | |
| 7,489,002 B2 * | 2/2009 | Forbes | H10D 30/025 |
| | | | 257/301 |
| 7,495,963 B2 | 2/2009 | Edahiro et al. | |
| 7,512,012 B2 * | 3/2009 | Kuo | H10D 30/0413 |
| | | | 438/257 |
| 7,524,725 B2 | 4/2009 | Chung | |
| 7,542,348 B1 | 6/2009 | Kim | |
| 7,612,411 B2 | 11/2009 | Walker | |
| 7,709,359 B2 | 5/2010 | Boes et al. | |
| 7,804,145 B2 | 9/2010 | Shimizu et al. | |
| 7,872,295 B2 | 1/2011 | Park et al. | |
| 7,876,614 B2 | 1/2011 | Kang et al. | |
| 7,898,009 B2 | 3/2011 | Wilson et al. | |
| 8,026,521 B1 | 9/2011 | Or-Bach et al. | |
| 8,139,418 B2 * | 3/2012 | Carman | H10D 84/617 |
| | | | 365/185.27 |
| 8,178,396 B2 | 5/2012 | Sinha et al. | |
| 8,237,213 B2 | 8/2012 | Liu | |
| 8,242,504 B2 | 8/2012 | Kim | |
| 8,278,183 B2 | 10/2012 | Lerner | |
| 8,304,823 B2 | 11/2012 | Boescke | |
| 8,383,482 B2 | 2/2013 | Kim et al. | |
| 8,395,942 B2 | 3/2013 | Samachisa et al. | |
| 8,604,618 B2 | 12/2013 | Cooney et al. | |

| | | | |
|---|---|---|---|
| 8,630,114 B2 * | 1/2014 | Lue | G11C 11/4097 |
| | | | 365/185.05 |
| 8,743,612 B2 | 6/2014 | Choi et al. | |
| 8,767,436 B2 | 7/2014 | Scalia et al. | |
| 8,767,473 B2 | 7/2014 | Shim et al. | |
| 8,848,425 B2 | 9/2014 | Schloss | |
| 8,878,278 B2 | 11/2014 | Alsmeier et al. | |
| 9,053,801 B2 | 6/2015 | Sandhu et al. | |
| 9,053,802 B2 | 6/2015 | Mueller | |
| 9,105,310 B2 | 8/2015 | Li et al. | |
| 9,158,622 B2 | 10/2015 | Lee et al. | |
| 9,190,293 B2 | 11/2015 | Wang et al. | |
| 9,202,694 B2 * | 12/2015 | Konevecki | H10N 70/8265 |
| 9,219,225 B2 | 12/2015 | Karda et al. | |
| 9,230,985 B1 * | 1/2016 | Wu | H10D 30/031 |
| 9,231,206 B2 | 1/2016 | Tao et al. | |
| 9,263,577 B2 | 2/2016 | Ramaswamy et al. | |
| 9,281,044 B2 * | 3/2016 | Ramaswamy | H10B 51/20 |
| 9,299,580 B2 | 3/2016 | Kong et al. | |
| 9,337,210 B2 * | 5/2016 | Karda | H10B 43/35 |
| 9,362,487 B2 | 6/2016 | Inumiya et al. | |
| 9,391,084 B2 | 7/2016 | Lue | |
| 9,412,752 B1 | 8/2016 | Yeh et al. | |
| 9,455,268 B2 * | 9/2016 | Oh | H10B 43/50 |
| 9,472,560 B2 | 10/2016 | Ramaswamy et al. | |
| 9,530,794 B2 * | 12/2016 | Ramaswamy | H10D 30/701 |
| 9,558,804 B2 | 1/2017 | Mue | |
| 9,620,605 B2 | 4/2017 | Liang et al. | |
| 9,633,944 B2 | 4/2017 | Kim | |
| 9,698,152 B2 | 7/2017 | Peri | |
| 9,711,529 B2 | 7/2017 | Hu et al. | |
| 9,748,172 B2 | 8/2017 | Takaki | |
| 9,786,684 B2 | 10/2017 | Ramaswamy et al. | |
| 9,799,761 B2 | 10/2017 | Or-Bach et al. | |
| 9,818,468 B2 | 11/2017 | Müller | |
| 9,818,848 B2 | 11/2017 | Sun et al. | |
| 9,830,969 B2 | 11/2017 | Slesazeck et al. | |
| 9,842,651 B2 | 12/2017 | Harari | |
| 9,865,680 B2 | 1/2018 | Okumura et al. | |
| 9,875,784 B1 * | 1/2018 | Li | H10B 51/30 |
| 9,876,018 B2 | 1/2018 | Chavan et al. | |
| 9,892,800 B2 * | 2/2018 | Harari | H10D 88/00 |
| 9,911,497 B1 | 3/2018 | Harari | |
| 9,941,299 B1 | 4/2018 | Chen et al. | |
| 10,014,317 B2 | 7/2018 | Peng | |
| 10,038,092 B1 | 7/2018 | Chen et al. | |
| 10,043,567 B2 | 8/2018 | Slesazeck et al. | |
| 10,056,393 B2 | 8/2018 | Schroeder et al. | |
| 10,074,667 B1 | 9/2018 | Higashi | |
| 10,090,036 B2 | 10/2018 | Van Houdt | |
| 10,096,364 B2 | 10/2018 | Harari | |
| 10,121,553 B2 * | 11/2018 | Harari | G11C 16/0483 |
| 10,157,780 B2 | 12/2018 | Wu et al. | |
| 10,211,223 B2 | 2/2019 | Van Houdt et al. | |
| 10,211,312 B2 | 2/2019 | Van Houdt et al. | |
| 10,217,667 B2 | 2/2019 | Or-Bach et al. | |
| 10,217,795 B1 * | 2/2019 | Franca-Neto | H10B 63/84 |
| 10,249,370 B2 | 4/2019 | Harari | |
| 10,254,968 B1 | 4/2019 | Gazit et al. | |
| 10,283,493 B1 | 5/2019 | Nishida | |
| 10,319,696 B1 | 6/2019 | Nakano | |
| 10,355,121 B2 | 7/2019 | Or-Bach et al. | |
| 10,373,956 B2 | 8/2019 | Gupta et al. | |
| 10,381,370 B2 | 8/2019 | Shin et al. | |
| 10,381,378 B1 | 8/2019 | Harari | |
| 10,395,737 B2 | 8/2019 | Harari | |
| 10,403,627 B2 | 9/2019 | Van Houdt et al. | |
| 10,418,377 B2 | 9/2019 | Van Houdt et al. | |
| 10,424,379 B2 | 9/2019 | Slesazeck et al. | |
| 10,431,596 B2 * | 10/2019 | Herner | H10D 62/151 |
| 10,438,645 B2 | 10/2019 | Muell et al. | |
| 10,460,788 B2 | 10/2019 | Mueller | |
| 10,475,812 B2 | 11/2019 | Harari | |
| 10,510,773 B2 | 12/2019 | Ramaswamy et al. | |
| 10,600,808 B2 | 3/2020 | Schröder et al. | |
| 10,608,008 B2 | 3/2020 | Harari et al. | |
| 10,608,011 B2 | 3/2020 | Harari et al. | |
| 10,622,051 B2 | 4/2020 | Mueller et al. | |
| 10,622,377 B2 | 4/2020 | Harari et al. | |

(56)  References Cited

U.S. PATENT DOCUMENTS

| | | | |
|---|---|---|---|
| 10,636,471 B2 | 4/2020 | Ramaswamy et al. | |
| 10,650,892 B2 | 5/2020 | Noack | |
| 10,651,153 B2 | 5/2020 | Fastow et al. | |
| 10,651,182 B2 | 5/2020 | Morris et al. | |
| 10,651,196 B1 | 5/2020 | Sharangpani et al. | |
| 10,692,837 B1 | 6/2020 | Nguyen et al. | |
| 10,692,874 B2 | 6/2020 | Harari et al. | |
| 10,700,093 B2 | 6/2020 | Kalitsov et al. | |
| 10,720,437 B2 | 7/2020 | Yoo | |
| 10,825,834 B1 | 11/2020 | Chen | |
| 10,872,905 B2 | 12/2020 | Muel | |
| 10,879,269 B1 | 12/2020 | Zhang et al. | |
| 10,896,711 B2 | 1/2021 | Lee et al. | |
| 10,937,482 B2 | 3/2021 | Sharma et al. | |
| 10,950,616 B2 | 3/2021 | Harari et al. | |
| 11,171,157 B1 | 11/2021 | Lai et al. | |
| 11,217,494 B1 | 1/2022 | Young et al. | |
| 11,380,709 B2* | 7/2022 | Dong | H10B 51/30 |
| 11,411,025 B2 | 8/2022 | Lai et al. | |
| 11,610,909 B2* | 3/2023 | Harari | H10B 41/27 |
| 2001/0030340 A1 | 10/2001 | Fujiwara | |
| 2001/0038132 A1 | 11/2001 | Ahn et al. | |
| 2001/0053092 A1 | 12/2001 | Kosaka et al. | |
| 2002/0012271 A1 | 1/2002 | Forbes | |
| 2002/0028541 A1 | 3/2002 | Lee et al. | |
| 2002/0051378 A1 | 5/2002 | Ohsawa | |
| 2002/0193484 A1 | 12/2002 | Albee | |
| 2003/0038318 A1 | 2/2003 | Forbes | |
| 2004/0214387 A1 | 10/2004 | Madurawe et al. | |
| 2004/0246807 A1 | 12/2004 | Lee | |
| 2004/0262681 A1 | 12/2004 | Masuoka et al. | |
| 2004/0262772 A1 | 12/2004 | Ramanathan et al. | |
| 2004/0264247 A1 | 12/2004 | Kim | |
| 2005/0128815 A1 | 6/2005 | Ishikawa et al. | |
| 2005/0236625 A1 | 10/2005 | Schuele et al. | |
| 2005/0280061 A1* | 12/2005 | Lee | H10B 12/315 |
| | | | 257/296 |
| 2006/0001083 A1 | 1/2006 | Bhattacharyya | |
| 2006/0080457 A1 | 4/2006 | Hiramatsu et al. | |
| 2006/0155921 A1 | 7/2006 | Gorobets et al. | |
| 2006/0212651 A1 | 9/2006 | Ashmore | |
| 2006/0261404 A1 | 11/2006 | Forbes | |
| 2007/0012987 A1 | 1/2007 | McTeer | |
| 2007/0023817 A1 | 2/2007 | Dao | |
| 2007/0045711 A1 | 3/2007 | Bhattacharyya | |
| 2007/0134876 A1 | 6/2007 | Lai et al. | |
| 2007/0192518 A1 | 8/2007 | Rupanagunta et al. | |
| 2008/0022026 A1 | 1/2008 | Yang et al. | |
| 2008/0054346 A1 | 3/2008 | Saitoh et al. | |
| 2008/0149992 A1 | 6/2008 | Gidon | |
| 2008/0160765 A1 | 7/2008 | Lee et al. | |
| 2008/0173930 A1 | 7/2008 | Watanabe | |
| 2008/0178794 A1 | 7/2008 | Cho et al. | |
| 2008/0212358 A1 | 9/2008 | Mitsui | |
| 2008/0239812 A1 | 10/2008 | Naofumi et al. | |
| 2008/0266960 A1 | 10/2008 | Kuo | |
| 2008/0291723 A1 | 11/2008 | Wang et al. | |
| 2008/0301359 A1 | 12/2008 | Smith | |
| 2009/0057722 A1* | 3/2009 | Masuoka | H10D 84/85 |
| | | | 257/E27.07 |
| 2009/0135651 A1 | 5/2009 | Kojima et al. | |
| 2009/0140318 A1 | 6/2009 | Dong | |
| 2009/0157946 A1 | 6/2009 | Arya | |
| 2009/0237996 A1 | 9/2009 | Kirsch et al. | |
| 2009/0268519 A1 | 10/2009 | Ishii | |
| 2009/0279360 A1 | 11/2009 | Peter et al. | |
| 2009/0290442 A1 | 11/2009 | Rajan | |
| 2009/0316487 A1 | 12/2009 | Lee et al. | |
| 2010/0013001 A1 | 1/2010 | Cho et al. | |
| 2010/0121994 A1 | 5/2010 | Kim et al. | |
| 2010/0124116 A1 | 5/2010 | Takashi et al. | |
| 2010/0128509 A1 | 5/2010 | Kim et al. | |
| 2010/0148215 A1 | 6/2010 | Schulze et al. | |
| 2010/0207172 A1* | 8/2010 | Masuoka | H10D 30/63 |
| | | | 438/212 |
| 2010/0207185 A1* | 8/2010 | Lee | H01L 23/535 |
| | | | 257/314 |
| 2010/0219392 A1 | 9/2010 | Awaya et al. | |
| 2010/0254191 A1 | 10/2010 | Son et al. | |
| 2010/0327413 A1 | 12/2010 | Lee et al. | |
| 2011/0003418 A1 | 1/2011 | Sakata et al. | |
| 2011/0044113 A1 | 2/2011 | Kim | |
| 2011/0047325 A1 | 2/2011 | Mishima | |
| 2011/0115011 A1 | 5/2011 | Masuoka et al. | |
| 2011/0134705 A1 | 6/2011 | Jones et al. | |
| 2011/0143519 A1 | 6/2011 | Lerner | |
| 2011/0170266 A1 | 7/2011 | Haensh et al. | |
| 2011/0208905 A1 | 8/2011 | Shaeffer et al. | |
| 2011/0215331 A1* | 9/2011 | Yamazaki | H10D 86/201 |
| | | | 438/158 |
| 2011/0298013 A1* | 12/2011 | Hwang | G11C 16/0483 |
| | | | 257/365 |
| 2011/0310683 A1 | 12/2011 | Gorobets | |
| 2012/0063223 A1 | 3/2012 | Lee | |
| 2012/0146126 A1 | 6/2012 | Lai et al. | |
| 2012/0182801 A1* | 7/2012 | Lue | H10B 20/25 |
| | | | 365/185.05 |
| 2012/0208347 A1* | 8/2012 | Hwang | H01L 21/762 |
| | | | 257/E21.546 |
| 2012/0223380 A1 | 9/2012 | Lee et al. | |
| 2012/0243314 A1 | 9/2012 | Takashi | |
| 2012/0307568 A1 | 12/2012 | Banna et al. | |
| 2012/0327714 A1 | 12/2012 | Lue | |
| 2013/0031325 A1 | 1/2013 | Nakamoto et al. | |
| 2013/0126957 A1 | 5/2013 | Higashitani et al. | |
| 2013/0256780 A1 | 10/2013 | Kai et al. | |
| 2014/0015036 A1 | 1/2014 | Fursin et al. | |
| 2014/0040698 A1 | 2/2014 | Loh et al. | |
| 2014/0070289 A1 | 3/2014 | Tanaka et al. | |
| 2014/0070290 A1 | 3/2014 | Inumiya et al. | |
| 2014/0075135 A1 | 3/2014 | Choi et al. | |
| 2014/0112075 A1 | 4/2014 | Dunga et al. | |
| 2014/0117366 A1 | 5/2014 | Saitoh | |
| 2014/0151774 A1 | 6/2014 | Rhie | |
| 2014/0173017 A1 | 6/2014 | Takagi et al. | |
| 2014/0213032 A1* | 7/2014 | Kai | H10B 63/80 |
| | | | 438/382 |
| 2014/0229131 A1 | 8/2014 | Cohen et al. | |
| 2014/0247674 A1 | 9/2014 | Karda et al. | |
| 2014/0328128 A1 | 11/2014 | Louie et al. | |
| 2014/0340952 A1* | 11/2014 | Ramaswamy | G11C 11/223 |
| | | | 257/295 |
| 2014/0355328 A1 | 12/2014 | Muller et al. | |
| 2015/0054507 A1 | 2/2015 | Gulaka et al. | |
| 2015/0098272 A1 | 4/2015 | Kasolra et al. | |
| 2015/0113214 A1 | 4/2015 | Sutardja | |
| 2015/0131381 A1* | 5/2015 | Rhie | H10B 41/27 |
| | | | 257/314 |
| 2015/0155876 A1 | 6/2015 | Jayasena et al. | |
| 2015/0194440 A1* | 7/2015 | Noh | H10D 30/693 |
| | | | 257/324 |
| 2015/0220463 A1 | 8/2015 | Fluman et al. | |
| 2015/0249143 A1 | 9/2015 | Sano | |
| 2015/0263005 A1 | 9/2015 | Zhao et al. | |
| 2015/0340371 A1 | 11/2015 | Lui | |
| 2015/0372099 A1 | 12/2015 | Chen et al. | |
| 2016/0013156 A1 | 1/2016 | Zhai et al. | |
| 2016/0019951 A1 | 1/2016 | Park et al. | |
| 2016/0035711 A1 | 2/2016 | Hu | |
| 2016/0086970 A1 | 3/2016 | Peng | |
| 2016/0118404 A1 | 4/2016 | Peng | |
| 2016/0141294 A1 | 5/2016 | Peri et al. | |
| 2016/0225860 A1 | 8/2016 | Karda et al. | |
| 2016/0276360 A1 | 9/2016 | Doda et al. | |
| 2016/0300724 A1 | 10/2016 | Levy et al. | |
| 2016/0314042 A1 | 10/2016 | Plants | |
| 2016/0321002 A1 | 11/2016 | Jung et al. | |
| 2016/0358934 A1 | 12/2016 | Lin et al. | |
| 2017/0053906 A1 | 2/2017 | Or-Bach et al. | |
| 2017/0062456 A1 | 3/2017 | Sugino et al. | |
| 2017/0092370 A1 | 3/2017 | Harari | |
| 2017/0092371 A1* | 3/2017 | Harari | H10D 30/693 |
| 2017/0140807 A1 | 5/2017 | Sun et al. | |

(56) References Cited

U.S. PATENT DOCUMENTS

| | | |
|---|---|---|
| 2017/0148517 A1 | 5/2017 | Harari |
| 2017/0148810 A1 | 5/2017 | Kai et al. |
| 2017/0194341 A1 | 7/2017 | Yamada |
| 2017/0213731 A1 | 7/2017 | Yoon et al. |
| 2017/0213821 A1 | 7/2017 | Or-Bach et al. |
| 2017/0358594 A1 | 12/2017 | Lu et al. |
| 2018/0006044 A1 | 1/2018 | Chavan et al. |
| 2018/0095127 A1 | 4/2018 | Pappu et al. |
| 2018/0108416 A1 | 4/2018 | Harari |
| 2018/0144977 A1 | 5/2018 | Yu et al. |
| 2018/0151419 A1 | 5/2018 | Wu et al. |
| 2018/0261613 A1 | 9/2018 | Ariyoshi et al. |
| 2018/0269229 A1 | 9/2018 | Or-Bach et al. |
| 2018/0286918 A1 | 10/2018 | Bandyopadhyay et al. |
| 2018/0330791 A1 | 11/2018 | Li et al. |
| 2018/0331042 A1 | 11/2018 | Manusharow et al. |
| 2018/0342455 A1 | 11/2018 | Nosho et al. |
| 2018/0342544 A1 | 11/2018 | Lee et al. |
| 2018/0366471 A1* | 12/2018 | Harari .................... H10B 43/30 |
| 2018/0366485 A1 | 12/2018 | Harari |
| 2018/0366489 A1 | 12/2018 | Harari et al. |
| 2018/0374929 A1 | 12/2018 | Yoo |
| 2019/0006009 A1 | 1/2019 | Harari |
| 2019/0006015 A1 | 1/2019 | Norman et al. |
| 2019/0019564 A1 | 1/2019 | Li et al. |
| 2019/0067327 A1* | 2/2019 | Herner ................... H10B 43/20 |
| 2019/0067374 A1* | 2/2019 | Franca-Neto .......... H10B 63/34 |
| 2019/0148286 A1* | 5/2019 | Or-Bach ................ H10B 43/20 257/315 |
| 2019/0157296 A1* | 5/2019 | Harari .................. H10D 64/037 |
| 2019/0180821 A1 | 6/2019 | Harari |
| 2019/0206890 A1 | 7/2019 | Harari et al. |
| 2019/0214077 A1 | 7/2019 | Oh et al. |
| 2019/0237470 A1 | 8/2019 | Mine et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0304988 A1 | 10/2019 | Dong et al. |
| 2019/0319044 A1 | 10/2019 | Harari |
| 2019/0325945 A1 | 10/2019 | Linus |
| 2019/0325964 A1 | 10/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0013799 A1* | 1/2020 | Herner ................... H10B 41/27 |
| 2020/0020718 A1* | 1/2020 | Harari ............... H01L 21/02532 |
| 2020/0051990 A1* | 2/2020 | Harari ................ G11C 16/0483 |
| 2020/0063263 A1 | 2/2020 | Yang et al. |
| 2020/0065647 A1 | 2/2020 | Mulaosmanovic et al. |
| 2020/0075631 A1 | 3/2020 | Dong |
| 2020/0098738 A1* | 3/2020 | Herner ................... H01L 25/50 |
| 2020/0098779 A1 | 3/2020 | Cernea et al. |
| 2020/0098789 A1* | 3/2020 | Hu .......................... H10B 43/30 |
| 2020/0098881 A1 | 3/2020 | Vellianitis |
| 2020/0176468 A1 | 6/2020 | Herner et al. |
| 2020/0201718 A1 | 6/2020 | Richter et al. |
| 2020/0203378 A1* | 6/2020 | Harari ............... H01L 21/76837 |
| 2020/0219572 A1 | 7/2020 | Harari |
| 2020/0243486 A1 | 7/2020 | Quader et al. |
| 2020/0258897 A1* | 8/2020 | Yan ..................... H01L 21/2251 |
| 2020/0350234 A1 | 11/2020 | Shan et al. |
| 2020/0350324 A1 | 11/2020 | Hoffman |
| 2020/0357453 A1 | 11/2020 | Slesazeck et al. |
| 2020/0357455 A1 | 11/2020 | Noack et al. |
| 2020/0357470 A1 | 11/2020 | Noack |
| 2020/0357822 A1 | 11/2020 | Chen |
| 2020/0365609 A1* | 11/2020 | Harari ..................... G11C 5/06 |
| 2020/0388313 A1 | 12/2020 | Cho et al. |
| 2020/0388711 A1 | 12/2020 | Doyle et al. |
| 2020/0403002 A1 | 12/2020 | Harari |
| 2020/0411533 A1 | 12/2020 | Alsmeier et al. |
| 2021/0005238 A1 | 1/2021 | Mueller |
| 2021/0013224 A1 | 1/2021 | Purayath et al. |
| 2021/0020659 A1 | 1/2021 | Chen |
| 2021/0066502 A1 | 3/2021 | Karda et al. |
| 2021/0074725 A1 | 3/2021 | Lue |
| 2021/0074726 A1 | 3/2021 | Lue |
| 2021/0111179 A1 | 4/2021 | Shivaraman et al. |
| 2021/0175251 A1 | 6/2021 | Zhang et al. |
| 2021/0193660 A1* | 6/2021 | Purayath .......... H01L 21/31116 |
| 2021/0242239 A1* | 8/2021 | Lin ........................ H10B 51/20 |
| 2021/0247910 A1 | 8/2021 | Kim et al. |
| 2021/0248094 A1 | 8/2021 | Norman et al. |
| 2021/0265308 A1 | 8/2021 | Norman et al. |
| 2021/0272983 A1* | 9/2021 | Gilbert ................ H10D 64/689 |
| 2021/0375933 A1 | 12/2021 | Lu et al. |
| 2021/0399015 A1 | 12/2021 | Lin et al. |
| 2021/0407845 A1 | 12/2021 | Wang et al. |
| 2022/0013535 A1 | 1/2022 | Lue |
| 2022/0028876 A1 | 1/2022 | Purayath et al. |
| 2022/0028886 A1 | 1/2022 | Pur et al. |
| 2022/0139933 A1* | 5/2022 | Noack ............... H10D 30/6757 365/145 |
| 2022/0231049 A1 | 7/2022 | Lin et al. |
| 2022/0238551 A1 | 7/2022 | Petti |
| 2022/0246766 A1 | 8/2022 | Manfrini et al. |
| 2022/0254390 A1 | 8/2022 | Gans et al. |
| 2022/0343980 A1* | 10/2022 | Kamisaka .............. H10B 43/10 |
| 2022/0351776 A1 | 11/2022 | Nam et al. |
| 2022/0384459 A1 | 12/2022 | Lu et al. |
| 2022/0393031 A1 | 12/2022 | Ando et al. |
| 2023/0052477 A1 | 2/2023 | Ha et al. |
| 2023/0077181 A1 | 3/2023 | Petti et al. |
| 2023/0078883 A1* | 3/2023 | Chien .................... H10B 51/40 257/295 |

FOREIGN PATENT DOCUMENTS

| | | |
|---|---|---|
| JP | 2004079606 A | 3/2004 |
| JP | 2006099827 A1 | 4/2006 |
| JP | 2010108522 A1 | 5/2010 |
| JP | 2010251572 A | 11/2010 |
| JP | 2011028540 A1 | 2/2011 |
| JP | 2012-150876 A2 | 8/2012 |
| JP | 2000243972 A2 | 8/2012 |
| KR | 20120085591 A | 8/2012 |
| KR | 20120085591 A1 | 8/2012 |
| KR | 20120085603 A | 8/2012 |
| WO | 2015025357 | 2/2015 |
| WO | 2018236937 A1 | 12/2018 |
| WO | 2019066948 A1 | 4/2019 |

OTHER PUBLICATIONS

"European Search Report, EP 16852238.1", Mar. 28, 2019.
"European Search Report, EP17844550.8", Aug. 12, 2020, 11 pages.
"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.
"Invitation to Pay Additional Fees (PCT/ISA/206), PCT/US2020/015710", Mar. 20, 2020, 2 pages.
"Invitation to Pay Additional Fees, PCT/US2019/065256", Feb. 13, 2020, 2 pages.
"Notification of Reasons for Refusal, Japanese Patent Application 2018-527740", (English translation), Nov. 4, 2020, 8 pages.
"Partial European Search Report EP 16869049.3", Jul. 1, 2019, pp. 1-12.
"PCT Search Report and Written Opinion, PCT/US2018/038373", Sep. 10, 2018.
"PCT Search Report and Written Opinion, PCT/US2018/067338", May 8, 2019.
"PCT Search Report and Written Opinion, PCT/US2019/014319", Apr. 15, 2019.
"PCT Search Report and Written Opinion, PCT/US2019/041678", Oct. 9, 2019.
"PCT Search Report and Written Opinion, PCT/US2019/052164", Feb. 27, 2020.

(56)             References Cited

OTHER PUBLICATIONS

"PCT Search Report and Written Opinion, PCT/US2019/052446", Dec. 11, 2019.

"PCT Search Report and Written Opinion, PCT/US2019/065256", Apr. 14, 2020.

"PCT Search Report and Written Opinion, PCT/US2020/015710", Jun. 9, 2020.

"PCT Search Report and Written Opinion, PCT/US2020/017494", Jul. 20, 2020, 13 pages.

"PCT Search Report and Written Opinion, PCT/US2020/065374", Mar. 15, 2021, 17 pages.

"PCT Search Report and Written Opinion, PCT/US2020/065670", Apr. 5, 2021, 12 pages.

"PCT Search Report and Written Opinion, PCT/US2021/016964", Jun. 15, 2021, 19 pages.

"PCT Search Report and Written Opinion, PCT/US2021/025722", Jun. 15, 2021, 10 pages.

"PCT Search Report and Written Opinion, PCT/US2021/042607", Nov. 4, 2021, 17 pages.

"PCT Search Report and Written Opinion, PCT/US2021/064844", Mar. 8, 2022, 15 paged.

"PCT Search Report and Written Opinion, PCT/US2021/42620", Oct. 28, 2021, 18 pages.

"PCT Search Report and Written Opinion, PCT/US2022/016729", Applicant: SunRise Memory Corporation, May 17, 2022, 20 pages.

Ahn, Min-Ju , et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.

Alessandri, Cristobal , et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.

Ali, T. , et al., "A Multilevel FeFET Memory Device based on Laminated HSO and HZO Ferroelectric Layers for High-Density Storage", IEEE International Electron Devices Meeting (IEDM), 2019, doi: 10.1109/IEDM19573.2019.8993642., Dec. 2019, pp. 28.7.1-28.7.4.

Ali, T. , et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.—paper cited in Bae (Berkeley) paper, Sep. 2018, pp. 3769-3774.

Bae, Jong-Ho , et al., "Highly Scaled, High Endurance, Ω-Gate, Nanowire Ferroelectric FET Memory Transistors", IEEE Electron Device Letters, vol. 41, No. 11, doi: 10.1109/LED.2020.3028339.—Sayeef-Berkeley paper on FeFET memory, Nov. 2020, pp. 1637-1640.

Beyer, Sven , et al., "FeFET: A versatile CMOS compatible device with game-changing potential", IEEE International Memory Workshop (IMW), doi: 10.1109/IMW48823.2020.9108150., 2020, pp. 1-4.

Böscke, T.S. , et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.

Chang, Sou-Chi , et al., "Anti-ferroelectric HfxZr1—xO2 Capacitors for High-density 3-D Embedded-DRAM", IEEE International Electron Devices Meeting (IEDM), doi: 10.1109/IEDM13553.2020.9372011., 2020, pp. 28.1.1-28.1.4.

Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.

Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.

Choi, Seonjun , et al., "A novel three-dimensional NAND flash structure for improving the erase performance", IEICE Electronics Express, 2019 vol. 16 Issue 3, 2019, 6 pages.

De, Sourav , et al., "Ultra-Low Power Robust 3bit/cell Hf0.5Zr0.5O2 Ferroelectric FinFET with High Endurance for Advanced Computing-In-Memory Technology", 2021 Symposium on VLSI Technology, Kyoto, Japan, Jun. 13-19, 2021, Jun. 2021, 2 pages.

Dünkel , "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.

Dutta, Sourav , et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.

Florent, K. , "First demonstration of vertically stacked ferroelectric Al doped HfO2 devices for NAND applications", Symposium on VLSI Technology, doi: 10.23919/VLSIT.2017.7998162., 2017, pp. T158-T159.

Florent, K. , et al., "Vertical Ferroelectric HfO2 FET based on 3-D NAND Architecture: Towards Dense Low-Power Memory", IEEE International Electron Devices Meeting (IEDM), San Francisco, CA, 2018, doi: 10.1109/IEDM.2018.8614710., 2018, pp. 2.5.1-2.5.4.

Hendy, Ian , "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.

Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.

Hisain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.

Jeewandara, Thamarasee , et al., "High-speed 3-D memory with ferroelectric NAND flash memory", available at https://techxplore.com/news/2021-01-high-speed-d-memoryferroelectric-nand.html, Jan. 26, 2021, 5 pages.

Kawai, H. , et al., "Design Principle of Channel Material for Oxide-Semiconductor Field-Effect Transistor with High Thermal Stability and High On-current by Fluorine Doping", IEEE International Electron Devices Meeting (IEDM), doi: 10.1109/IEDM13553.2020.9372121., 2020, pp. 22.2.1-22.2.4.

Kim, Min-Kyu , et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material—use IZO for channel), Jan. 13, 2021, 10.

Kim, Taeho , et al., "Effects of high pressure nitrogen annealing on ferroelectric Hf0.5Zr0.5O2 films", Appl. Phys. Lett. 112, 092906 https://doi.org/10.1063/1.5003369, Mar. 2, 2018, 5 pages.

Kim, N. , et al., "Multi-layered Vertical gate NANO Flash Overcoming Stacking Limit for Terabit Density Storage", Symposium on VLSI Tech. Dig. of Technical Papers, 2009, pp. 188-189.

Kunitake, Hitoshi , et al., "High-temperature Electrical Characteristics of 60nm CAAC-IGZO FET : Comparison with Si FET", International Conference on Solid State Devices and Materials, https://doi.org/10.7567/SSDM.2018.N-3-04, Sep. 2018, pp. 787-788.

Wu, Jixuan , et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, HI, USA, Jun. 2020, 4 pages.

Tan, Ava Jiang, et al., "Ferroelectric HfO2 Memory Transistors with High-K Interfacial Layer and Write Endurance Exceeding 1010 Cycles", arXiv:2103.08806 [physics.app-ph], available at https://arxiv.org/abs/2103.08806., Mar. 16, 2021.

(56) References Cited

OTHER PUBLICATIONS

Tan, Ava J., et al., "Experimental Demonstration of a Ferroelectric HfO2-Based Content Addressable Memory Cell", IEEE Electron Device Letters, vol. 41, No. 2, doi: 10.1109/LED.2019.2963300., Feb. 2020, pp. 240-243.

Sun, Chen , "First Demonstration of BEOL-Compatible Ferroelectric TCAM Featuring a-IGZO Fe-TFTs with Large Memory Window of 2.9 V, Scaled Channel Length of 40 nm, and High Endurance of 10∧8 Cycles", 2021 Symposium on VLSI Technology Digest of Technical Papers, Kyoto, doi: 978-4-86348-779-6., Jun. 2021, 2 pages.

Si, Mengwei , et al., "Why In2O3 Can Make 0.7 nm Atomic Layer Thin Transistors?", available at https://arxiv.org/ftp/arxiv/papers/2012/2012.12433.pdf, School of Electrical and Computer Engineering and Birck Nanotechnology Center, Purdue University, West Lafayette, IN 47907, United States, 2012, pp. 1-26.

Sharma, Abhishek A., et al., "High Speed Memory Operation in Channel-Last, Back-gated Ferroelectric Transistors", IEEE International Electron Devices Meeting (IEDM), doi: 10.1109/IEDM13553.2020.9371940., 2020, pp. 18.5.1-18.5.4.

Salahuddin, Sayeef , et al., "FeFETs for Near-Memory and In-Memory Compute", 2021 IEEE International Electron Devices Meeting (IEDM), Department of Electrical Engineering and Computer Sciences, Dec. 2021, 4 pages.

Van Houdt, Jan , "The 3D FeFET: contender for 3D-NAND Flash memory and machine learning", available at https://www.imec-int.com/en/imec-magazine/imec-magazine-october-2017/the-vertical-ferroelectric-fet-a-new-contender-for-3d-nand-flash-memory-and-machine-learning, Sep. 30, 2019, 8 pages.

Saitoh, Masumi , et al., "HfO2-based FeFET and FTJ for Ferroelectric-Memory Centric 3D LSI towards Low-Power and High-Density Storage and AI Applications", 2020 IEEE International Electron Devices Meeting (IEDM), doi: 10.1109/IEDM13553.2020.9372106., 2020, pp. 18.1.1-18.1.4.

Rzehak, Volker , "Low-Power FRAM Microcontrollers and Their Applications", Texas Instruments White Paper, SLAA502, Jul. 2019, 7 pages.

Rios, Rafael , et al., "A Physically Based Compact Model for IGZO Transistors", IEEE Transactions on Electron Devices, vol. 68, No. 4, doi: 10.1109/TED.2021.3059387., Apr. 2021, pp. 1664-1669.

Park, Min Hyuk, et al., "Review of defect chemistry in fluorite-structure ferroelectrics for future electronic devices", J. Mater. Chem. C, vol. 8, No. 31 10526-10550, Jun. 9, 2020., Aug. 21, 2020, pp. 10526-10550.

On, Nuri , et al., "Boosting carrier mobility and stability in indium-zinc-tin oxide thin-film transistors through controlled crystallization", Sci Rep 10, 18868, https://doi.org/10.1038/s41598-020-76046-w, 2020, 16 pages.

Nguyen, Manh-Cuong , et al., "Wakeup-Free and Endurance-Robust Ferroelectric Field-Effect Transistor Memory Using High Pressure Annealing", IEEE Electron Device Letters, vol. 42, No. 9, doi: 10.1109/LED.2021.3096248., Sep. 2021, pp. 1295-1298.

Müller, J. , et al., "Ferroelectric hafnium oxide: A CMOS-compatible and highly scalable approach to future ferroelectric memories", 2013 IEEE International Electron Devices Meeting, Washington, DC, USA, doi: 10.1109/IEDM.2013.6724605., 2013, pp. 10.8.1-10.8.4.

Lee, Sang Yeol, "Comprehensive Review on Amorphous Oxide Semiconductor Thin Film Transistor", Trans. Electr. Electron. Mater. 21, https://doi.org/10.1007/s42341-020-00197-w, Mar. 28, 2020, pp. 235-248.

Lee, Chea-Young , et al., "Etching Characteristics and Changes in Surface Properties of IGZO Thin Films by O2 Addition in CF4/Ar Plasma", Coatings. 2021, 11(8):906. https://doi.org/10.3390/coatings11080906, Jul. 29, 2021.

Liao, P.J. , et al., "Characterization of Fatigue and Its Recovery Behavior in Ferroelectric HfZrO", 2021 Symposium on VLSI Technology, Jun. 2021, 2 p.

Liao, C.Y. , et al., "Multibit Ferroelectric FET Based on Nonidentical Double HfZrO2 for High-Density Nonvolatile Memory", IEEE Electron Device Letters, vol. 42, No. 4, doi: 10.1109/LED.2021.3060589., Apr. 2021, pp. 617-620.

Materano, Monica , et al., "Interplay between oxygen defects and dopants: effect on structure and performance of HfO2-based ferroelectrics", Inorg. Chem. Front. (8), Apr. 9, 2021, pp. 2650-2672.

Tan, Ava J., et al., "Hot Electrons as the Dominant Source of Degradation for Sub-5nm HZO FeFETs", IEEE Symposium on VLSI Technology, Honolulu, HI, USA, doi: 10.1109/VLSITechnology18217.2020.9265067., 2020, pp. 1-2.

Mo, Fei , et al., "Experimental Demonstration of Ferroelectric HfO2 FET with Ultrathin-body IGZO for High-Density and Low-Power Memory Application", Symposium on VLSI Technology, 2019, pp. T42-T43, doi: 10.23919/VLSIT.2019.8776553., Jul. 13, 2020, 7 pages.

Mo, Fei , et al., "Low-Voltage Operating Ferroelectric FET with Ultrathin IGZO Channel for High-Density Memory Application", IEEE Journal of the Electron Devices Society, vol. 8, doi: 10.1109/JEDS.2020.3008789., Jul. 13, 2020, pp. 717-723.

Mueller, S. , et al., "Development Status of Gate-First FeFET Technology", 2021 Symposium on VLSI Technology, Jun. 2021, 2 pages.

"PCT Search Report and Written Opinion, PCT/US2022/039473", Dec. 6, 2022, 14 pages.

Chan, Chi-Yu , et al., "FeFET Memory Featuring Large Memory Window and Robust Endurance of Long-Pulse Cycling by Interface Engineering using High-k AlON", 2020 IEEE Symposium on VLSI Technology, doi: 10.1109/VLSITechnology18217.2020.9265103., 2020, pp. 1-2.

Kim, Hyungwoo , et al., "Two-step deposition of TiN capping electrodes to prevent degradation of ferroelectric properties in an in-situ crystallized TiN/Hf0.5Zr0.5O2/TiN device", Nano Express 3 015004., 2022, 12 pages.

McBriarty, Martin E., et al., "Crystal Phase Distribution and Ferroelectricity in Ultrathin HfO2—ZrO2 Bilayers", Phys. Status Solidi B, 257: 1900285. https://doi.org/10.1002/pssb.201900285, Aug. 21 8, 2019, pp. 1-25.

Mittmann, T. , et al., "Impact of Oxygen Vacancy Content in Ferroelectric HZO films on the Device Performance", 2020 IEEE International Electron Devices Meeting (IEDM), doi: 10.1109/IEDM13553.2020.9372097., 2020, pp. 18.4.1-18.4.4.

Onaya, Takashi , et al., "Improvement in ferroelectricity of HfxZr1—xO2 thin films using top- and bottom-ZrO2 nucleation layers", APL Materials 7, 061107; https://doi.org/10.1063/1.5096626, 2019, pp. 1-8.

Sato, Yuta , et al., "Source/Drain Contact Engineering of InGaZnO Channel BEOL Transistor for Low Contact Resistance and Suppressing Channel Shortening Effect,", 20th International Workshop on Junction Technology (IWJT), doi: 10.23919/IWJT52818.2021.9609366., 2021, 3 pages.

Wang, Chin-I , et al., "Atomic layer deposited TiN capping layer for sub-10 nm ferroelectric Hf0.5Zr0.5O2 with large remnant polarization and low thermal budget", Applied Surface Science, vol. 570, 2021, 151152, ISSN 0169-4332, https://doi.org/10.1016/j.apsusc.2021.151152., Aug. 9, 2021, pp. 1-8.

* cited by examiner

Z

Y⊙ ——→X

Gate Conductor
Ferroelectric Storage Layer
Metal Oxide Channel
S/D Conductor
SiOC Isolation Dielectric
SiO₂ Isolation Dielectric

100

105
108
107
106
105

105
108
107
106
105
102

SiOC
SiO₂
Carbon

X
Z
Y

THREE-DIMENSIONAL MEMORY STRING ARRAY OF THIN-FILM FERROELECTRIC TRANSISTORS FORMED WITH AN OXIDE SEMICONDUCTOR CHANNEL IN A CHANNEL LAST PROCESS

CROSS REFERENCE TO RELATED APPLICATIONS

This application claims priority to U.S. Provisional Patent Application No. 63/243,856, entitled THREE-DIMENSIONAL MEMORY STRING ARRAY OF THIN-FILM FERROELECTRIC TRANSISTORS FORMED WITH OXIDE SEMICONDUCTOR CHANNEL, filed Sep. 14, 2021, which is incorporated herein by reference in its entirety for all purposes.

This application relates to (i) U.S. non-provisional patent application ("patent application I"), Ser. No. 17/674,137, entitled "Thin-Film Storage Transistor With Ferroelectric Storage Layer," filed Feb. 17, 2022, and (ii) U.S. non-provisional application ("patent application II"), Ser. No. 17/812,375, entitled "3-Dimensional Memory String Array Of Thin-Film Ferroelectric Transistors," filed on Jul. 13, 2022.

The present application is also related to (i) U.S. non-provisional application ("patent application III"), Ser. No. 17/382,064, entitled "Methods For Fabricating A 3-Dimensional Memory Structure Of NOR Memory Strings," filed on Jul. 21, 2021; and (ii) U.S. non-provisional application ("patent application IV"), Ser. No. 17/382,126, entitled "Methods for Fabricating A 3-Dimensional Memory Structure of NOR Memory Strings," filed on Jul. 21, 2021.

The present application is also related to U.S. non-provisional patent application ("patent application V"), Ser. No. 16/894,596, entitled "Capacitive-Coupled Non-Volatile Thin-Film Transistor Strings in Three Dimensional Arrays," filed on Jun. 5, 2020, which is a continuation of U.S. patent application Ser. No. 16/107,118, entitled "Capacitive-Coupled Non-Volatile Thin-Film Transistor Strings in Three Dimensional Arrays," filed on Aug. 21, 2018, which is a divisional application of U.S. non-provisional patent application Ser. No. 15/248,420, entitled "Capacitive-Coupled Non-Volatile Thin-Film Transistor Strings in Three Dimensional Arrays," filed on Aug. 26, 2016, now U.S. Pat. No. 10,121,553, issued Nov. 6, 2018, which is related to and claims priority of (i) U.S. provisional application, Ser. No. 62/235,322, entitled "Multi-gate NOR Flash Thin-film Transistor Strings Arranged in Stacked Horizontal Active Strips With Vertical Control Gates," filed on Sep. 30, 2015; (ii) U.S. provisional patent application, Ser. No. 62/260,137, entitled "Three-dimensional Vertical NOR Flash Thin-film Transistor Strings," filed on Nov. 25, 2015; (iii) U.S. non-provisional patent application Ser. No. 15/220,375, "Multi-Gate NOR Flash Thin-film Transistor Strings Arranged in Stacked Horizontal Active Strips With Vertical Control Gates," filed on Jul. 26, 2016; and (vi) U.S. provisional patent application, Ser. No. 62/363,189, entitled "Capacitive Coupled Non-Volatile Thin-film Transistor Strings," filed Jul. 15, 2016.

The disclosures of patent applications I, II, III, IV, and V are hereby incorporated by reference in their entireties.

FIELD OF THE INVENTION

The present invention relates to high-density memory structures. In particular, the present invention relates to high-density, low read-latency memory structures formed by interconnected thin-film storage elements (e.g., 3-dimensional array of thin-film storage transistors), including those organized as NOR-type memory strings ("NOR memory strings").

BACKGROUND OF THE INVENTION

A NOR-type memory string includes storage transistors that share a common source region and a common drain region, while allowing each storage transistor to be individually addressed and accessed. U.S. Pat. No. 10,121,553 (the '553 patent), entitled "Capacitive-Coupled Non-Volatile Thin-film Transistor NOR Strings in Three-Dimensional Arrays," issued on Nov. 6, 2018, discloses storage or memory transistors organized as 3-dimensional arrays of NOR memory strings formed above a planar surface of a semiconductor substrate. The '553 patent is hereby incorporated by reference in its entirety for all purposes. In the '553 patent, a NOR memory string includes numerous thin-film storage transistors that share a common bit line and a common source line. In particular, the '553 patent discloses a NOR memory string that includes (i) a common source region and a common drain region both running lengthwise along a horizontal direction and (ii) gate electrodes for the storage transistors each running along a vertical direction. In the present description, the term "vertical" refers to the direction normal to the surface of a semiconductor substrate, and the term "horizontal" refers to any direction that is parallel to the surface of that semiconductor substrate. In a 3-dimensional array, the NOR memory strings are provided on multiple planes (e.g., 8 or 16 planes) above the semiconductor substrate, with the NOR memory strings on each plane arranged in rows. For a charge-trap type storage transistor, data is stored in a charge storage film in each storage transistor. For examples, the charge storage film includes a tunneling dielectric layer, a charge trapping layer and a blocking layer, which can be implemented as a multilayer including silicon oxide, silicon nitride, and silicon oxide, arranged in this order and referred to as an ONO layer. An applied electrical field across the charge storage film adds or removes charge from charge traps in the charge trapping layer, altering the threshold voltage of the storage transistor to encode a given logical state to the storage transistor.

Advances in electrically polarizable materials ("ferroelectric materials"), especially those that are being used in semiconductor manufacturing processes, suggest new potential applications in ferroelectric memory circuits. For example, the article "Ferroelectricity in Hafnium Oxide: CMOS compatible Ferroelectric Field Effect Transistors," by T. S. Boscke et al., published in 2011 *International Electron Devices Meeting (IEDM)*, pp. 24.5.1-24.5.4, discloses a ferroelectric field effect transistor ("FeFET") that uses hafnium oxide as a gate dielectric material. By controlling the polarization direction in a ferroelectric gate dielectric layer, the FeFET may be programmed to have either one of two threshold voltages. Each threshold voltage of the FeFET constitutes a state, for example, a "programmed" state or an "erased" state, that represents a designated logical value. Such an FeFET has application in high-density memory circuits. For example, U.S. patent application Ser. No. 13/897,037, entitled "Apparatuses having a ferroelectric field-effect transistor memory array and related method," by D. V. Nirmal Ramaswamy et al., filed on May 17, 2013, now U.S. Pat. No. 9,281,044, discloses a 3-dimensional array of FeFETs.

The FeFETs of the prior art, however, suffer from low endurance. For example, the article "Vertical Ferroelectric HfO$_2$ FET based on 3-D NAND Architecture: Towards Dense Low-Power Memory," by K. Florent et al., published in 2018 *IEEE International Electron Devices Meeting (IEDM)*, 2018, pp. 2.5.1-2.5.4, discloses an endurance of merely 10$^4$ cycles. Such low endurance renders the memory circuits practically unsuitable for many memory applications.

SUMMARY OF THE INVENTION

In embodiments of the present invention, a three dimensional memory structure formed above a planar surface of a semiconductor substrate includes multiple thin-film ferroelectric field-effect transistors (FeFETs) formed above the semiconductor substrate and arranged in one or more parallel planes, wherein (i) the thin-film FeFETs are organized as NOR memory strings where each NOR memory string extends along a first direction substantially parallel to the planar surface of the semiconductor substrate; (ii) the NOR memory strings are arranged as stacks of NOR memory strings, each stack including NOR memory strings arranged one on top of another along a second direction substantially normal to the planar surface where the NOR memory strings within each stack are isolated from another by a first isolation layer separating adjacent planes; (iii) the FeFETs within each NOR memory string share a common source line and a common bit line; (iv) each FeFET in each NOR memory string includes an oxide semiconductor layer and a ferroelectric gate dielectric layer formed adjacent the oxide semiconductor layer where the oxide semiconductor layer forms a channel region between the common source line and the common bit line; and (v) a set of conductors each extending along the second direction where each conductor is provided between adjacent stacks of NOR memory strings and serving as a common gate electrode for respective FeFETs in the NOR memory strings of the adjacent stacks. In some embodiments, each FeFET in a NOR memory string includes a source terminal formed by the common source line, a drain terminal formed by the common drain layer, the source terminal and the drain terminal being formed on a first side of the channel region away from the ferroelectric gate dielectric layer, and each FeFET in the NOR memory string is controlled by respective gate electrode formed adjacent the ferroelectric gate dielectric layer on a second side, opposite the first side, of the channel region.

In some embodiments, the ferroelectric gate dielectric layer includes a ferroelectric polarization layer provided adjacent each conductor as a continuous layer in the second direction.

In some embodiments, the ferroelectric gate dielectric layer is formed of a doped hafnium oxide material and the oxide semiconductor layer forming the channel region is an amorphous oxide semiconductor material.

In some embodiments, the common bit line and the common source line are made partially or substantially of a metallic conductor material.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

FIG. 2(*b*) illustrates the detail construction of a storage transistor that can be formed in the memory structure of FIG. 1 in alternate embodiments.

DETAILED DESCRIPTION OF THE INVENTION

Figure 1:
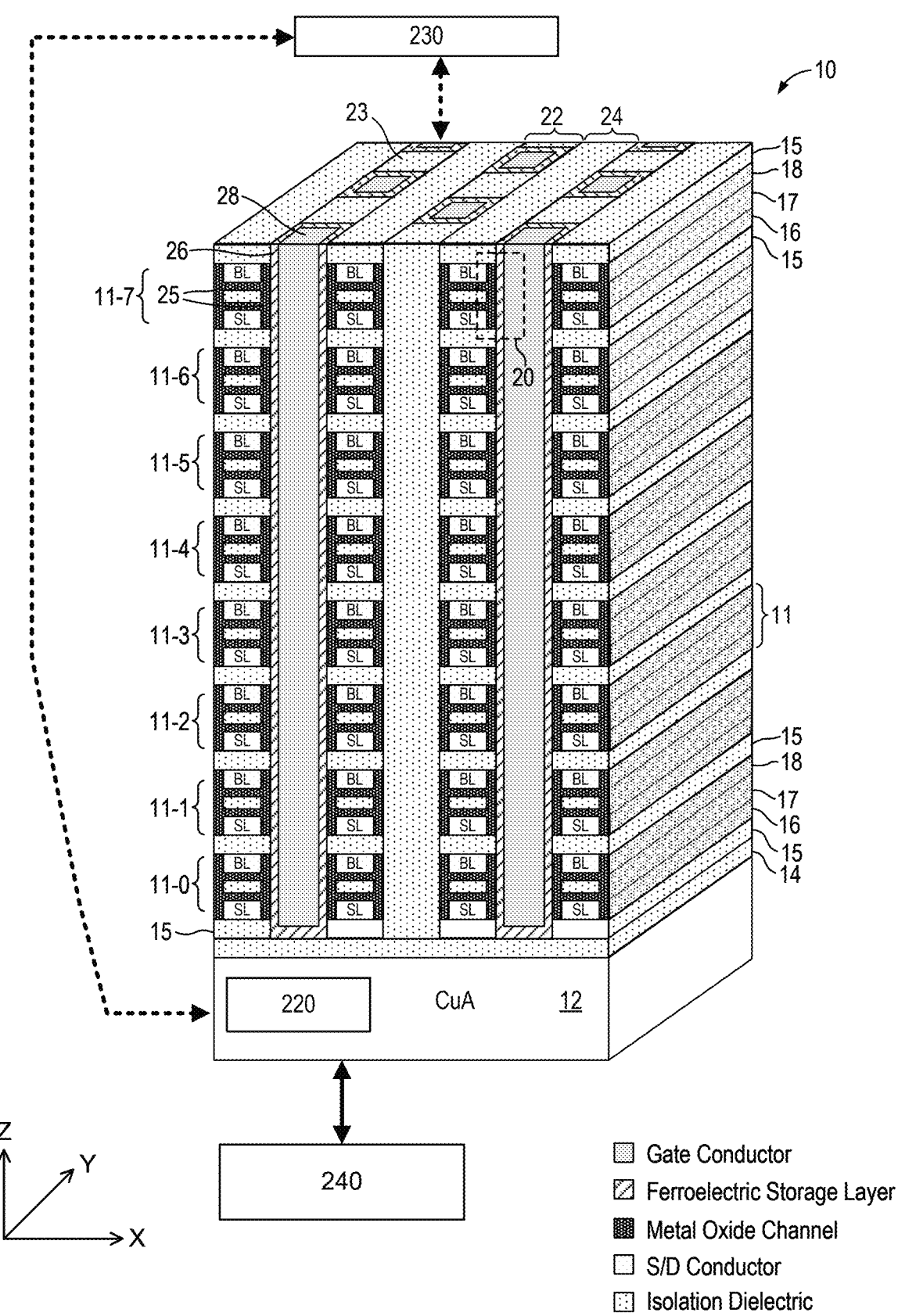
FIG. 1 is a perspective view of a memory structure including a 3-dimensional array of NOR memory strings in embodiments of the present invention.

According to embodiments of the present invention, a memory structure includes storage transistors organized as horizontal NOR memory strings where the storage transistors are thin-film ferroelectric field-effect transistors (FeFETs) having a ferroelectric gate dielectric layer formed adjacent an oxide semiconductor channel region. The ferroelectric storage transistors thus formed are junctionless transistors having no p/n junction in the channel and which the mobile carrier density in the channel is modulated by the polarization of the ferroelectric gate dielectric layer. In embodiments of the present invention, the ferroelectric storage transistors in each NOR memory string share a first conductive layer functioning as a common source line and a second conductive layer functioning as a common bit line, the first and second conductive layers being in electrical contact with the oxide semiconductor channel region. The ferroelectric storage transistors in a NOR memory string are controlled by individual control gate electrodes to allow each storage transistor to be individually addressed and accessed. In some embodiments, the ferroelectric gate dielectric layer is formed of a doped hafnium oxide material and the oxide semiconductor channel region is formed of an amorphous oxide semiconductor material.

In some embodiments, the ferroelectric storage transistors in each NOR memory string share a common source line and a common bit line that are formed on a first side of the channel region, away from the ferroelectric gate dielectric layer, and in electrical contact with the oxide semiconductor channel region. The ferroelectric storage transistors in a NOR memory string are controlled by individual control gate electrodes that are formed adjacent the ferroelectric gate dielectric layer on a second side, opposite the first side, of the channel region.

In some embodiments, the memory structure includes multiple NOR memory strings organized in a three dimensional array to form a high density memory structure. The three dimensional array of NOR memory strings is organized as stacks of NOR memory strings in a first direction, with NOR memory strings formed one on top of another in a stack in the first direction. The three dimensional array of NOR memory strings is also organized as rows of NOR memory strings in a second direction forming a plane, with the rows of NOR memory strings arranged in one or more parallel planes in first direction. In some embodiments, the shared common source line is electrically floating and the source voltage is applied from the common bit line using pre-charge transistors so as to mitigate congestion of connector wires at the bit-line/source-line end staircases in the three-dimensional structure.

The ferroelectric storage transistors, as described herein, provide high endurance, long data retention, and relatively low voltage operations for both erase (under 5.0 volts) and programming (e.g., under −5.0 volts) operations. By combining the ferroelectric or polarization characteristics with the 3-dimensional organization (e.g., as the thin-film NOR memory strings described herein), the memory structure of ferroelectric storage transistors of the present invention achieves the additional benefits of high-density, low-cost memory arrays with the advantages of high-speed, randomly accessed memory circuits with low read latency. These and other advantages of the memory structure of the present invention will be described further in the following description.

In the present description, the term "storage transistor" is used interchangeably with "memory transistor" to refer to the memory device formed in the memory structure described herein. In some examples, the memory structure of the present disclosure including NOR memory strings of randomly accessible storage transistors (or memory transistors) can have applications in computing systems as the main memory where the memory locations are directly accessible by the processors of the computer systems, for instance, in a role served in the prior art by conventional random-access memories (RAMs), such as dynamic RAMs (DRAMS) and static RAMs (SRAMs). For example, the memory structure of the present disclosure can be applied in computing systems to function as a random-access memory to support the operations of microprocessors, graphical processors and artificial intelligence processors. In other examples, the memory structure of the present disclosure is also applicable to form a storage system, such as a solid-state drive or replacing a hard drive, for providing long term data storage in computing systems.

In the present description, to facilitate reference to the figures, a Cartesian coordinate reference frame is used, in which the Z-direction is normal to the planar surface of the semiconductor surface and the X-direction and the Y-directions are orthogonal to the Z-direction and to each other, as indicated in the figures.

Furthermore, the drawings provided herein are idealized representations to illustrate embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components throughout.

Memory Structure

FIG. 1 is a perspective view of a memory structure including a 3-dimensional array of NOR memory strings in embodiments of the present invention. The memory structure can be used to implement part of a semiconductor memory device in some examples. Referring to FIG. 1, a memory structure 10 includes a number of alternating conductive and isolation layers formed on a planar surface of a semiconductor substrate 12. In the present description, a pair of conductive layers with an interleaving isolation layer are referred to as an active layer 11. A buffer oxide layer 14 may be provided between the semiconductor substrate 12 and the active layers 11 formed on the substrate. The active layers 11, including alternating conductive and isolation layers, are formed one on top of another in the Z-direction (i.e., along a direction normal to the planar surface of the substrate 12). The active layers 11 are divided in the X-direction into narrow strips ("active strips") 24 that are stacked one on top of another to form stacks of active strips ("active stacks") extending in the Y-direction. As thus formed, each active strip 24 form a NOR memory string of ferroelectric storage transistors 20 extending in the Y-direction. In FIG. 1, eight instances of the active layer 11 are shown and are denoted as active layers 11-0 to 11-7.

Each active layer 11 includes a first conductive layer 16 functioning as a common source line for the NOR memory string and a second conductive layer 18 functioning as a common bit line for the NOR memory string. The first and second conductive layers 16, 18 are separated by an isolation layer 17. In the present illustration, eight active layers 11-0 to 11-7 are provided. Each active layer is separated from the others by an isolation layer 15. The isolation layers 15, 17 can each be an insulating dielectric layer or other suitable isolation layer.

Subsequent processing steps form oxide semiconductor channel regions 25, ferroelectric gate dielectric layers 26 and gate electrodes 28 in narrow trenches 22 between the separated active stacks. In some embodiments, the oxide semiconductor channel region 25 is isolated to each NOR memory string. In the present embodiment, the oxide semiconductor channel region 25 is separated at each NOR memory string by the isolation layer 15.

In embodiments of the present invention, the gate electrodes 28 and the ferroelectric gate dielectric layers 26 are formed as columnar structures extending in the Z-direction. In the present example, ferroelectric gate dielectric layer 26 encircles a gate electrode 28 in the columnar structure. In the present description, the gate electrodes 28 are also referred to as "local word lines" and a gate electrode 28 encircled by a ferroelectric gate dielectric layer 26 is collectively referred to to a local word line (LWL) structure. Local word line structures formed in each trench 22 are isolated from each other by a dielectric material 23. A ferroelectric storage transistor 20 is formed at the intersection of an active strip 11 with the channel region 25 and an LWL structure. Accordingly, ferroelectric storage transistors 20 are formed on both sides of the active strip. In the present illustration, the LWL structures are formed staggered in adjacent trenches 22 so that storage transistors 20 formed on both sides of the active strip are offset from each other in the Y-direction along the NOR memory string. In particular, isolation layer 15 between the NOR memory strings and isolation layer 17 between adjacent source line and bit line provides isolation to decouple the ferroelectric storage transistors formed on the two sides of the same active strip. As thus configured, along each active strip (in the Y-direction), the ferroelectric storage transistors 20 that share the common source line 16 and the common bit line 18 form a NOR memory string (also referred as a "Horizontal NOR memory string" or "HNOR memory string").

In the 3-dimensional array of NOR memory strings thus formed, the ferroelectric storage transistors 20 are junctionless transistors that do not include p/n junction as the drain or source region in the channel. Instead, the second conductive layer 18 (common bit line) serves as the drain terminal and the first conductor layer 16 serves as the source terminal of the ferroelectric storage transistor 20. Accordingly, a NOR memory string includes ferroelectric storage transistors 20 that share a common drain terminal (the common bit line 16) and a common source terminal (the common source line 18).

In some embodiments, the first and second conductive layers 16 and 18 are each formed using a metal layer or a low resistivity metallic conductive material, such as molybdenum (Mo), tungsten (W), tungsten nitride (WN), ruthenium or titanium tungsten alloy (TiW). In some embodiments, the isolation layer 15 and 17 may be formed as a silicon oxide layer ($SiO_2$). In other embodiments, the isolation layer 15 may be formed by other isolation dielectric materials, such as silicon nitride. In some embodiments, the ferroelectric gate dielectric layer is formed of a doped hafnium oxide material, such as zirconium-doped hafnium oxide (HfZrO or "HZO"), and the oxide semiconductor channel region is formed of an amorphous oxide semiconductor material, such as indium gallium zinc oxide (IGZO).

To complete the memory circuit, various types of circuits are formed in or at the surface of the semiconductor substrate 12 to support the memory operations of the HNOR memory strings. Such circuits are referred to as "circuit under array" ("CuA 220") and may include analog and digital circuits. For example, the memory operations may include erase, program and read operations. In the present description, a write operation to the memory circuit includes the erase and the program operations. Furthermore, in some embodiments, the memory operations include a refresh operation. In some embodiments, the circuit under array supports the memory operations of the memory circuit, including erase, program, read and refresh operations.

In some embodiments, the circuit under array ("CuA 220") includes various voltage sources or voltage generators for generating operating voltages, such as power supply voltages, ground voltages, programming, erase or read voltages, or reference voltages. The circuit under array may further include word line driver circuits, bit line driver circuits, and input/output driver circuits. The circuit under array may further include address decoders for decoding address signals to select designated storage transistors, sense amplifiers to read stored data from the selected storage transistors, latches and registers, such as shift registers, or other memory elements. The circuit under array may further include various logic circuits, such as inverters, NAND, NOR, Exclusive-Or and other logic gates. In some embodiments, the circuit under array includes state machines, micro-sequencers, and data processing circuitry. For example, in one embodiment, the circuit under array includes a state machine for managing the memory operations (e.g. read, erase, program and refresh operations) at the memory circuit.

In some embodiments, other conductive layers may be arranged above or below the memory structure 10 to provide control signals, such as the word line signals, to the array of ferroelectric storage transistors. In some embodiments, the conductive layers may be arranged to connect the circuit under array to the common bit lines of the NOR memory strings and to the local word lines to support the memory operation. In one embodiment, the conductive layers may be provided for routing control and data signals among the NOR memory strings and the circuit under array. As thus configured, the circuit under array supports memory operations of the NOR memory strings and implements erase, program and read operations for the NOR memory strings autonomously in response to erase, program and read commands provided to the memory structure. In one example, the write operation to the ferroelectric storage transistors includes an erase operation followed by a program operation.

In some embodiments, the memory structure 10 is coupled to a controller integrated circuit to form a memory module. The controller integrated circuit may be fabricated on a separate semiconductor substrate and electrically connected to the memory structure using one or more integration techniques, including, for example, hybrid bonds, TSVs, exposed contacts and other suitable interconnect techniques. The controller integrated circuit provides commands, such as erase, program and read commands, to the circuit under array, usually with accompanying information, such as the memory cell address and write data for the write operation. The memory structure, using the circuit under array, performs the memory operation autonomously in response to the received command.

In embodiments of the present disclosure, the memory structure 10 represents a modular memory unit, referred to as a "tile," and a memory device is formed using an array of the modular memory units. In one exemplary embodiment, a memory device is organized as a two-dimensional array of tiles, where each tile includes a three-dimensional array of ferroelectric storage transistors with support circuitry for each tile formed under the respective tile. More specifically, the support circuitry for the ferroelectric storage transistors of each tile is provided for modularity in the portion of the semiconductor substrate underneath each tile. In this manner, each modular memory unit (or tile) operates autonomously to perform its own erase, program, read and refresh operations. As a result, a memory device includes an array of tiles where each tile can be accessed independently of each other with memory operations being performed on multiple tiles concurrently. The memory device may be coupled to a controller integrated circuit to form a memory module. The controller integrated circuit, sometimes referred to as a "chiplet," implements management functions for the memory device. In some embodiments, the controller integrated circuit provides commands, such as erase, program, read and refresh commands, to the memory device and accompanying command information, such as memory address and write data. The controller integrated circuit may also provide host interface functions, implementing memory interfaces for host access and other system functions. A memory device formed with an array of tiles realizes a high speed and high capacity memory with capabilities for parallel access to storage transistors in the multiple tiles.

Figures 2A, 2B:
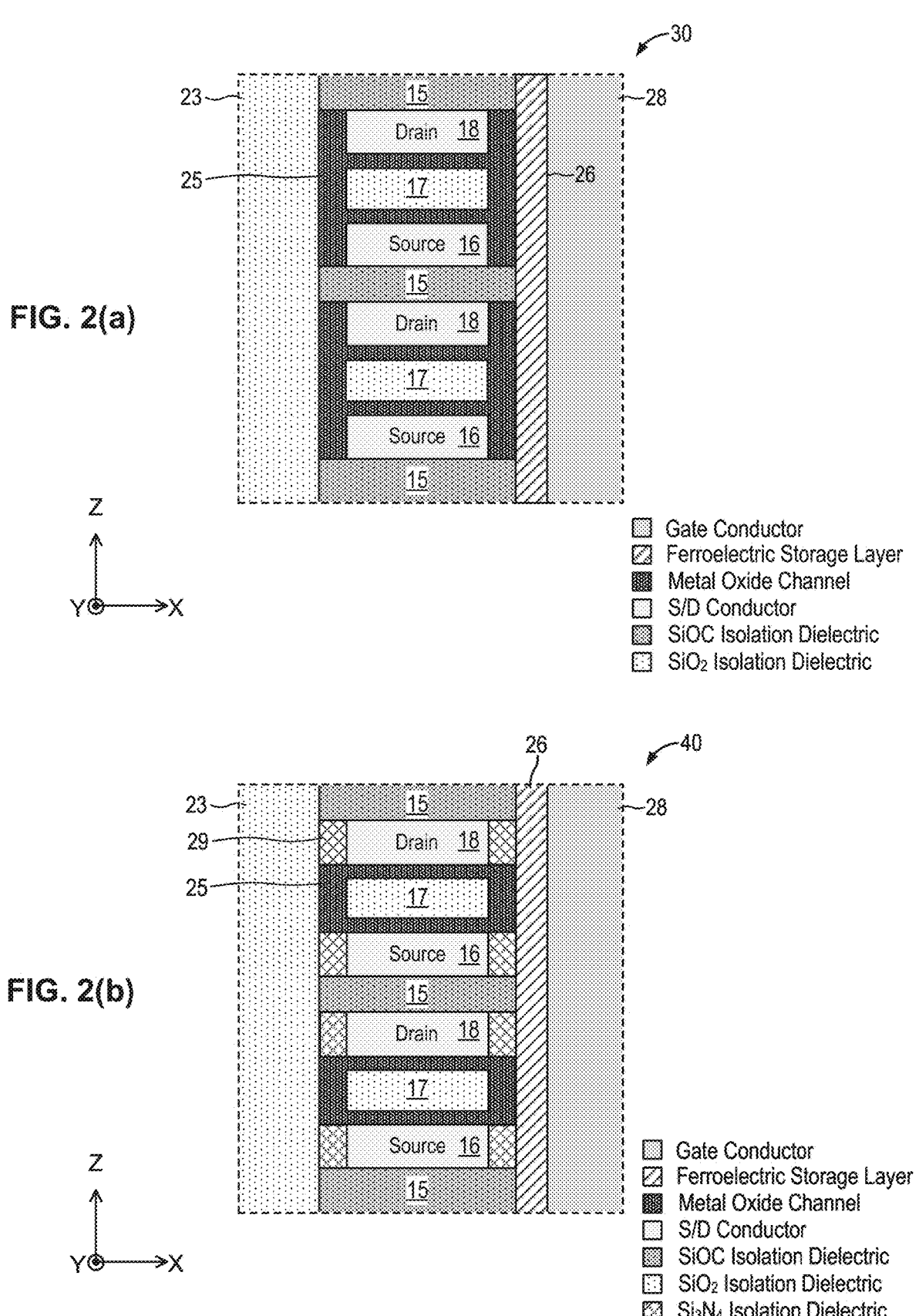
FIG. 2(*a*) illustrates the detail construction of a storage transistor that can be formed in the memory structure of FIG. 1 in some embodiments.

FIG. 2(a) illustrates the detail construction of a storage transistor that can be formed in the memory structure of FIG. 1 in some embodiments. Referring to FIG. 2(a), a storage transistor 30 is formed by the first conductive layer 16 forming the common source line, the second conductive layer forming the common bit line, and the oxide semiconductor channel region 25 in contact with both the source line 16 and the bit line 18. The ferroelectric gate dielectric layer 26 is provided between the channel region 25 and the gate electrode 28. Each storage transistor 30 is isolated from adjacent storage transistors along an active stack (in the Z-direction) by the isolation layer 15. As thus configured, along each active strip (in the Y-direction), a NOR memory string includes storage transistors 30 formed on both sides of the active strip. In the present embodiment, the local word line structures are staggered in the Y direction on either side of an active strip so that storage transistors 30 are not formed directly across the active strip in the X-direction. In the embodiment shown in FIG. 2(a), the oxide semiconductor layer are provided only at each local word line structure and is removed between local word line structures which is beneficial to reduce parasitic capacitance. Accordingly, as shown in FIG. 2(a), the oxide semiconductor channel region 25 is shown only on one side of each active strip. Furthermore, in the present embodiment, the oxide semiconductor channel region 25 is formed in a recess between a pair of isolation layer 15. Therefore, the channel region 25 is formed within each NOR memory string.

In the present embodiment, the oxide semiconductor layer is formed adjacent the ferroelectric gate dielectric layer 26 and also surrounding the isolating layer 17. The structural configuration is a result of the fabrication process where the oxide semiconductor layer is formed after the local word line structure is formed in the fabrication process sequence. In the present description, a process sequence that forms the channel region after the local word line structure is referred herein as a "channel last" process. A channel last process is advantageous in that the oxide semiconductor layer is formed after most of the processing steps to form the memory structure and therefore the oxide semiconductor layer is not subjected to damages or contaminations that may be introduced during the fabrication process sequence. A channel last fabrication process for forming the storage transistor 30 will be described in more detail below.

FIG. 2(b) illustrates the detail construction of a storage transistor that can be formed in the memory structure of FIG. 1 in alternate embodiments. Referring to FIG. 2(b), a ferroelectric storage transistor 40 is formed using the channel last fabrication process where the oxide semiconductor channel region is formed after the ferroelectric gate dielectric layer and the gate electrode 28 are both formed. In the channel last process, the oxide semiconductor channel 25 becomes formed around the isolation layer 17. In storage transistor 40, the common bit line 18 and the common source line 16 are capped by a dielectric layer 29, such as a silicon nitride layer. The dielectric layer 29 insulates the conductive layers 16, 18 from the ferroelectric dielectric layer 26 to reduce the parasitic capacitance between the layers.

Figure 3:
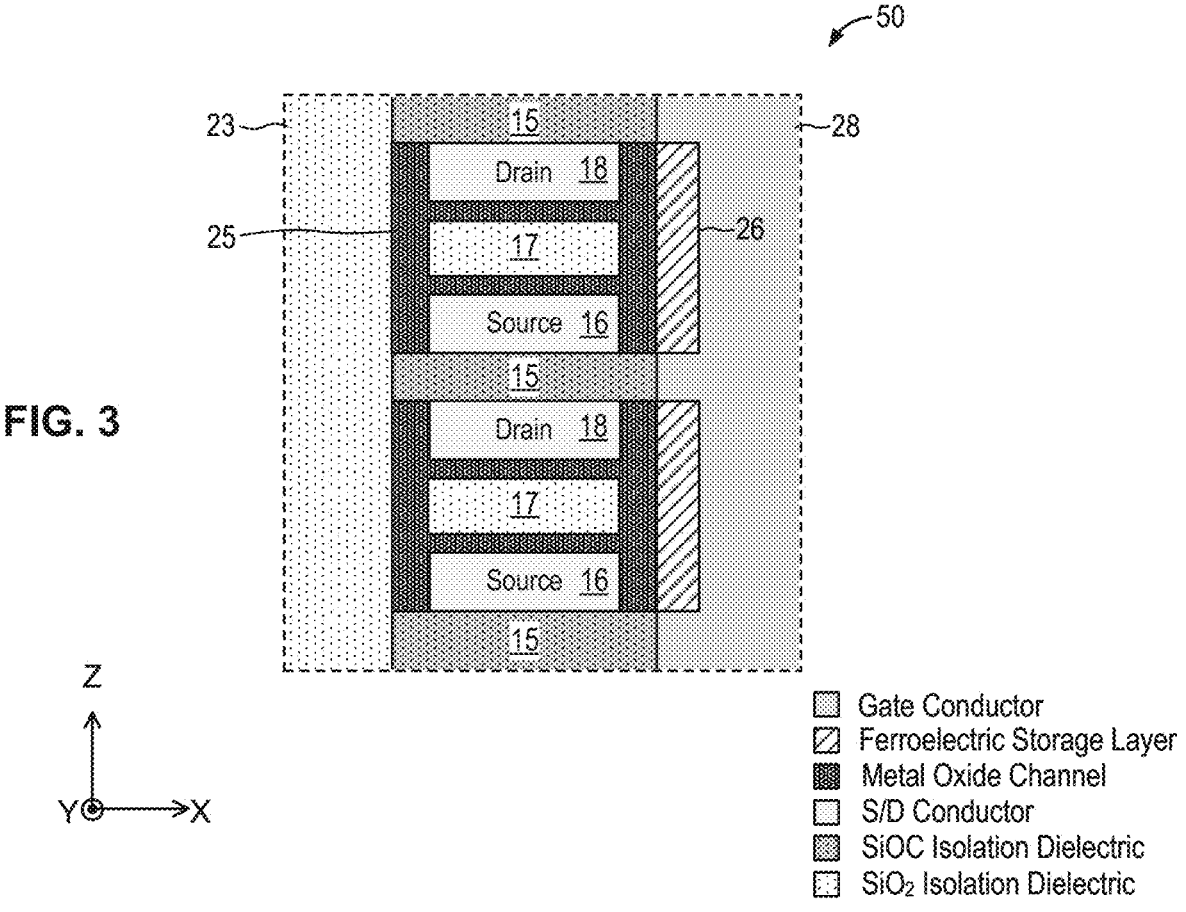
FIG. 3 illustrates the detail construction of a storage transistor with separated ferroelectric gate dielectric layer in some embodiments.

In storage transistor of FIGS. 2 (a) and 2 (b), the ferroelectric gate dielectric layer 26 is formed as a continuous layer across each active stack. In other embodiments, the ferroelectric gate dielectric layer 26 may be separated or singulated at each NOR memory string, which can enhance the isolation of the ferroelectric storage transistors in adjacent planes. FIG. 3 illustrates the detail construction of a storage transistor with separated ferroelectric gate dielectric layer in some embodiments. Referring to FIG. 3, a storage transistor 50 is formed with the ferroelectric gate dielectric layer 26 separated at each NOR memory string. In some embodiments, the ferroelectric gate dielectric layer 26 can be formed using selective deposition so that the ferroelectric gate dielectric layer is only formed adjacent the oxide semiconductor channel region 25 and is not formed on the isolation layer 15.

An oxide semiconductor channel region realizes many advantages in the 3-dimensional array of NOR memory strings of the present invention. First, an oxide semiconductor channel region typically has high mobility for greater switching performance and without concern for electron or hole tunneling. Furthermore, the oxide semiconductor channel has a wider energy bandgap (e.g. 3.1 eV) as compared to a silicon channel (e.g. 1.1 eV). Accordingly, the effect of GIDL (gate induce drain leakage) in the oxide semiconductor channel is much smaller. The storage transistor thus formed has better cell Ion/Ioff ratio (e.g., greater than $1.0 \times 10^7$). Good Ion/Ioff ratio is advantageous to the HNOR memory string structure as a large number of storage transistors are connected to the common bit line.

Second, the storage transistors of the NOR memory strings with the oxide semiconductor channel region become junctionless transistors, thereby eliminating the need to provide polysilicon source-drain layers in the memory structure. As a result, the stack height of the 3-dimensional array of NOR memory strings is greatly reduced as compared to traditional memory array with the same number of planes or layers of NOR memory strings. In some embodiments, the oxide semiconductor channel region 25 has a thickness of 8-15 nm he X-direction. In one example, the oxide semiconductor channel region 25 may have a thickness of 10 nm. In some embodiments, the ferroelectric gate dielectric layer 26 has a thickness of 3-7 nm in the X-direction. In one example, the ferroelectric gate dielectric layer 26 may have a thickness of 4 nm. In some embodiments, the channel length of the ferroelectric storage transistors, that is, the distance between the first and second conductive layers 16, 18 in the Z-direction, is about 50 nm. In the present description, the dimensions are provided merely for illustrative purposes and are not intended to be limiting. In actual implementation, any suitable thicknesses or dimensions may be used.

Third, the NOR memory strings of junctionless storage transistors formed with the oxide semiconductor channel realize further advantages in processing as well as device reliability. By eliminating the need for polysilicon source-drain layers, high process temperature steps can be eliminated and reliability issues, such as junction breakdown voltage and junction related hot electron degradation, can also be avoided.

In the memory structures described above, the 3-dimensional array of NOR memory strings includes ferroelectric storage transistors that are formed on both side edges along the lengths (Y-direction) of each active strip, with vertical local word lines being provided along both side edges in staggered arrangement in the Y-direction. High density is achieved by sharing the local word lines between adjacent active stacks where each local word line serves as the gate electrode to vertically aligned ferroelectric storage transistors of the active strips of each active stack. The vertical local word lines may be contacted by interconnection conductors (also referred to as "global word lines 230") provided above or below the 3-dimensional array of NOR memory strings. In one embodiment, the global word lines run along a direction (X) that is transverse to the lengths (Y) of the contacted active strips. The global word lines connects the local word lines to the support circuits formed in the circuit under array (CuA 220) of the semiconductor substrate 12.

Memory Circuit and Operation

Figure 4:
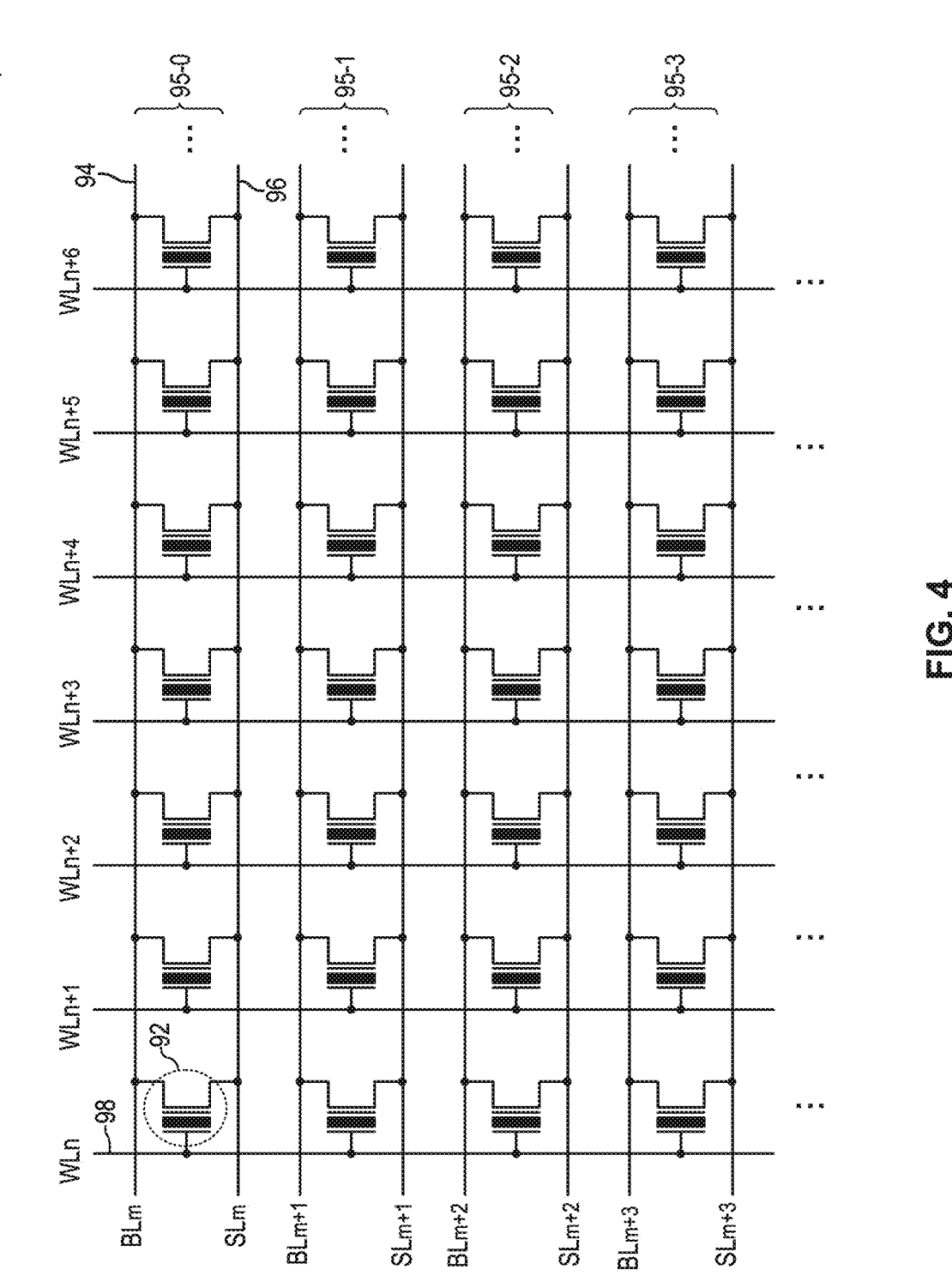
FIG. 4 is a circuit representation of a 3-dimensional array of NOR memory strings in embodiments of the present invention.

FIG. 4 is a circuit representation of a 3-dimensional array of NOR memory strings in embodiments of the present invention. In particular, FIG. 4 illustrates a portion of the NOR memory strings which can be constructed from the memory structures described above. Referring to FIG. 4, a memory array 90 includes ferroelectric storage transistors 92 arranged in NOR memory strings 95, including NOR memory strings 95-0 to 95-3. Each NOR memory string 95 includes ferroelectric storage transistors 92 that are connected across a common bit line BL 94 (e.g. BLm to BLm+3) and a common source line SL 96 (e.g. SLm to SLm+3), with each ferroelectric storage transistor 92 in each NOR memory string 95 being controlled by a respective word line WL 98 (e.g. WLn to WLn+6). More specifically, each ferroelectric storage transistor 92 in a NOR memory string 95 has a gate terminal connected to the word line WL 98, a drain terminal connected to the bit line BL 94, and a source terminal connected to a source line SL 96.

Memory array 90 includes NOR memory strings formed in an active stack, with each NOR memory strings 95-0 to 95-5 being located on a different plane of the 3-dimensional memory structure. Ferroelectric storage transistors 92 in a column across the multiple NOR memory strings are controlled by a common word line WL 98, also referred to as a local word line or LWL. FIG. 4 illustrates a portion of the NOR memory strings including ferroelectric storage transistors 92 connected to word lines WLn to WLn+6. In practice, there may be thousands of word lines (e.g. 4096 word lines) in the memory array, resulting in thousands of randomly accessible ferroelectric storage transistors in a NOR memory string. The memory array 90 includes a control circuit for controlling the read, write and refresh operations of the memory array. For example, the control circuit can be formed in the semiconductor substrate 12 under the memory array, as shown in FIG. 1, and is referred to as a circuit under array or CuA. In some examples, the memory array 90 may be organized in memory pages where a memory page refers to a group of storage transistors that are accessed together for read and write operations. The ferroelectric storage transistors 92 in the memory array 90 can be grouped in various ways to form memory pages of the desired size.

In memory array 90, the source line 96 is electrically floating, that is, the source line 96 is not connected to any electrical potential. In practice, the source line 96 maintains a relatively constant voltage through the parasitic capacitance at the source terminals, such as the parasitic capacitance between the source terminals and the gate terminals of the storage transistors. More specifically, the parasitic capacitance intrinsic to each NOR memory string (e.g., the distributed capacitance between the common source terminal of a NOR memory string and its multiple associated local word lines) may be used as a virtual voltage source, under some operating conditions, to provide a common source voltage. In the present description, the source line 96 is sometimes referred to as being connect to a virtual ground. In other embodiments, the source line 96 can be provided with a given voltage potential, such as the ground voltage, by a voltage source. In some examples, the source voltage can be set to a desired voltage value through a pre-charge operation and the source line can then be left floating after the pre-charge operation. In one embodiment, the pre-charge operation set the bit line to a desired voltage through a pre-charge transistor and then the source line is charged from the bit line to a voltage to equal to the bit line voltage.

In embodiments of the present invention, the ferroelectric storage transistors 92 are thin-film ferroelectric field-effect transistors. More specifically, a ferroelectric field-effect transistor (also referred to as FeFET) is formed by using a ferroelectric material as the gate dielectric layer between the gate conductor, usually a metal layer, and the channel of a field-effect transistor. In some embodiments, the ferroelectric storage transistor may further include an interface dielectric layer adjacent the channel and the ferroelectric gate dielectric layer. The ferroelectric storage transistor realizes memory function by storing data as polarization states in the ferroelectric gate dielectric layer. In particular, a voltage applied between the gate conductor and the channel induces electrical polarization in the ferroelectric gate dielectric layer, which polarization can be reversed with application of a voltage in the opposite polarity. The ferroelectric gate dielectric layer retains the induced polarization state after removal of the applied gate voltage, realizing the memory function of the ferroelectric storage transistor. For instance, ferroelectric storage transistors can be applied to form non-volatile memory cells where data is stored in the ferroelectric dielectric layer as two stable, remanent polarization states.

The induced polarization states of the ferroelectric gate dielectric layer change the threshold voltage of the ferroelectric storage transistor. The change or shift in the threshold voltage of the ferroelectric storage transistor due to the different polarization states can be used to represent data in different logical states. For example, two logical states (e.g., "0" and "1") can be represented by the higher and lower threshold voltages of the ferroelectric storage transistor as a result of two induced electrical polarization states in the ferroelectric dielectric layer. In other embodiments, more than two polarization states can be induced in the ferroelectric gate dielectric layer, such as by applying two or more different voltage ranges across the ferroelectric dielectric layer. In this manner, the ferroelectric storage transistor can be operated to store data in more than two logical states.

In embodiments of the present invention, the three-dimensional array of NOR memory strings of ferroelectric storage transistors can be applied to implement a non-volatile memory device or a quasi-volatile memory device. For example, a quasi-volatile memory has an average retention time of greater than 100 µs, such as about 10 minutes or a few hours, whereas a non-volatile memory device may have a minimum data retention time exceeding 5 years. In one embodiment, the ferroelectric storage transistor has a data retention time longer than 1 hour and a program/erase cycle endurance greater than $10^8$ program/erase cycles. For example, the ferroelectric storage transistor may have a data retention time of a few hours and a program/erase cycle endurance of around $10^{11}$. Such a ferroelectric storage transistor can be used to form a quasi-volatile memory device where the refresh intervals can be on the order of hours, significantly longer than the refresh intervals of DRAMs which require much more frequent refreshes, such as in tens of milli-seconds. In some embodiments, multiple three-dimensional arrays of ferroelectric storage transistors ("tiles") may be used to form a quasi-volatile memory device with high memory capacity.

The ferroelectric storage transistor stores data in the ferroelectric gate dielectric layer. In operation, an applied electric field of a first polarity, such as by applying a voltage of the first polarity at the gate terminal relative to the source terminal, induces a first polarization state in the ferroelectric gate dielectric layer. Meanwhile, the application of an electric field of a second polarity, opposite the first polarity, such as by applying a voltage of the second polarity at the gate terminal relative to the source terminal, induces a second polarization state in the ferroelectric gate dielectric layer. The first polarization state shifts the threshold voltage $V_t$ of the ferroelectric storage transistor to a lower value, which can be used to encode a first logical state, such as a logical "1" state. Alternately, the second polarization state shifts the threshold voltage $V_t$ of the ferroelectric storage transistor to a higher value, which can be used to encode a second logical state, such as a "0" state. In the present description, shifting the threshold voltage $V_t$ of the ferroelectric storage transistor to a higher value (logical "0") is referred herein as a program operation and shifting the threshold voltage $V_t$ of the ferroelectric storage transistor to a lower value (logical "1") is referred herein as an erase operation.

In some embodiments, the pre-charge operation described above can be used to set the source line and bit line voltages of a NOR memory string to voltages that are more negative than the voltage on the local word line (for example during an erase operation), or more positive than the voltage on the local word line (for example during a program operation) are advantageous because the erase or program polarization states of the ferroelectric storage transistors are somewhat symmetrical in that the cell polarization can be readily reversed by reversing the voltage of the source and drain terminals as one electrode and the voltage of the local word line as the second electrode. In some embodiments, each string of ferroelectric storage transistors, by virtue of being thin-film-transistors, as opposed to a single crystalline transistors formed within the semiconductor substrate, does not require a hard wire connection to the ground potential of the semiconductor substrate for any of its common source, common drain, or common channel. Instead, both polarization states can be imposed on the FeFET with only positive voltages (or only negative voltages) applied to the local word lines or the common source/common drain. This single voltage polarity feature simplifies the process flow for the control/logic transistors formed in the substrate, and allows optimized operation because ferroelectric polarization states typically have a voltage hysteresis that can go from negative voltages (erased state) to positive voltages (programmed state).

In embodiments of the present invention, the ferroelectric storage transistors are formed using an oxide semiconductor channel. For example, the oxide semiconductor channel can be formed using an amorphous oxide semiconductor material, such as indium gallium zinc oxide (InGaZnO or "IGZO"). An oxide semiconductor channel region has the advantage of a high mobility for greater switching performance and without concern for electron or hole tunneling. For example, an IGZO film has an electron mobility of 10.0-100.0 cm$^2$/V, depending on the relative compositions of indium, gallium and zinc. The oxide semiconductor channel forms an N-type, unipolarity channel region where the conductive layers 16a, 18, 16b (FIG. 1) forming the source and drain terminals directly contact the channel region. The ferroelectric storage transistor thus formed is a depletion mode device where the transistor is normally on and can be turned off by depleting the N-type carriers in the channel region. The threshold voltage of the ferroelectric storage transistor is a function of the thickness (X-direction) of the oxide semiconductor channel region 25. That is, the threshold voltage of the ferroelectric storage transistor is the amount of voltage necessary to deplete the thickness of the oxide semiconductor channel region to shut off the ferroelectric storage transistor.

Figure 5B:
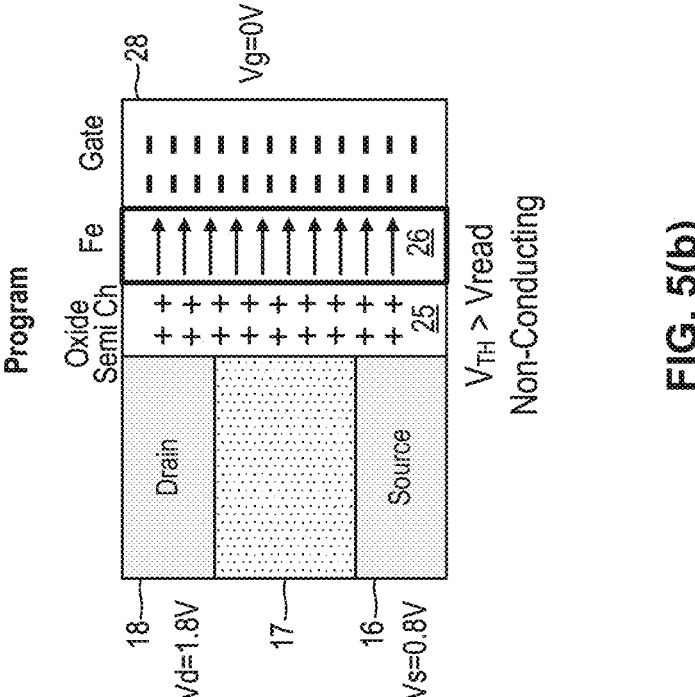
FIGS. 5(*a*) and 5(*b*) illustrate the erase and program operations of the ferroelectric storage transistor in embodiments of the present disclosure.

Exemplary operation conditions of the three-dimensional NOR memory strings of ferroelectric storage transistors will now be described with reference to FIGS. 5(a) and 5(b). In embodiments of the present invention, the write operation to the NOR memory strings is carried out by first performing an erase operation followed by a program operation. In some cases, the erase operation may erase a memory page of ferroelectric storage transistors and then selective storage transistors are programmed to the desired data value.

As described above, in the three dimensional array of NOR memory string, the ferroelectric storage transistors in a NOR memory string share a common source line and a common bit line. A salient feature of the ferroelectric storage transistors of the present invention is that the common source line (the source terminal) and the common bit line (the drain terminal) are formed on a first side of the channel region and the ferroelectric gate dielectric layer and in electrical contact with the oxide semiconductor channel region. Meanwhile, the ferroelectric storage transistors in the NOR memory string are controlled by individual control gate electrodes which are formed on a second side, opposite the first side, of the ferroelectric gate dielectric layer. This structure is shown in FIGS. 5(a) and 5(b). The configuration of having the drain and source terminals on the opposite side of the channel region/ferroelectric gate dielectric layer as the gate electrode is particularly advantageous for ferroelectric storage transistors to induce the desired polarization state in the ferroelectric gate dielectric layer. In particular, the electric field generated by the voltage difference between the gate electrode and the source/drain terminals can be efficiently applied to induce or change the polarization state of the ferroelectric gate dielectric layer.

More specifically, in the ferroelectric storage transistor of the present invention, the electric field is applied directly across the channel region and the ferroelectric gate dielectric layer to maximize the effect of the electric field for inducing polarization in the ferroelectric gate dielectric layer. Furthermore, with the source and drain terminals on opposite side of the channel region/ferroelectric gate dielectric layer as the gate electrode, both the electric field and the fringing field from the source and drain terminals to the gate electrode go through the channel region and the ferroelectric gate dielectric layer, maximizing the available electric field to induce the desired polarization. With efficient use of the available electric field, including the fringing field, the ferroelectric storage transistor thus configured can be erased or programmed at a lower erase or program voltages, that is lower voltage difference to be applied across the gate and source/drain terminals. In some cases, ferroelectric memory cell with shorter channel length can realize a wider memory window, or wider threshold voltage difference, due to the higher fringing field penetrating into the channel region. This is contrary to conventional ferroelectric transistor structures where the gate terminal and the source/drain terminals are both formed on the same side of the channel region/ferroelectric gate dielectric layer. In that case, only a small fraction of the electric field and the fringing field from the source and drain terminals to the gate electrodes goes through the channel region and the ferroelectric gate dielectric layer to induce polarization.

Figure 5A:
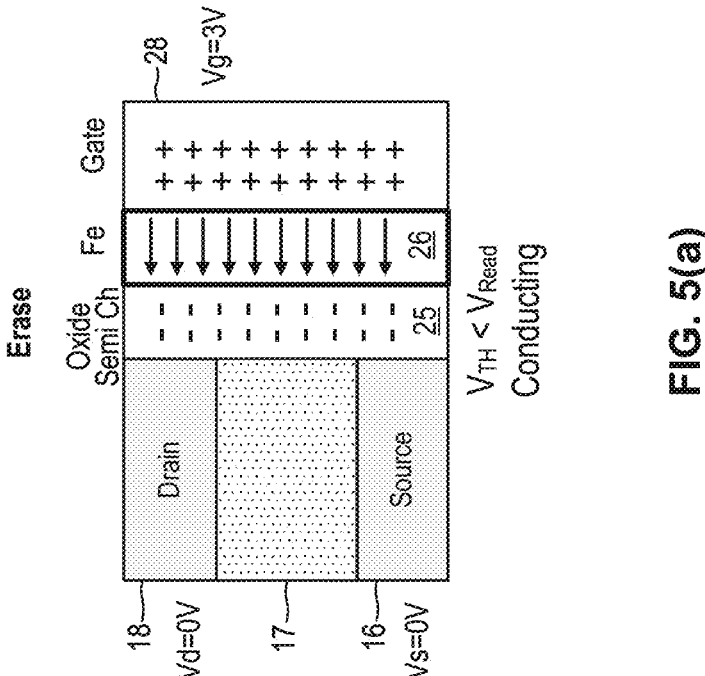

Referring to FIG. 5(a), to erase a ferroelectric storage transistor in a selected page, a word line voltage that is more positive than the source line and bit line voltages is used. In some embodiments, the source line voltage and bit line voltage are both set to 0V and the word line or gate voltage is driven to 2-3V. Unselected ferroelectric storage transistors can be inhibited from being erased by having their gate voltage, the bit line voltage and the source voltage to be driven to 1.1V. As a result of the voltage bias between the gate and the drain/source of the transistor, the ferroelectric gate dielectric layer is induced to a first polarization state where electrons are accumulated in the channel region 25 and the threshold voltage of the storage transistor is set to a low voltage value, in particular, lower than the read voltage value. In other words, when the read voltage is applied to the gate 28, the erased ferroelectric storage transistor is conducting. In the present description, ferroelectric storage transistors that have been erased have a first logical state of "1" and ferroelectric storage transistors that have been programmed have a second logical state of "0".

Referring to FIG. 5(*b*), to program the ferroelectric storage transistor, a word line voltage that is more negative than the source line and bit line voltages is used. Alternately, the source line voltage and the bit line voltage of the ferroelectric storage transistor to be programmed can be made more positive than the word line voltage. In embodiments of the present disclosure, the program operation of the ferroelectric storage transistors implements asymmetric programming. Asymmetric programming refers to using different source line voltage and the bit line voltage for the program operation. In the present embodiment, to program the selected ferroelectric storage transistor, the word line or gate voltage is set to 0V. The bit line voltage for the selected ferroelectric storage transistor to be programmed is set to 1.8V and the source line voltage is set to 0.8V. To inhibit programming of the unselected ferroelectric storage transistors, the gate voltage, the bit line and source line voltage are all set to 0.8V. As a result of the voltage bias between the gate and the drain/source of the transistor, the ferroelectric gate dielectric layer is induced to a second polarization state where electrons are depleted in the channel region 25 and the threshold voltage of the storage transistor is set to a higher voltage value, in particular, higher than the read voltage value. In other words, when the read voltage is applied to the gate 28, the programmed ferroelectric storage transistor is not conducting.

To read the polarization state from the ferroelectric storage transistor, a small positive gate-to-source voltage ("the read voltage") is applied and a small positive bit line voltage is applied. For example, the word line or gate voltage can be set to a positive voltage of 0.7V, the source line voltage set to 0V, and the bit line voltage set to 0.5V. As thus biased, a ferroelectric storage transistor that is in the erased state will be conducting and an "on" current Ion flows between the bit line and the source line of the erased storage transistor. Meanwhile, a ferroelectric storage transistor that is in the programmed state will be non-conducting and no current flows between the bit line and the source line of the programmed storage transistor, except for a small leakage current, referred to as an "off" current Ioff. To prevent disturb to the unselected ferroelectric storage transistors during the read operation, the unselected storage transistors have their gate voltage, source line voltage and bit line voltage all set to 0V. As thus biased, ferroelectric storage transistors selected for read operation that are erased will conduct current Ion while ferroelectric storage transistors selected for read operation that are programmed will conduct current Ioff. The bit lines of the ferroelectric storage transistors are connected to sense amplifiers to sense the cell current and to generate an output logical value indicative of the cell current.

In the above description, voltage bias conditions are described and example voltage values are provided to illustrate the erase, program and read operations of the memory array of ferroelectric storage transistors. The voltages described above are illustrative only and not intended to be limiting. In other embodiments, other voltage values can be used to implement the voltage bias conditions for erase, program and read operations.

As described above, in embodiments of the present disclosure, the common source line of the memory structure can be left floating, or not electrically connected to any potential. Instead, the common source line can be precharged using one or both of the bit lines in the pair of NOR memory strings prior to erase, program and read operations. In one embodiment, the pre-charge operation set the bit line to a desired voltage through a pre-charge transistor and then the source line is charged from the bit line to a voltage to equal to the bit line voltage.

Fabrication Process

Figure 6A:
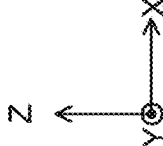
FIGS. 6(*a*) to 6(*t*) illustrate a process for fabricating a memory structure including a 3-dimensional array of NOR memory strings of ferroelectric storage transistors according to embodiments of the present invention.
Figure 6B:
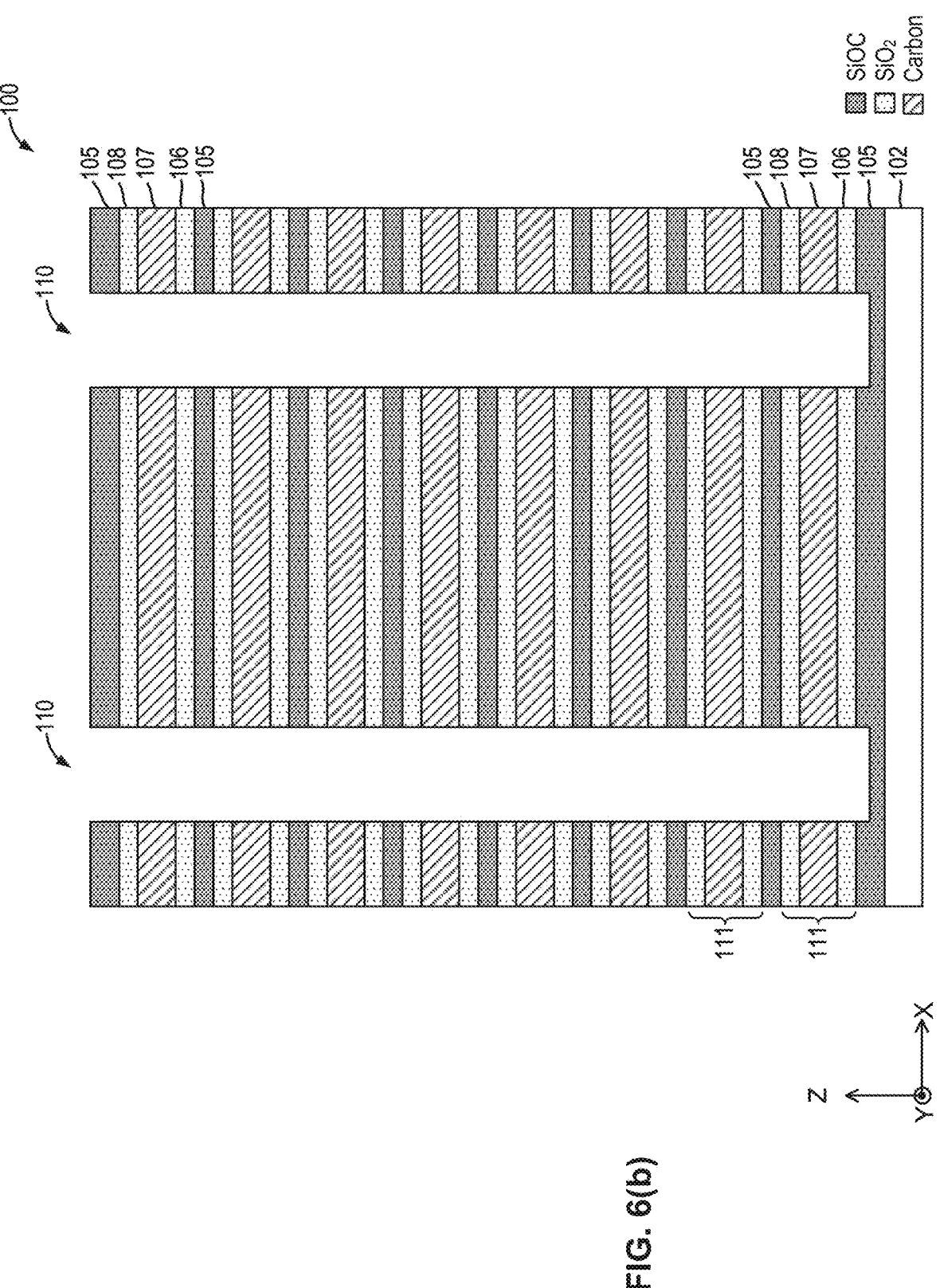
Figure 6C:
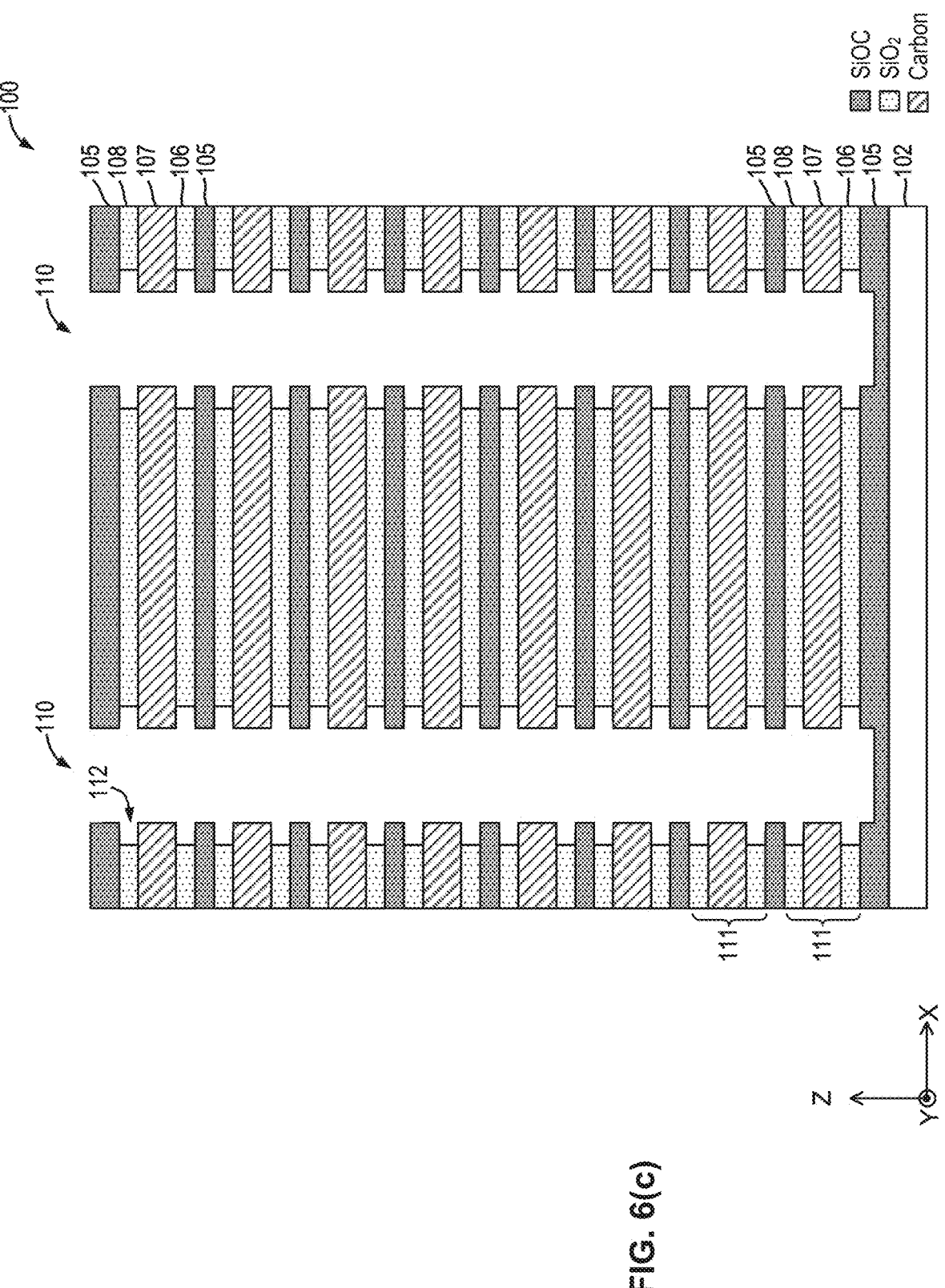
Figure 6D:
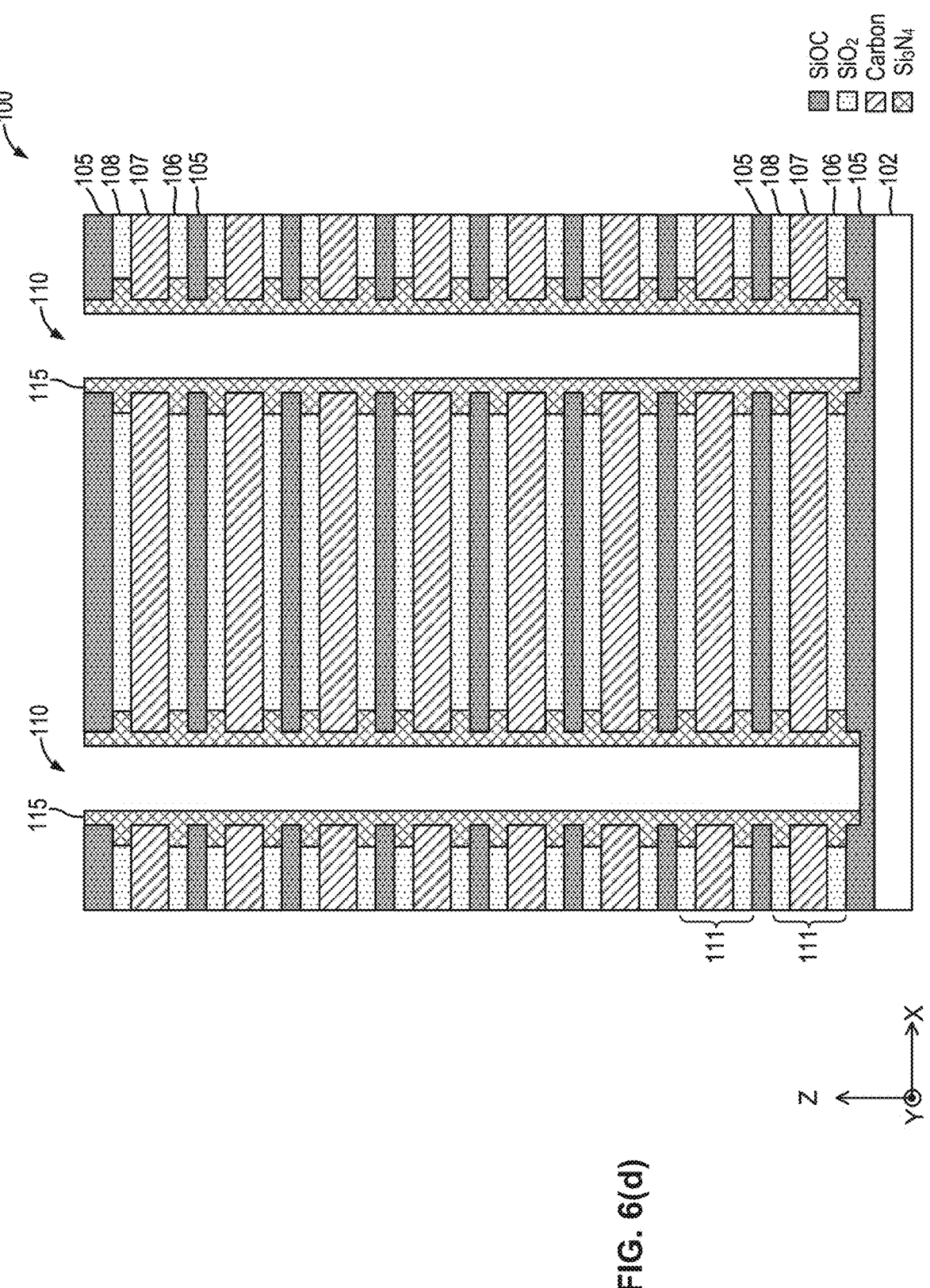
Figure 6E:
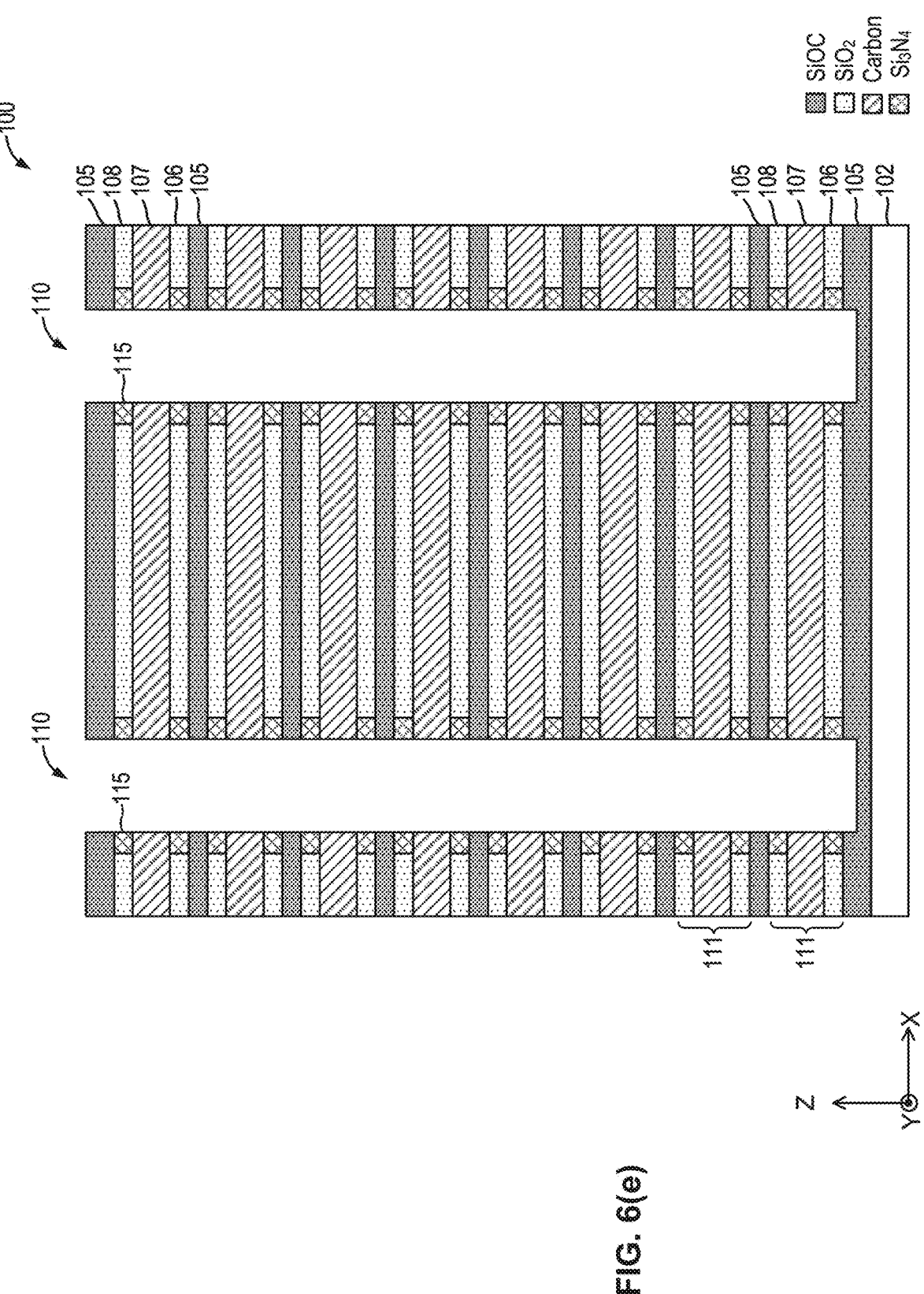
Figure 6F:
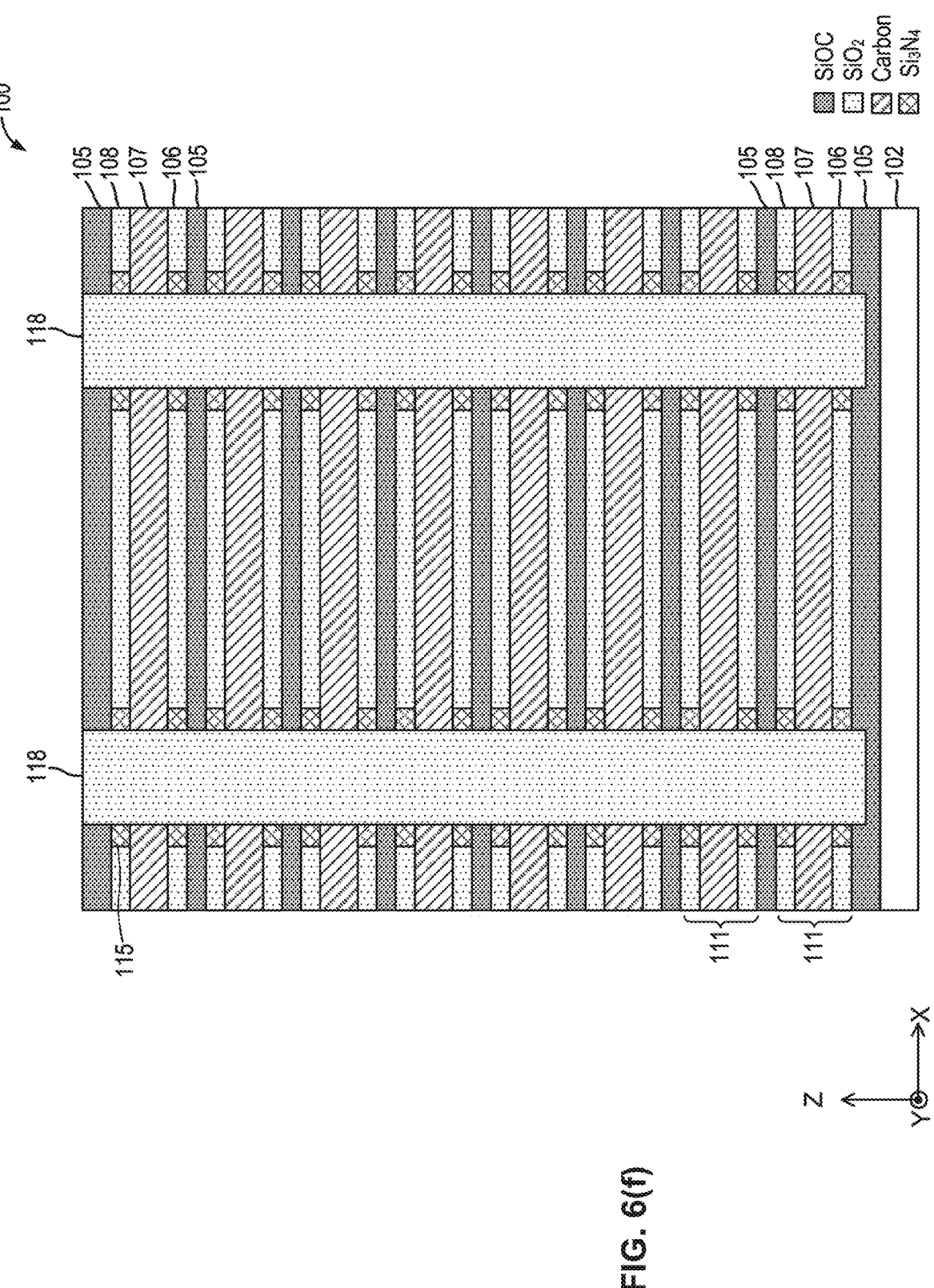
Figure 6G:
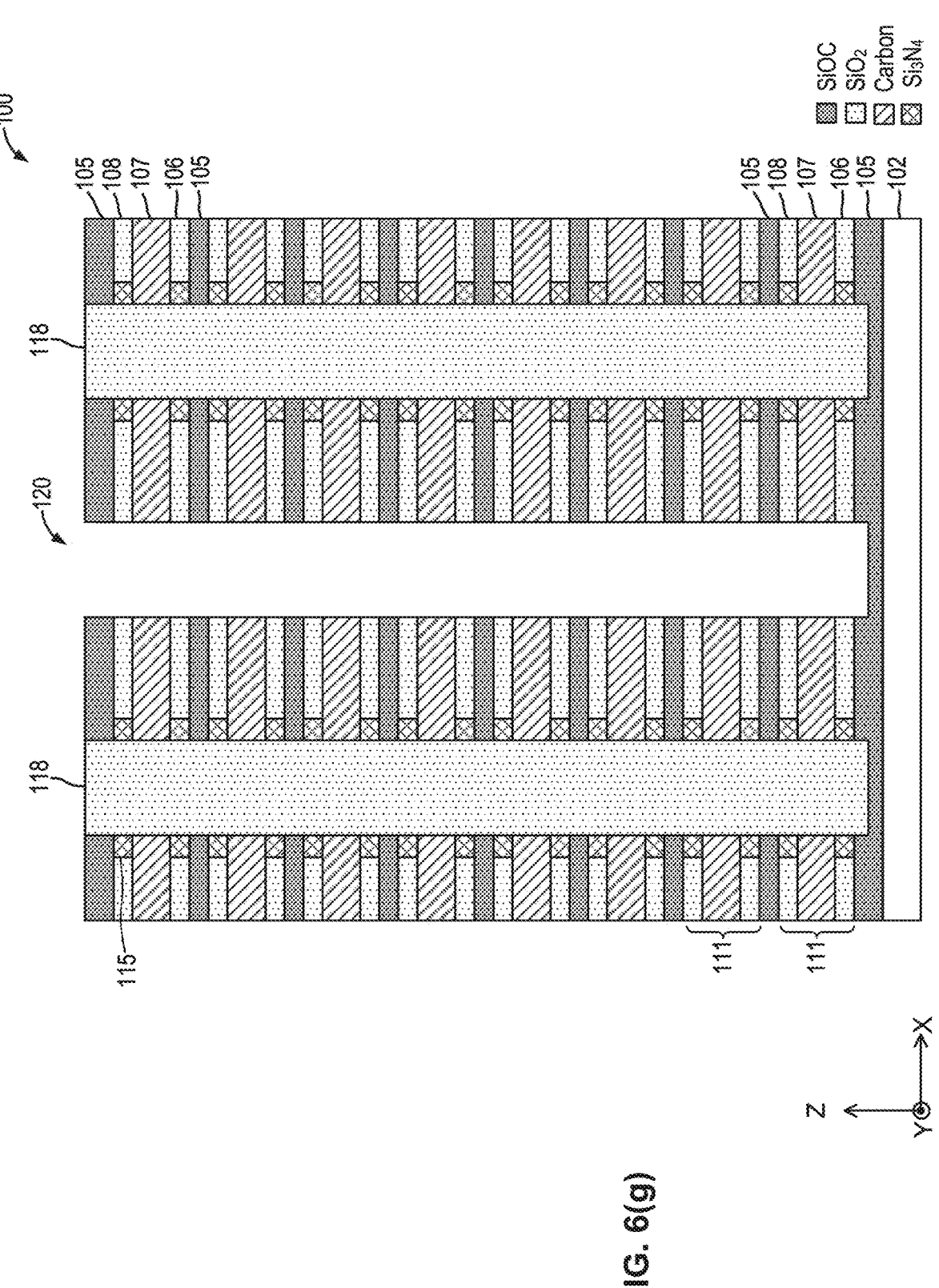
Figure 6H:
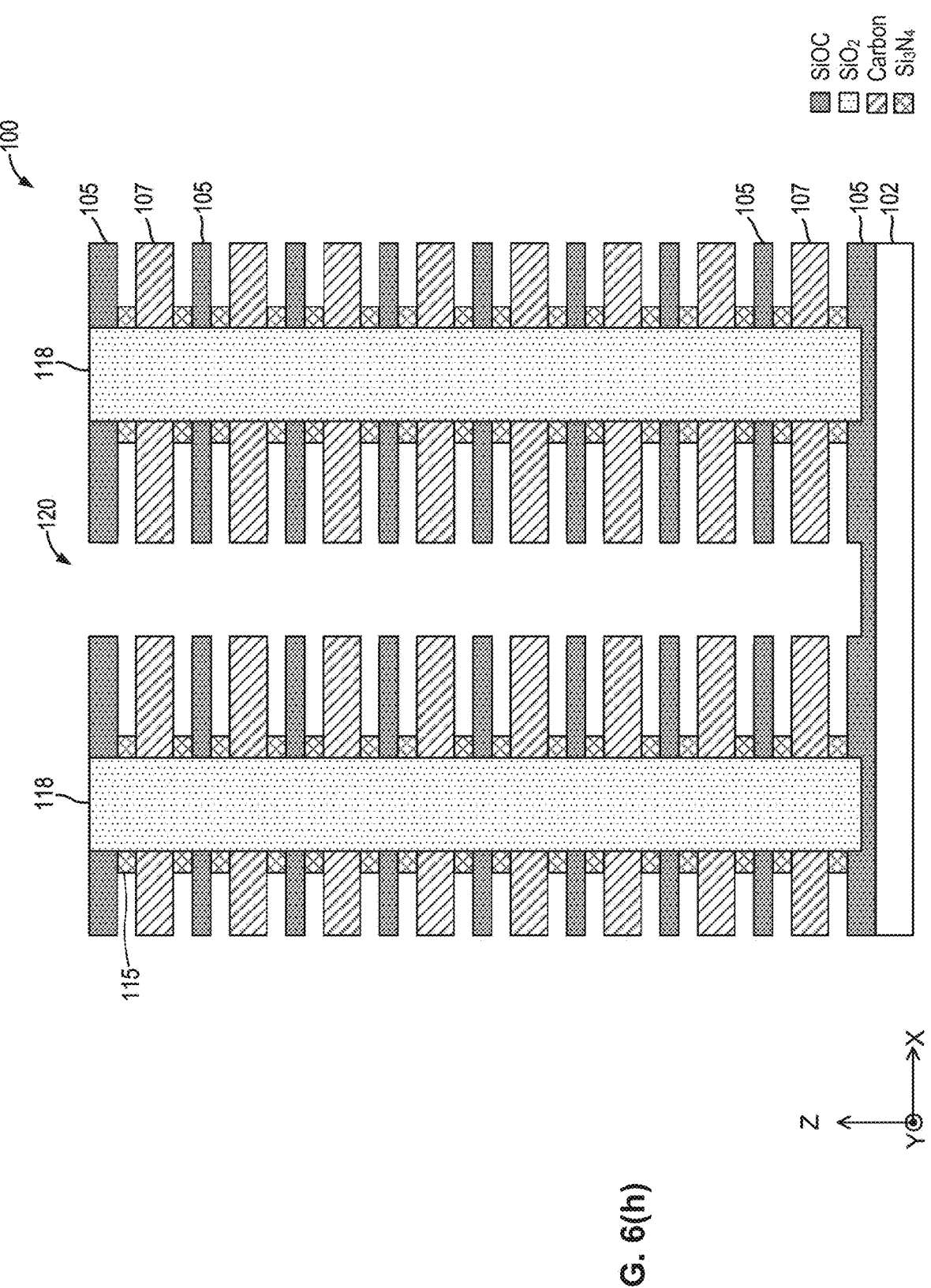
Figure 6I:
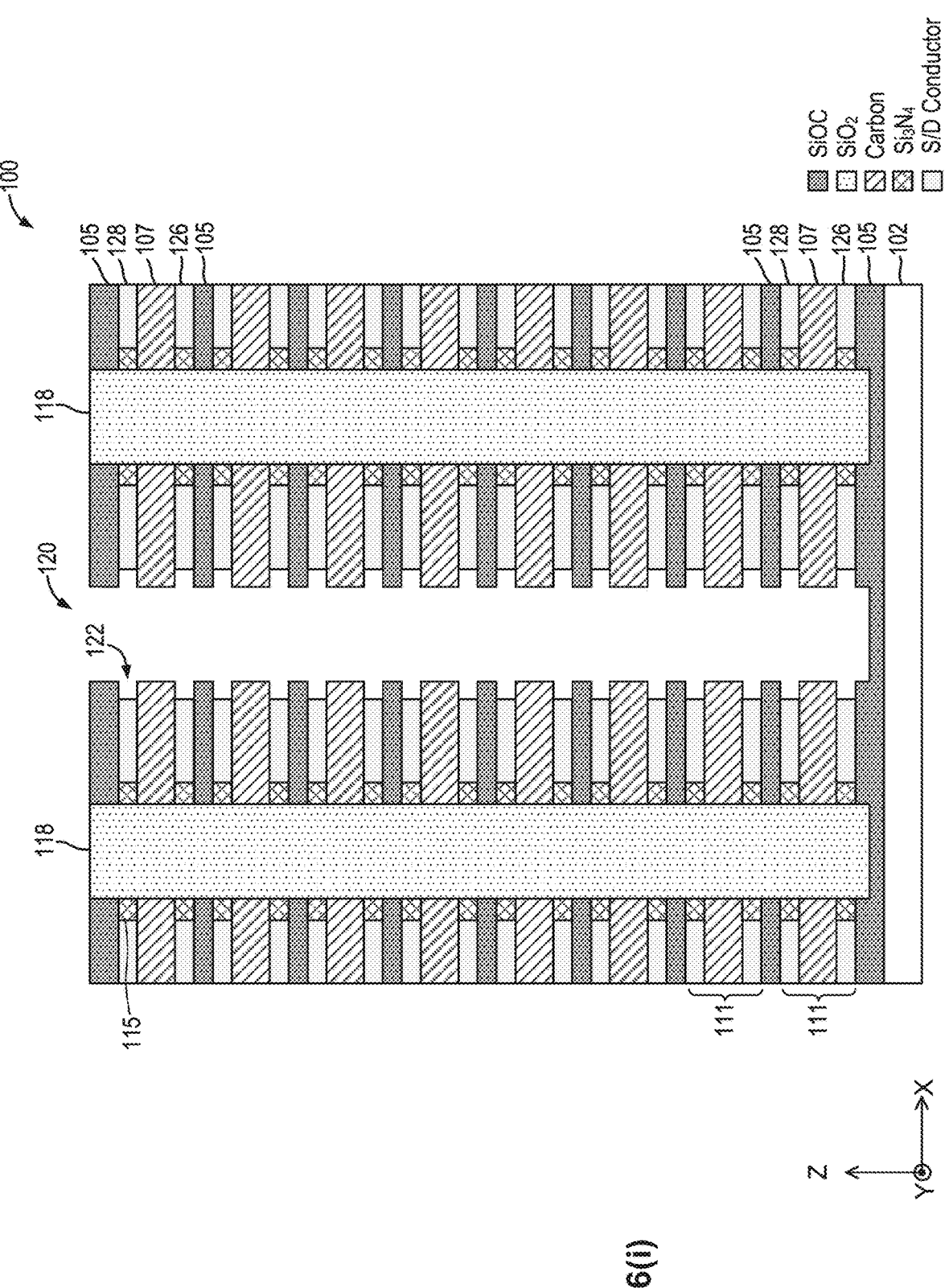
Figure 6J:
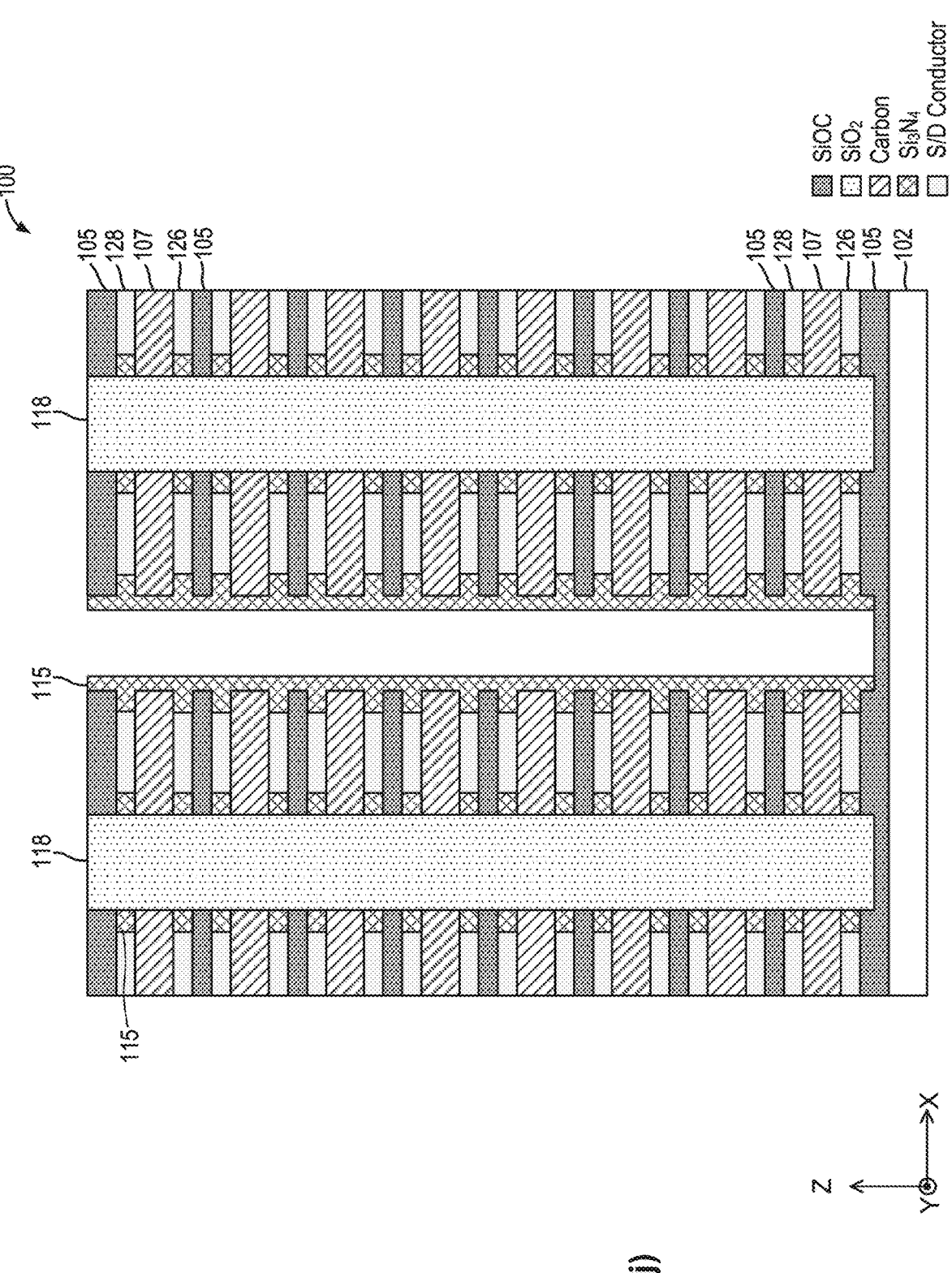
Figure 6K:
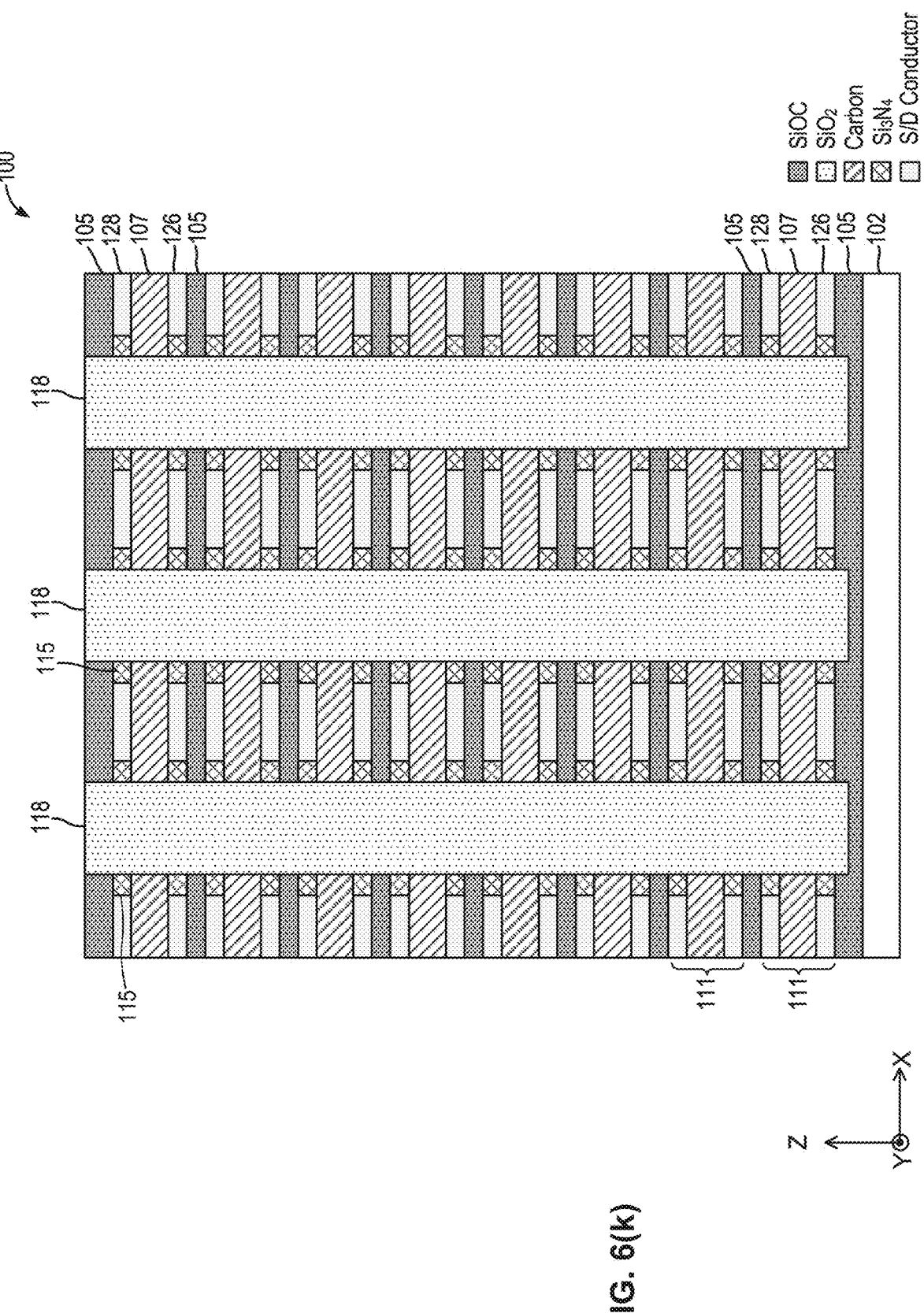
Figure 6:
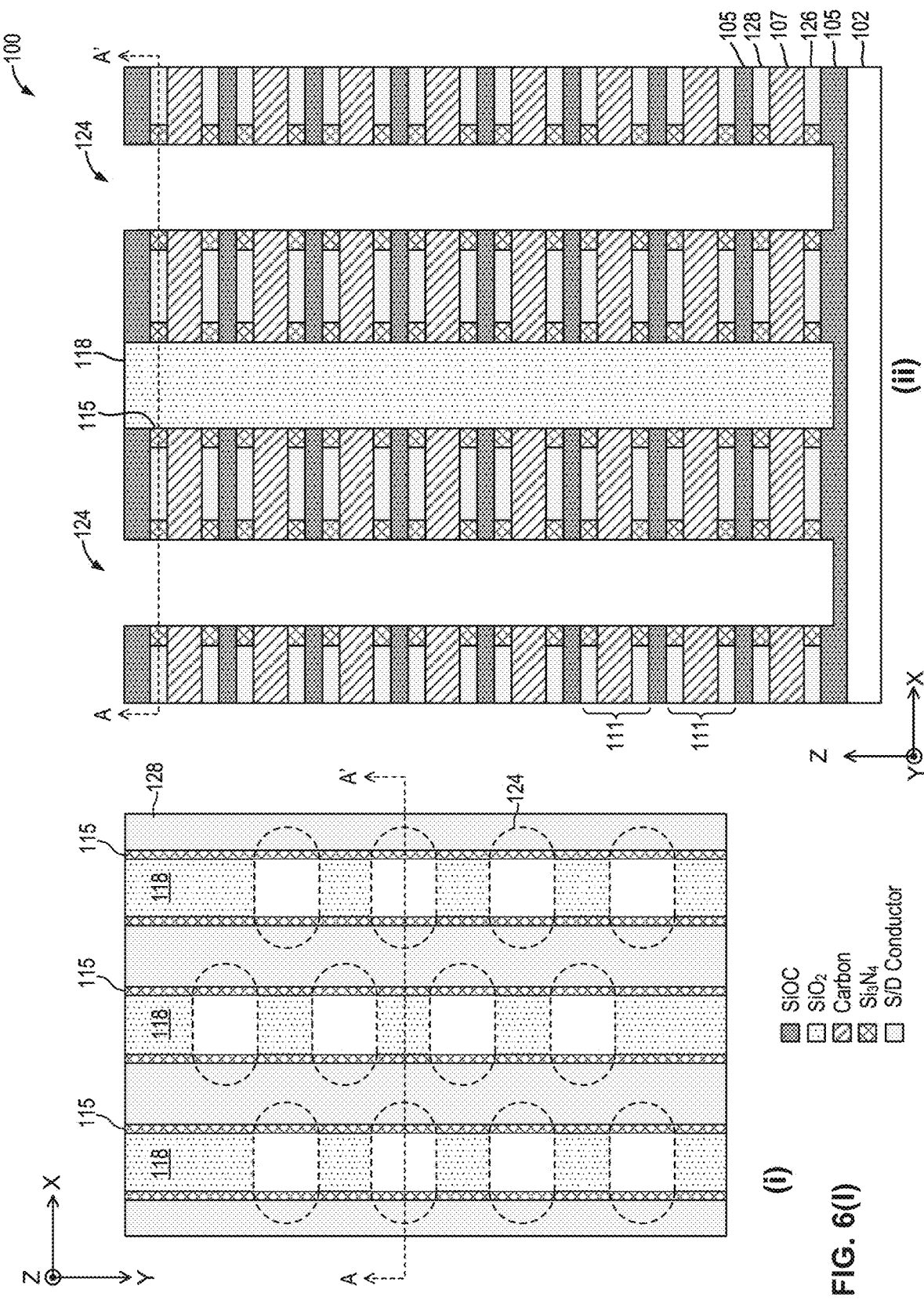

FIGS. 6(*a*) to 6(*t*) illustrate a process for fabricating a memory structure including a 3-dimensional array of NOR memory strings of ferroelectric storage transistors according to embodiments of the present invention. FIGS. 6(*a*) to 6(*k*) illustrate vertical cross-sectional views (i.e., in an X-Z plane) of a portion of the 3-dimensional array of NOR memory strings. Each figure in FIGS. 6(1) to 6(*t*) includes two views: view (i) is a horizontal cross-sectional view (i.e., in an X-Y plane) along line A-A' in view (ii), and view (ii) is a vertical cross-sectional view (i.e., in an X-Z plane) along line A-A' in view (i).

Referring to FIG. 6(*a*), initially, a memory structure 100 is formed by successive depositions of a multilayer structure including (i) an isolation dielectric layer 105, (ii) a first sacrificial layer 106, (iii) a second sacrificial layer 107, and (iv) a third sacrificial layer 108 on the planar surface of a semiconductor substrate 102. In some embodiments, a buffer oxide layer may be provided on the surface of the semiconductor substrate 102 before the isolation dielectric layer 105 and the sacrificial layer 106 are formed on the substrate 102. In the present embodiment, the isolation dielectric layer 105 is silicon oxycarbon (SiOC) layer and may have a thickness of 30 nm. The first and third sacrificial layers 106 and 108 are each a silicon nitride layer and may have a thickness of 40 nm. The sacrificial layers 106, 108 will be replaced by a conductive layer in metal replacement process in subsequent processing. The second sacrificial layer 107 is a carbon layer and may have a thickness of 50-70 nm. Carbon layer 107 may be deposited, for example, by chemical vapor deposition at 650° C., at 1.0 Torr. FIG. 6(*a*) shows the memory structure 100 after the depositions of the initial layers of thin films. In the present illustration, eight multilayer structures are deposited. As described above, dimensions are provided in the present description for illustrative purposes and are not intended to be limiting. In actual implementation, any suitable thicknesses or dimensions may be used. The drawings are not necessarily to scale.

Referring to FIG. 6(*b*), a first set of trenches 110 are formed in memory structure 100 using, for example, an anisotropic etch after a photo-lithographical patterning step. In some examples, the trenches 110 may be 70 nm wide, with a spacing of 190 nm apart. Referring to FIG. 6(*c*), with the first set of trenches exposing sidewalls of the active layers 111, recesses 112 are formed in the first and third sacrificial layers 106 108 through the trench openings. That is, the first and third sacrificial layers 106, 108 are etched or recessed, such as by 10 nm, from the sidewall of the trenches 110. Thereafter, an isolation layer 115 is deposited to fill the recess 112, as shown in FIG. 6(*d*). In one embodiment, the isolation layer 115 is a silicon nitride layer and may be deposited using an atomic layer deposition (ALD) technique. Excess isolation material formed on the sidewalls of the trenches 110 is removed, such as by an anisotropic etching or dry etch process. As a result, the remaining isolation layer 115 caps the ends of the first and third sacrificial layers 106, 108, as shown in FIG. 6(*e*).

Thereafter, the trenches are filled by a dielectric material 118, as shown in FIG. 6(f). In some embodiments, the dielectric material 118 is a silicon oxide material, such as $SiO_2$. Excess dielectric material may be removed from the top of memory structure 100 using, for example, chemical-mechanical polishing (CMP).

Referring to FIG. 6(g), with the mechanical support from dielectric material 118, a second set of trenches 120 are then cut using substantially the same technique as discussed in conjunction with FIG. 6(b) above. In some examples, the trenches 120 may be 70 nm wide. Each of the second set of trenches 120 is cut between an adjacent pair of the first set of trenches 110 and each of the second set of trenches 120 is cut substantially equidistant between an adjacent pair of the first set of trenches 110. As a result of trenches 110 and 120 being cut in the multilayer structure, stacks in the multilayer structure are formed which are referred to as "active stacks" in the present description. In some examples, the active stacks are each approximately 60 nm wide. The resulting narrow strips of layers 105 to 108 in the active stacks are referred herein as "active strips."

Thereafter, the first and third sacrificial silicon nitride layers 106 and 108 are removed using, for example, a wet etch, thereby creating cavities between the isolation dielectric layer 105 and the second sacrificial layer 107, as shown in FIG. 6(h). The cavities are filled by conductive layers 126, 128. In some embodiments, the conductive layers 126, 128 is a refractory metal layer, such as molybdenum (Mo) or tungsten (W). In other embodiments, the conductive layers 126, 128 can be a metal layer selected from molybdenum, titanium, tungsten, lanthanum, tantalum, ruthenium, any silicide thereof, any nitride thereof, and any combination thereof. For example, the conductive layers 126, 128 may be formed using, for example, an atomic layer deposition (ALD) technique. An etching step removes any of the deposited material from the sidewalls of trenches 120. In some examples, an isotropic wet etch is used to remove the deposited material from the sidewalls of trenches 120. In the present embodiment, the conductive layers 126, 128 is a molybdenum layer and forms the source and drain terminals of the ferroelectric storage transistors to be formed.

Thereafter, the conductive layers 126, 128 are etched from the exposed sidewalls to form recesses 122, such as a recess of 10 nm from the sidewall of the trenches 120, as shown in FIG. 6(i). Thereafter, an isolation layer 115 is deposited to fill the recess 122, as shown in FIG. 6(j). For example, the isolation layer 115 is a silicon nitride layer and may be deposited using an atomic layer deposition (ALD) technique. Excess isolation material formed on the sidewalls of the trenches 110 is removed, such as by an anisotropic etching or dry etch process. As a result, the remaining isolation layer 115 caps the ends of the conductive layers 126, 128, as shown in FIG. 6(k). The remaining isolation layer 115 is referred to as a silicon nitride spacer in the present description. Trenches 120 are then filled by the dielectric material 118, such as SiO2. Excess deposited materials may be removed from the top of memory structure 100, such as by CMP. The resulting memory structure 100 is shown in FIG. 6(k).

Referring to FIG. 6(1), thereafter, vias 124 are patterned and the dielectric material 118 exposed by the vias 124 are etched using, for example, an anisotropic etch. Vias 124 may be masked in an oval shape, as shown in the horizontal cross-sectional view (i) of FIG. 6(1). In some examples, vias 124 may have a major axis of 100 nm along the X-direction and a minor axis of 60 nm along the Y-direction. Vias 124 are filled at a later time by a dielectric material so as to isolate adjacent storage transistors in an NOR memory strings to be formed.

Figure 6M:
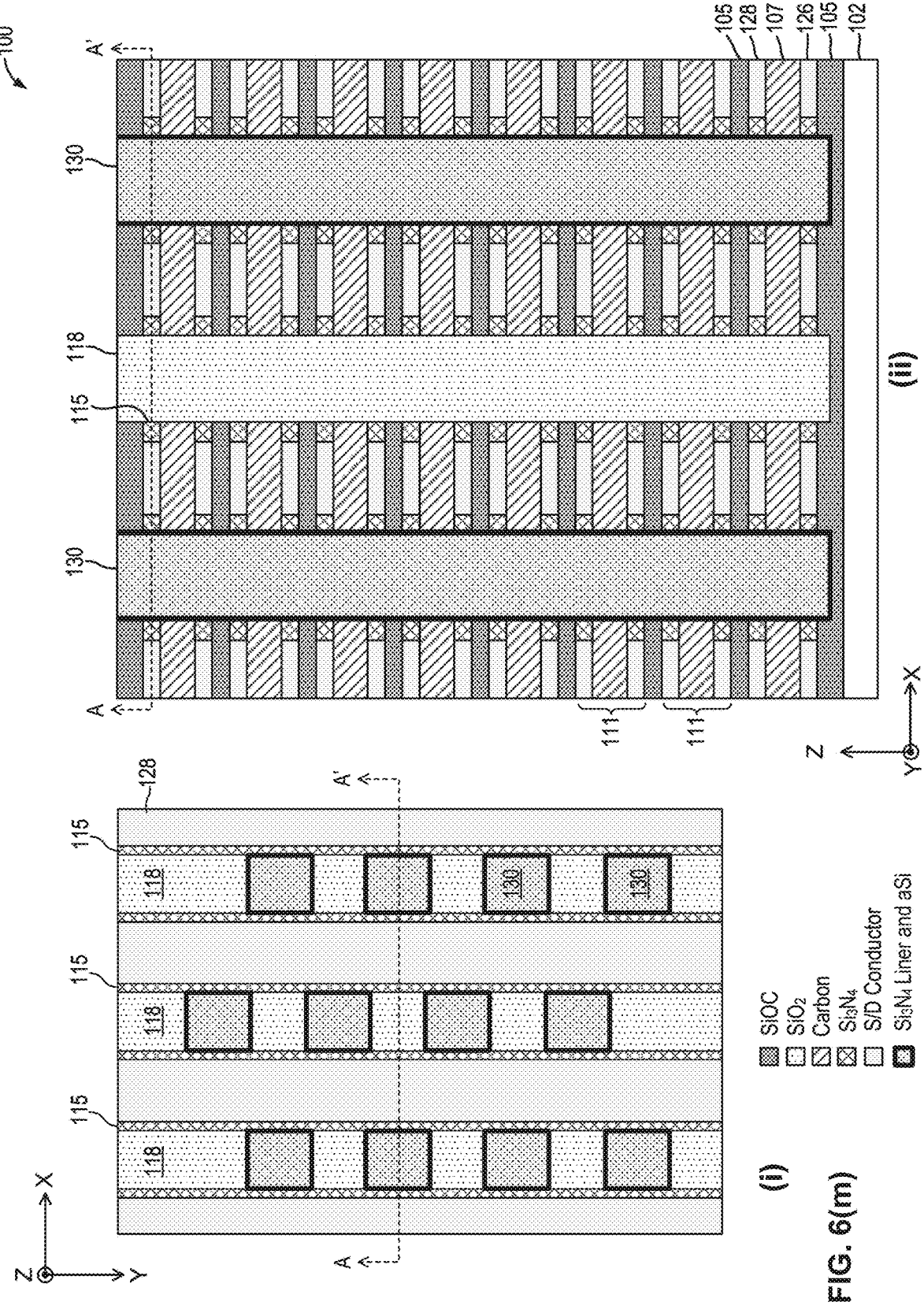
Figure 6N:
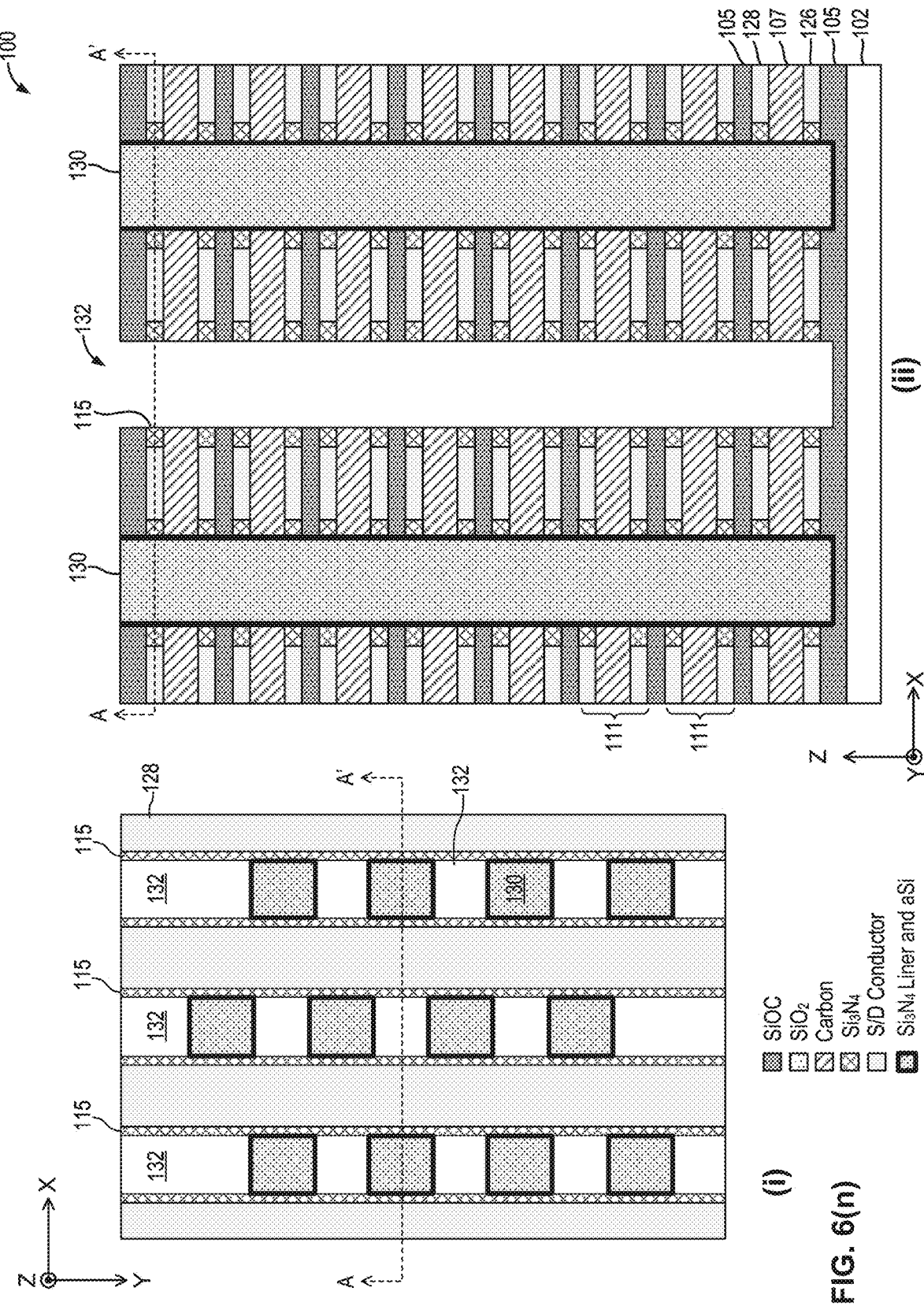

Referring to FIG. 6(m), vias 124 are then filled with a sacrificial silicon nitride liner and a sacrificial amorphous silicon layer, collectively referred to as sacrificial material 130. Excess materials on top of memory structure 100 may be removed using, for example, CMP. With the vias 124 filled, the remainder of dielectric material 118 in trenches 110 and 120 is then removed using, for example, a wet etch step. As a result, cavities 132 are formed in trenches 110 and 120 outside of the vias 124 which are now filled with the sacrificial material 130 of silicon nitride liner and amorphous silicon layer, as shown in FIG. 6(n).

Figure 6O:
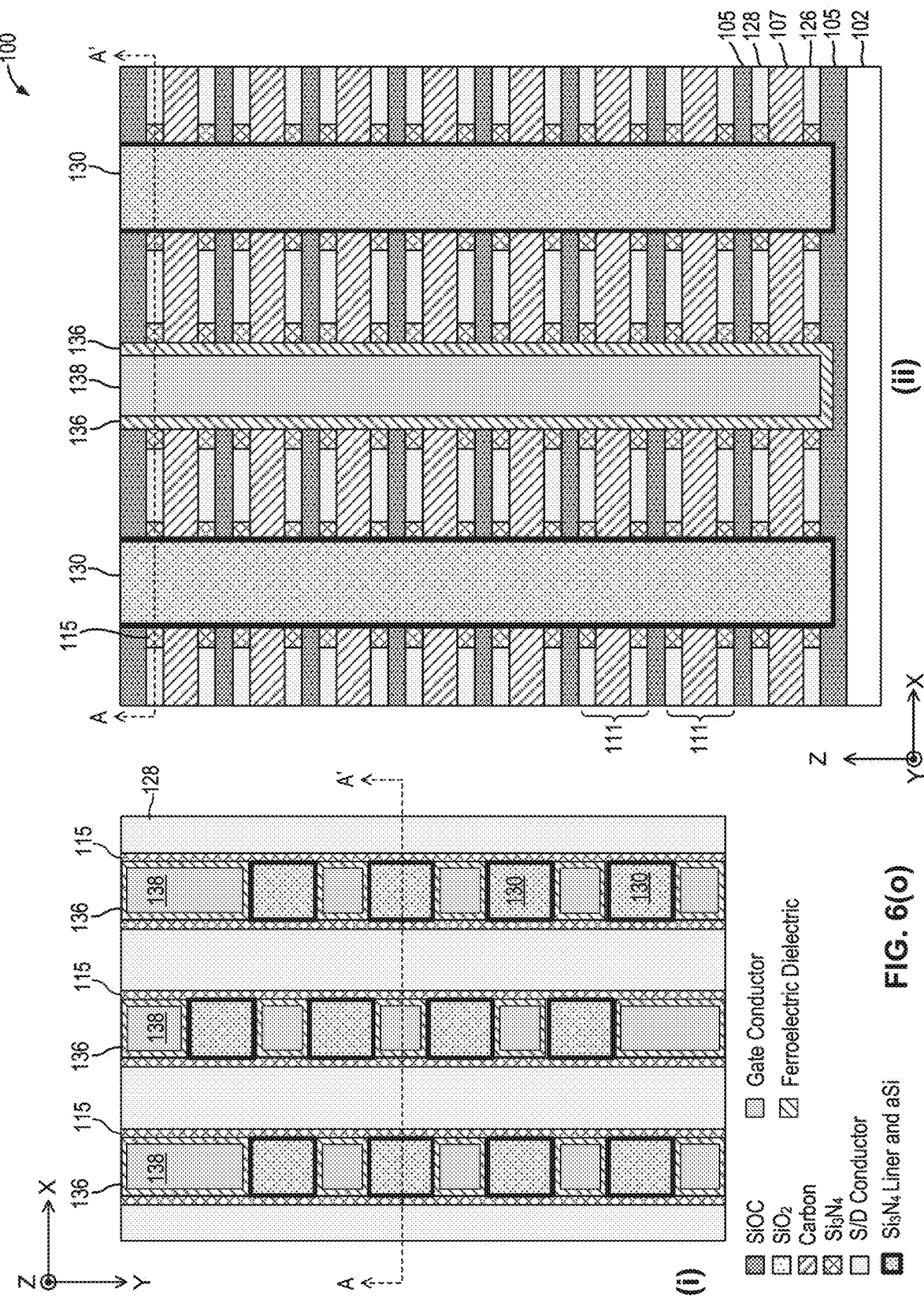

Referring to FIG. 6(o), a ferroelectric dielectric layer 136 is then conformally deposited on the exposed sidewalls of the excavated cavities between the filled structures of the sacrificial material 130. In some embodiments, the ferroelectric dielectric layer 136 is deposited by any one of suitable deposition methods including but not limited to chemical vapor deposition (CVD), low pressure chemical vapor deposition (LPCVD), physical vapor deposition (PVD) and atomic layer deposition (ALD). Other deposition methods such as evaporation and electrodeposition can also be used. In some embodiments, the ferroelectric dielectric layer 136 is a doped hafnium oxide ($HfO_2$) layer. In one embodiment, the hafnium oxide is doped with zirconium oxide ($ZrO_2$) to form a hafnium zirconium oxide layer (HfZrO or "HZO"). In another embodiment, the hafnium oxide is doped with silicon (Si), iridium (Jr) and lanthanum (La). In some embodiments, the ferroelectric dielectric layer 136 is a material selected from: zirconium-doped hafnium oxide (HZO), silicon-doped hafnium oxide (HSO), aluminum zirconium-doped hafnium oxide (HfZrAlO), aluminum-doped hafnium oxide (HfO2:Al), lanthanum-doped hafnium oxide (HfO2:La), hafnium zirconium oxynitride (HfZrON), hafnium zirconium aluminum oxide (HfZrAlO), and any hafnium oxide that includes zirconium impurities.

In one embodiment, the ferroelectric dielectric layer 136 has a thickness of 4 nm. In some embodiments, an interface dielectric layer is formed on the exposed sidewalls of the excavated cavities before the ferroelectric dielectric layer is formed. In some embodiments, the interface dielectric layer is formed using a material with a high permittivity (K) (also referred to as "high-K" material). In one example, the interface dielectric layer, if present, may be a silicon nitride ($Si_3N_4$) layer and has a thickness of 1 nm. The ferroelectric dielectric layer 136 may be deposited and then annealed to form the ferroelectric phase in the ferroelectric material. The ferroelectric dielectric layer 136 forms the gate dielectric layer of the ferroelectric storage transistors to be formed.

After the ferroelectric dielectric layer 136 is deposited, the cavities between the filled sacrificial material 130 are filled by a conductive layer 138, which may include successively deposited titanium nitride (TiN) liner and a tungsten (W) layer. The TiN liner may be formed using, for example, an atomic layer deposition (ALD) technique. In some embodiments, the annealing of the ferroelectric dielectric layer 136 is performed after the conductive layer 138 is deposited. As thus formed, the conductive layer 138 provides a vertical local word line (LWL) that serves as gate electrode for each of the ferroelectric storage transistors that are vertically aligned in the same active stack. The structure resulting from the combination of the ferroelectric dielectric layer 136 and the conductive layer 138 is referred herein as the local word line (LWL) structure. Excess deposited materials may be removed from the top of memory structure 100, such as by CMP. FIG. 6(o) illustrates the resulting memory structure 100.

It is instructive to note that the memory structure 100 includes regular sized cavities in a central portion of the memory structure and extended sized cavities at the edges of the memory structure. As a result, the memory structure 100 includes LWL structures formed in the regular sized cavities which are to be used to form the ferroelectric storage transistors of the NOR memory strings. The structures formed in the extended sized cavities at the edges of the memory structure 100 can be dummy structures or they can be converted to non-memory transistors, where applicable. The exact configuration of the memory structure 100 at the edges of the memory strings is not critical to the practice of the present invention.

Figure 6P:
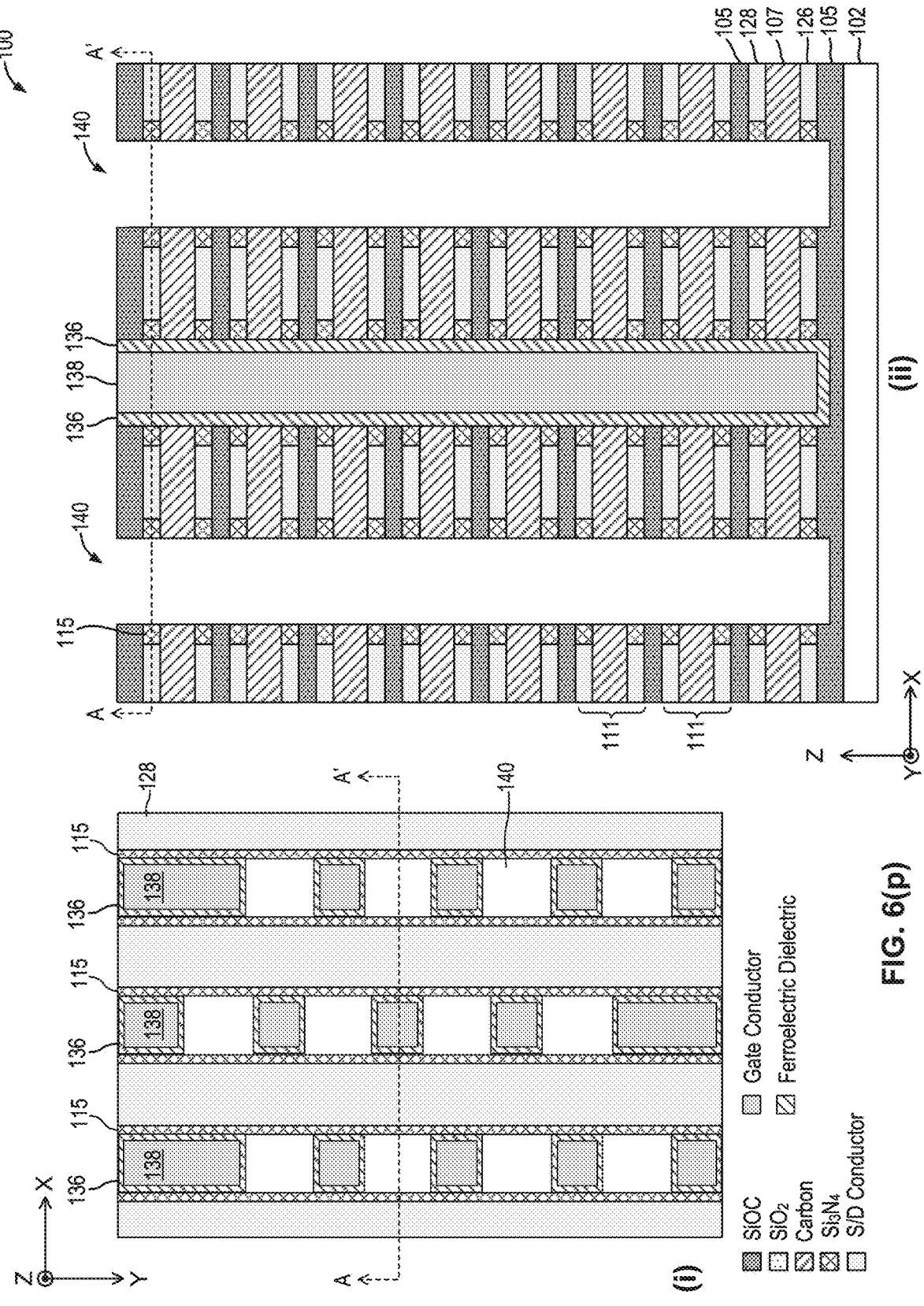

Referring to FIG. 6(p), subsequent to the LWL structures being formed, the sacrificial materials formed in the vias 124 are now removed, forming cavities 140 between the LWL structures. In the present embodiment, the amorphous silicon layer and the silicon nitride liner are removed, such as by using one or more wet etch step. The removal of the sacrificial material 130 from the vias 124 exposes the silicon nitride spacer 115 previously formed and the second sacrificial layer 107, which is a carbon layer in the present embodiment.

Figure 6Q:
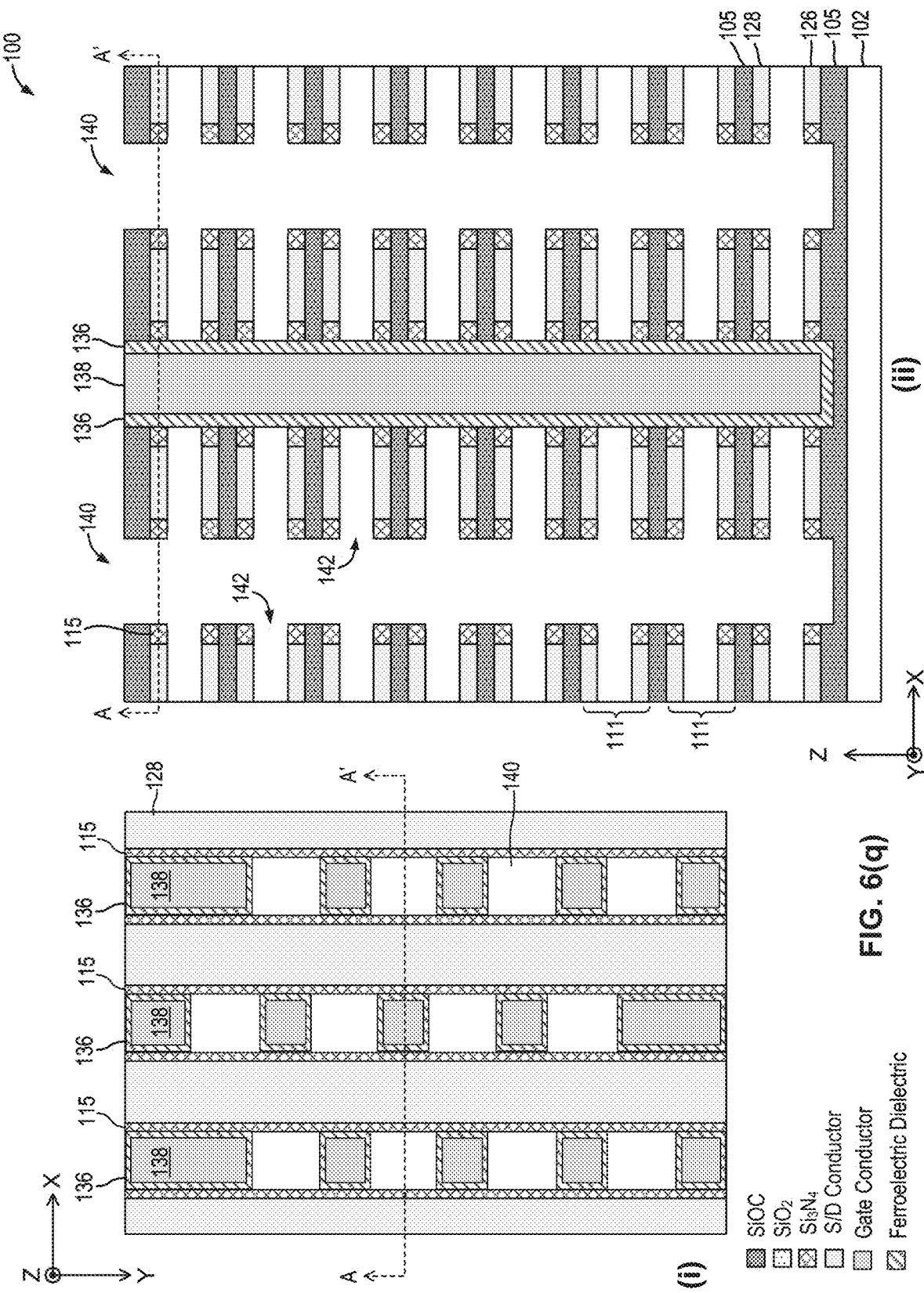

Referring to FIG. 6(q), with the sacrificial carbon layer 107 exposed in the vias 124, the carbon layer is removed using an ashing process and evacuated as a carbon oxide gas, leaving cavities 142. The silicon nitride spacer 115 remains at each conductive layers 126, 128. For example, the ashing step can be performed at 275° C. in a dry oxygen ($O_2$) ambient. The ashing process has the advantage that it does not damage the ferroelectric gate dielectric layer 136 already formed. In general, being amenable to removal by ashing is a significant advantage that carbon has over other sacrificial materials, as the input reactant gases (e.g., oxygen) are readily available and safe to handle, and the resulting and byproduct gases (e.g., $CO_2$) can also be easily handled and disposed, unlike the reactants of common wet etches, for example, which may include toxic, hazardous, or noxious chemicals or gases. In some embodiments, after the ashing process, a cleaning step may be performed to remove any thin oxidized layer that may be formed on the surfaces of cavities 142.

FIG. 6(q) illustrates the resulting memory structure 100. The cavities 142 will be used to form the channel regions of the ferroelectric storage transistors. Accordingly, in the fabrication process of the present disclosure, the channel regions of the ferroelectric storage transistors are formed after the gate dielectric and the gate electrode are formed. Such a process sequence is referred to as a "channel last" process.

Figure 6R:
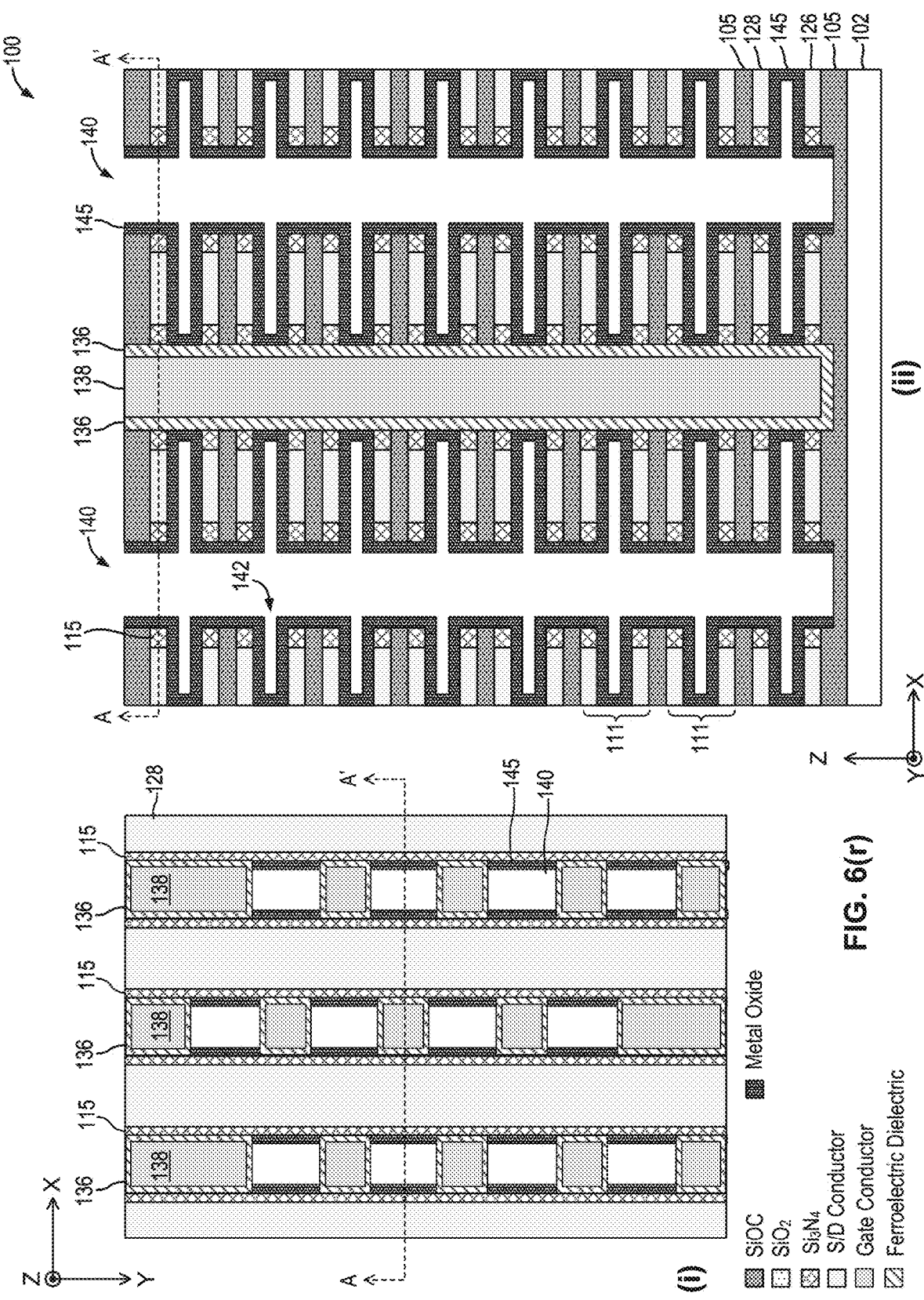

Referring to FIG. 6(r), a channel region is formed in the memory structure 100 by depositing an amorphous metal oxide semiconductor layer 145 conformally on the exposed sidewalls of the cavities 140 and excavated cavities 142. The amorphous metal oxide semiconductor layer 145 ("oxide semiconductor layer 145") maybe deposited using, for example, an atomic layer deposition (ALD) technique, a plasma-enhanced ALD technique or using physical vapor deposition (PVD). In particular, the oxide semiconductor layer 145 can be formed at a low processing temperature, such as lower than 400° C. In the present embodiment, the oxide semiconductor layer 145 is an indium gallium zinc oxide (InGaZnO, or "IGZO") layer. For example, IGZO deposition using thermal ALD or plasma enhanced ALD can be carried out at a processing temperature as low as 200° C. Other oxide semiconductor materials that may be used include indium zinc oxide (InZnO, or "IZO"), indium aluminum zinc oxide (IAlZnO) or indium tin zinc oxide (ITZO). In one embodiment, the oxide semiconductor layer 145 has a thickness of 10 nm. The oxide semiconductor layer 145 will become the channel region of the ferroelectric storage transistors.

Figure 6S:
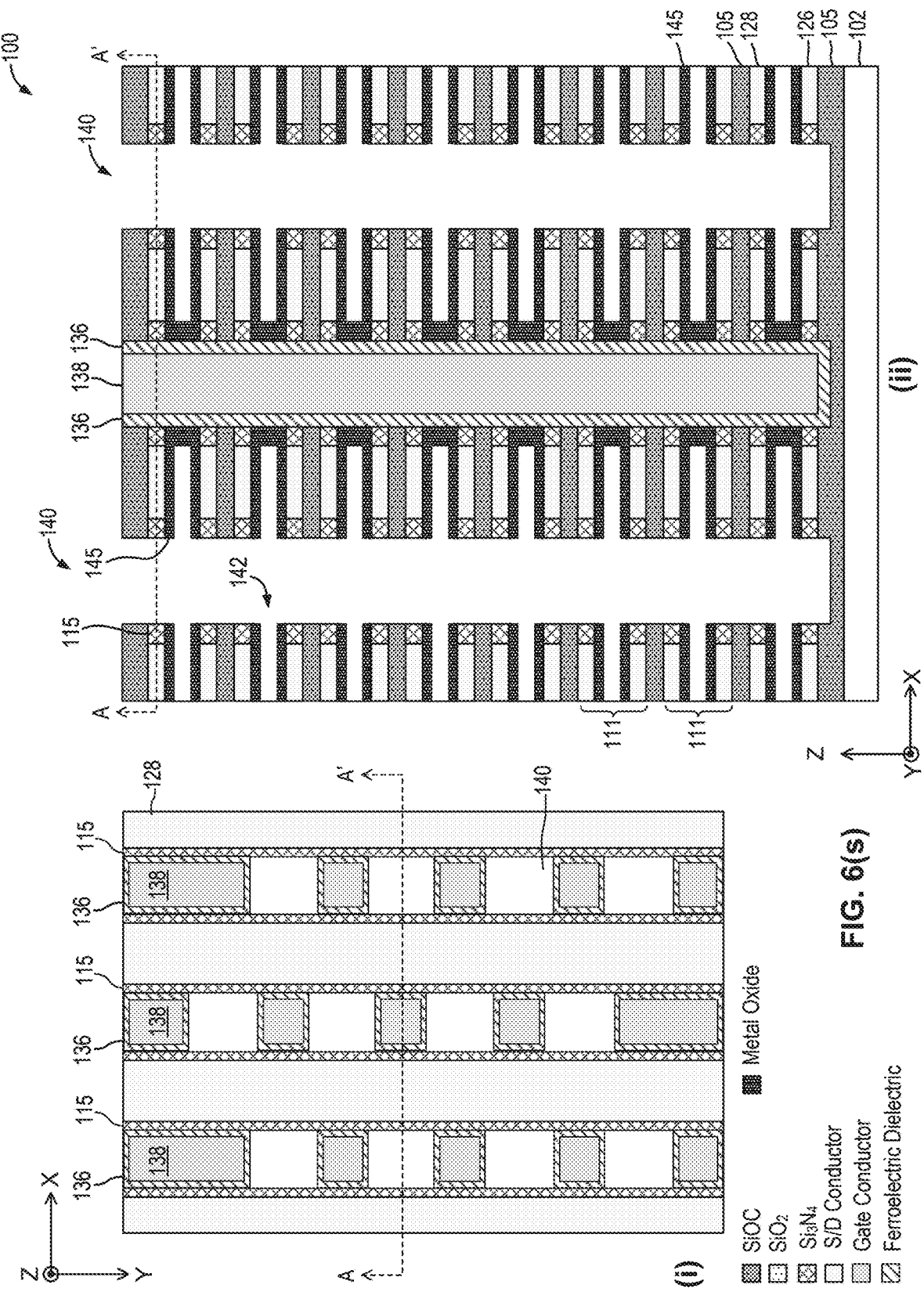

Referring to FIG. 6(s), after deposition of the conformal oxide semiconductor layer 145, the oxide semiconductor layer 145 is etched to separate the channel regions to each active layer 111. That is, the oxide semiconductor layer 145 formed on the sidewalls of the isolation layers 105 and the silicon nitride spacers 115 is removed. The oxide semiconductor layer 145 remains only in cavities 142 and is therefore isolated or separated to each active layer 111. For example, the oxide semiconductor layer 145 may be etched using a plasma dry etch process. After the removal of the oxide semiconductor layer from the sidewalls of the vias 140, the oxide semiconductor layer 145 is formed around the boundary surfaces of the cavities 142, as shown in FIG. 6(s).

Figure 6T:
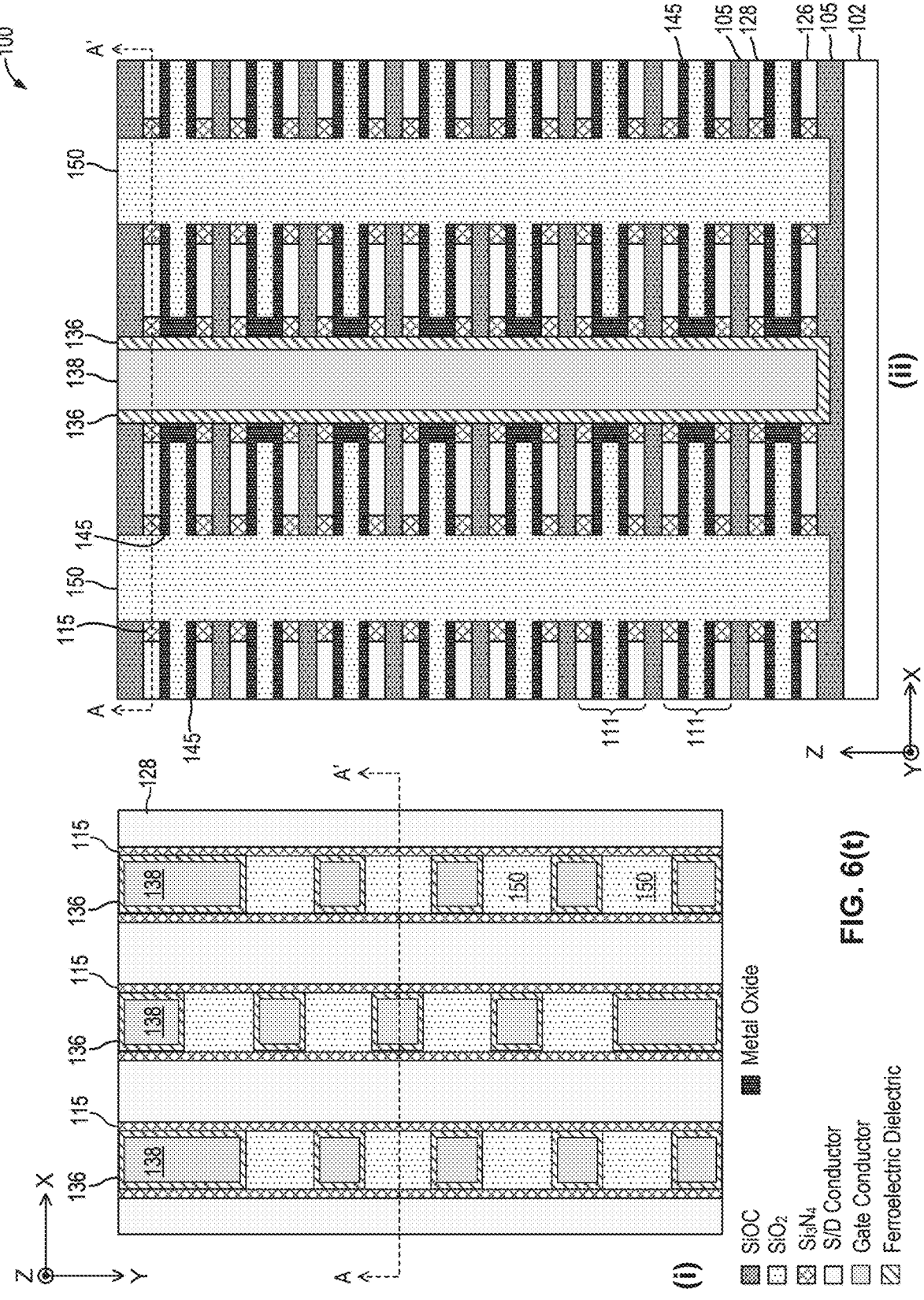

Referring to FIG. 6(t), a dielectric material 150 then fills the exposed vias 140. In some embodiments, the dielectric material 150 is silicon oxide, such as $SiO_2$. Excess material on top of memory structure 100 may be removed by CMP. The resulting memory structure 100 includes multiple layers of NOR memory strings of ferroelectric storage transistors formed in multiple active stacks to realize a memory device with large capacity. In particular, the ferroelectric storage transistors in the NOR memory strings are formed by the conductive layer 126 as the source terminal, the conductive layer 128 as the drain terminal, the oxide semiconductor layer 145 as the channel region, the ferroelectric dielectric layer 136 as the gate dielectric layer and the conductive layer 138 as the gate terminal or gate conductor. The source terminal 126 and the drain terminal 128 contacts the oxide semiconductor channel region 145 along respective horizontal portions (X-directions). The oxide semiconductor channel region 145 contacts the ferroelectric gate dielectric layer 136 at the vertical portion (Z-direction) of the oxide semiconductor layer. The silicon nitride spacer 115 provides insulation between each of the source line 126 and bit line 128 and the ferroelectric gate dielectric layer 136, which has the beneficial effect of reducing the word line to bit line capacitance.

Figure 7A:
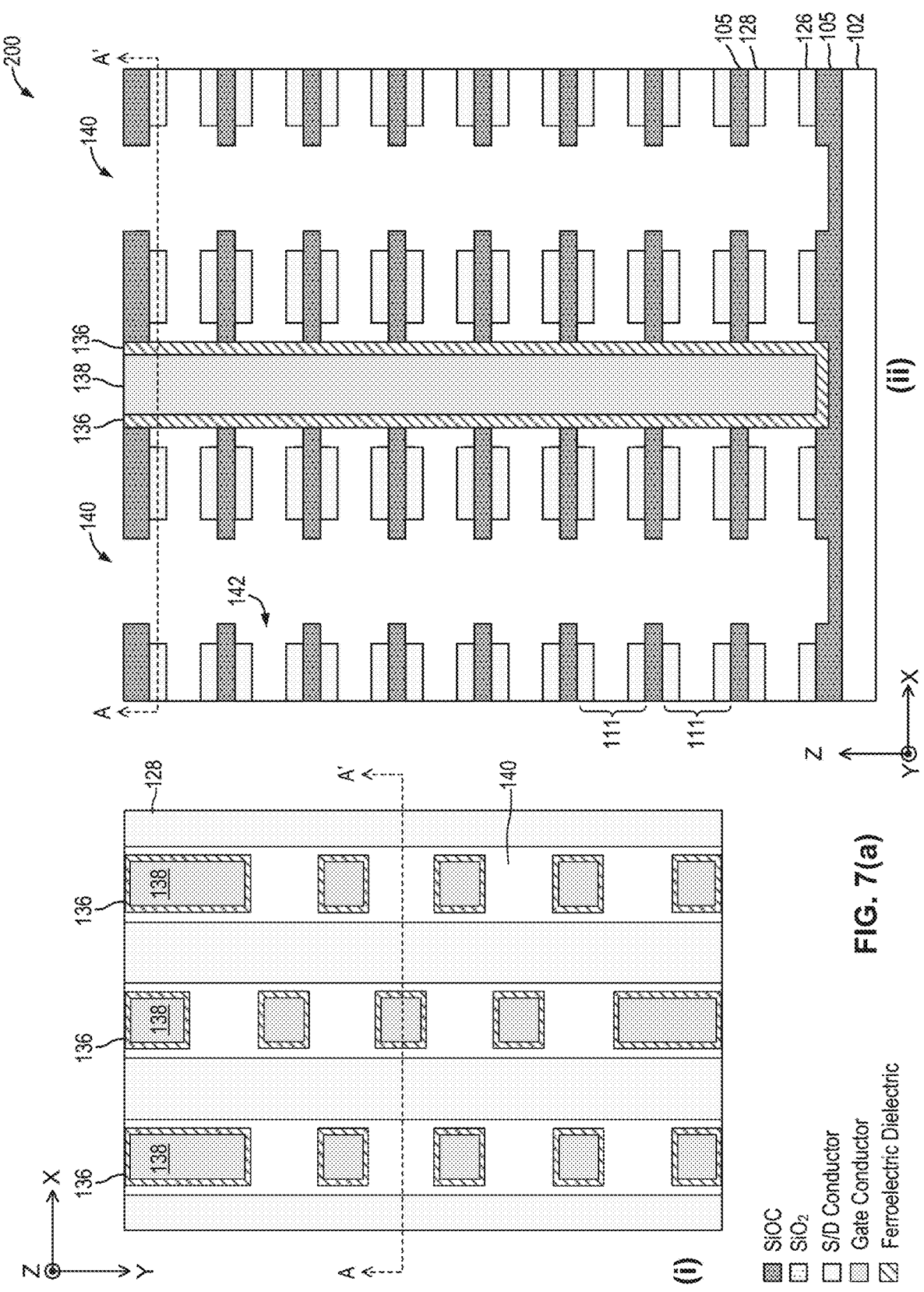
FIGS. 7(*a*) to 7(*c*) illustrate a process for fabricating a memory structure including a 3-dimensional array of NOR memory strings of ferroelectric storage transistors according to alternate embodiments of the present invention.
Figure 7B:
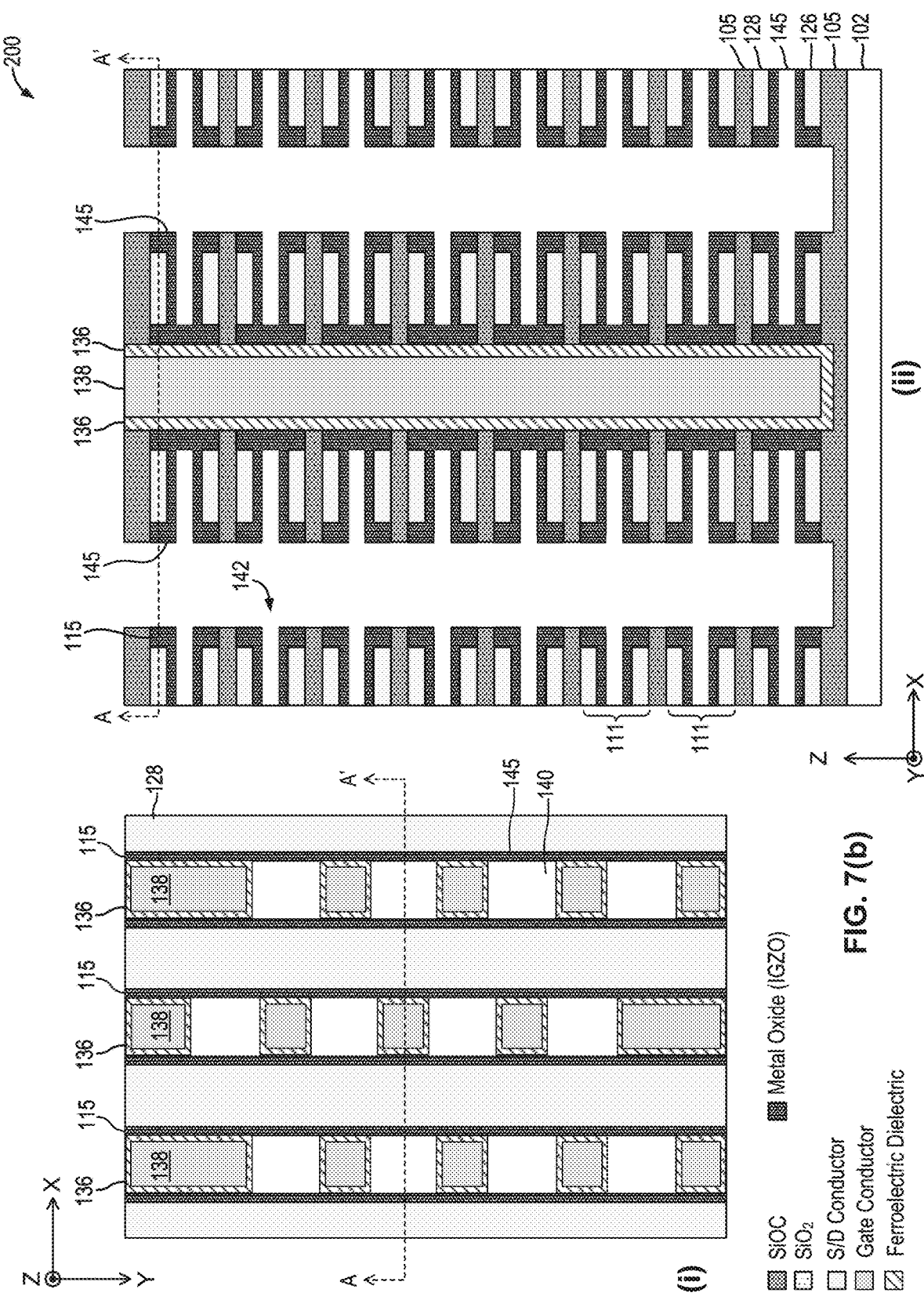
Figure 7C:
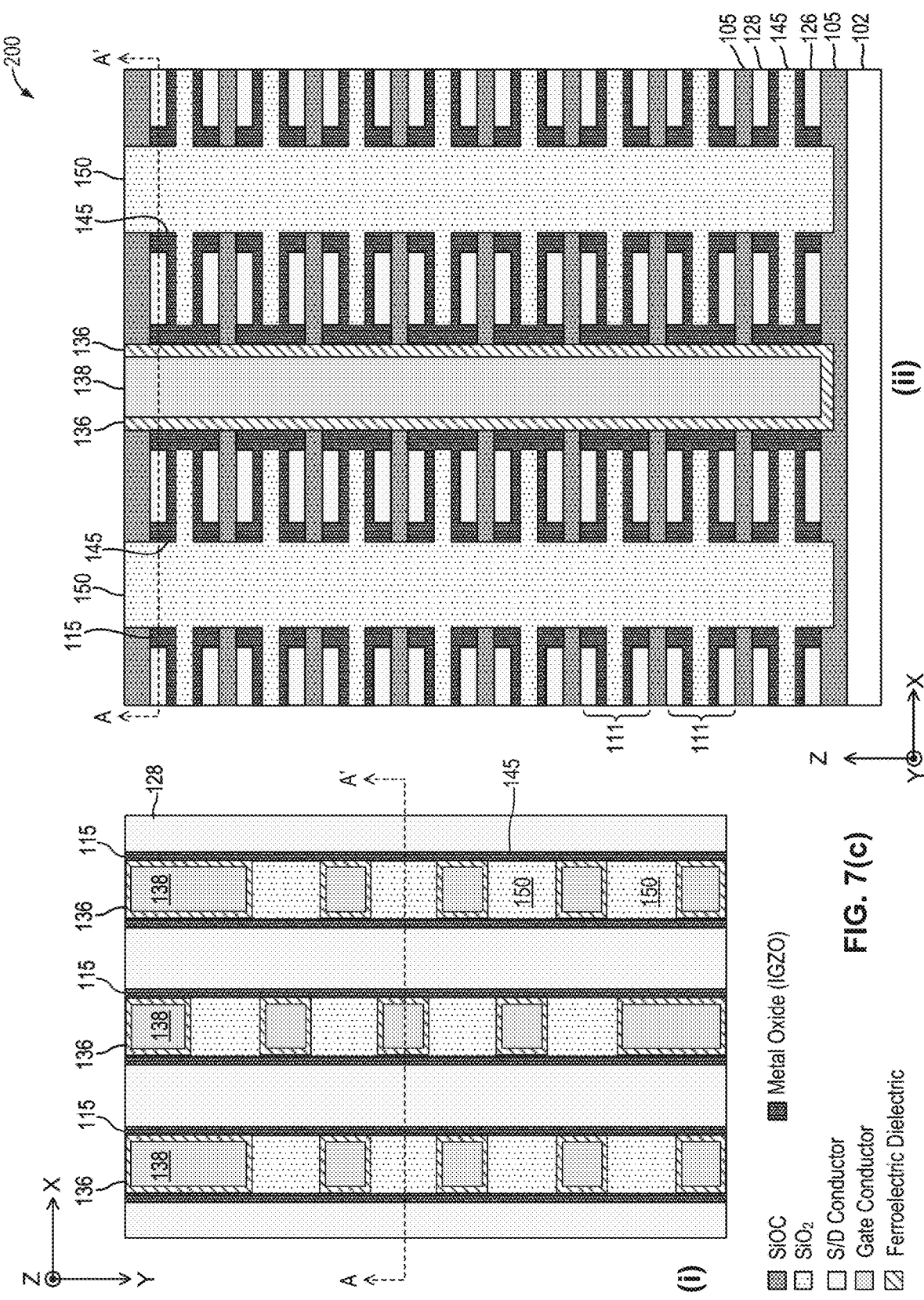

The fabrication process described in FIGS. 6(a) to 6(t) results in the ferroelectric storage transistor structure shown in FIG. 2(b). FIGS. 7(a) to 7(c) illustrate a process for fabricating a memory structure including a 3-dimensional array of NOR memory strings of ferroelectric storage transistors according to alternate embodiments of the present invention. In particular, FIGS. 7(a) to 7(c) illustrate the process for forming the ferroelectric storage transistor structure shown in FIG. 2(a) in which the silicon nitride spacer is removed and replaced by the oxide semiconductor channel region.

Referring to FIG. 7(a), the memory structure 200 has been constructed in the same manner as described above with reference to FIGS. 6(a) to 6(q), with a resulting structure where the sacrificial layer 107 has been removed and cavities 142 formed, as shown in FIG. 6(q).

In the alternate process of FIG. 7(a), the memory structure 200 is subjected to a wet etch process to remove the silicon nitride spacer 115. FIG. 7(a) illustrates the resulting memory structure 200. In particular, the silicon nitride spacers that previously separate the conductive layers 126, 128 from the ferroelectric gate dielectric layer 136 are removed and the regions previously occupied by the silicon nitride spacers 115 are now exposed.

Referring to FIG. 7(*b*), a channel region is formed in the memory structure 200 by depositing an amorphous metal oxide semiconductor layer 145 conformally on the exposed sidewalls of the cavities 140 and excavated cavities 142, using the same techniques as described above. In this case, the oxide semiconductor layer 145 fills the regions of cavities 142 between the conductive layers 126, 128 and the ferroelectric gate dielectric layer 136, forming a channel region at each active layer that occupies the space between adjacent isolation layer 105. After deposition of the conformal oxide semiconductor layer 145, the oxide semiconductor layer 145 is etched to separate the channel regions to each active layer 111. That is, the oxide semiconductor layer 145 formed on the sidewalls of the isolation layers 105 is removed. The oxide semiconductor layer 145 remains in cavities 142 and in the space previously occupied by the silicon nitride spacer 115. As a result, the oxide semiconductor layer 145 is isolated or separated to each active layer 111. For example, the oxide semiconductor layer 145 may be etched using a plasma dry etch process. After the removal of the oxide semiconductor layer from the sidewalls of the isolation layer 105, the oxide semiconductor layer 145 is formed around the boundary surfaces of the cavities 142 and along the sidewall of the ferroelectric gate dielectric layer 136 within each active layer, as shown in FIG. 7(*b*). The oxide semiconductor layer 145 for one active layer 111 is separated from that of another active layer 111 by the isolation layer 105.

Referring to FIG. 7(*c*), a dielectric material 150 then fills the exposed vias 140. In some embodiments, the dielectric material 150 is silicon oxide, such as $SiO_2$. Excess material on top of memory structure 100 may be removed by CMP. The resulting memory structure 200 includes multiple layers of NOR memory strings of ferroelectric storage transistors formed in multiple active stacks to realize a memory device with large capacity. In particular, the ferroelectric storage transistors in the NOR memory strings are formed by the conductive layer 126 as the source terminal, the conductive layer 128 as the drain terminal, the oxide semiconductor layer 145 as the channel region, the ferroelectric dielectric layer 136 as the gate dielectric layer and the conductive layer 138 as the gate terminal or gate conductor. In particular, the ferroelectric storage transistor of FIG. 2(*a*) is formed where the source terminal 126 and the drain terminal 128 contacts the oxide semiconductor channel region 145 along respective horizontal portions (X-directions) as well as long the vertical portion (Z-direction). The oxide semiconductor channel region 145 contacts the ferroelectric gate dielectric layer 136 at the vertical portion (Z-direction) of the oxide semiconductor layer formed between adjacent isolation layer 105. The ferroelectric storage transistors thus formed have increased contact space between the source/drain terminals and channel region to enhance the electric field for inducing polarization in the ferroelectric gate dielectric layer.

In alternate embodiments of the present disclosure, the memory structure can be formed using a channel formation process described in copending and commonly assigned U.S. patent application Ser. No. 16/875,460, entitled "PROCESSES FOR FORMING 3-DIMENSIONAL HORIZONTAL NOR MEMORY ARRAYS," by Eli Harari and Wu-Yi Henry Chien, filed May 15, 2020, which patent application is incorporated herein by reference in its entirety. In the '460 patent application, the channel is formed by first creating cavities by removing of a sacrificial layer through shaft openings and then depositing through the shafts into the cavities the channel material, forming a macaroni shaped tube in each cavity of each active strip.

To apply the process of the '460 patent application to the memory structure of the present disclosure, the memory structure is fabricated in the same manner as described above with reference to FIGS. 6(*a*) to 6(*o*), with a resulting structure where the local word line structures have been formed, as shown in FIG. 6(*o*). Then, the memory structure is patterned to remove the sacrificial material 130 (the amorphous silicon layer and the silicon nitride liner) at designated locations to form vertical shafts, each shaft being provided between adjacent active stacks. The shafts extend through all of the active strips in the memory structure, up to the bottommost active layer or below. In some examples, certain locations along the active stacks in the Y-direction have been designated for forming shafts where the dimensions of the vias 124, in which the sacrificial material 130 is to be formed, are made larger than the dimensions of the vias 124 between local word line structures. In practice, one or more rows of shafts can be formed in the memory structure.

The vertical shafts thus formed expose vertical sidewalls of each active strip in each active stack. In particular, the carbon layer 107 and the silicon nitride spacer 115 are both exposed through the shafts. Through the shafts, the carbon layer 107 is removed using an ashing process and evacuated as a carbon oxide gas, leaving cavities in place of the sacrificial carbon layer. Then, a wet etch process is carried out to remove the silicon nitride spacer 115, resulting in air-filled cavities or tunnels in place of the removed carbon and silicon nitride materials.

Thereafter, a channel region is formed in the memory structure by depositing an amorphous metal oxide semiconductor layer conformally on the walls of the air-filled cavities, using the techniques described above, such as ALD or plasma-enhanced ALD. In this case, the oxide semiconductor layer fills cavities created by removal of the silicon nitride spacers and also coats the sidewalls of the cavities created by removal of the carbon layer, forming the oxide semiconductor channel region as shown in FIG. 2(*a*). In one embodiment, the oxide semiconductor layer is a thin amorphous IGZO layer, such as around 6-10 nm, and is deposited at a temperature of around 300° C.

After deposition of the conformal oxide semiconductor layer, extra materials in the shafts are removed, such as by dry etch or wet etch process. The remaining cavities or tunnels left after the oxide semiconductor layer deposition may be left as air-filled (i.e., an air gap) or may be partially filled by deposition of a dielectric material through the shafts. In some embodiments, the dielectric material is silicon oxide, such as $SiO_2$. The memory structure may be further processed by removing any remaining sacrificial material 130 and replacing with a dielectric material, such as silicon oxide. As thus fabricated, the memory structure 30 of FIG. 2(*a*) results.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A three dimensional memory structure formed above a planar surface of a semiconductor substrate, the memory structure comprising:

a plurality of thin-film ferroelectric field-effect transistors (FeFETs) formed above the semiconductor substrate and arranged in one or more parallel planes, wherein (i) the thin-film FeFETs are organized as NOR memory strings, each NOR memory string extending along a first direction substantially parallel to the planar surface of the semiconductor substrate; (ii) the NOR memory strings are arranged as stacks of NOR memory strings, each stack including NOR memory strings arranged one on top of another along a second direction substantially normal to the planar surface, the NOR memory strings within each stack being isolated from another by a first isolation layer separating adjacent planes; (iii) the FeFETs within each NOR memory string share a common source line and a common bit line; (iv) each FeFET in each NOR memory string comprising an oxide semiconductor layer and a ferroelectric gate dielectric layer formed adjacent the oxide semiconductor layer, the oxide semiconductor layer forming a channel region between the common source line and the common bit line; and (v) a plurality of conductors each extending along the second direction, each conductor being provided between adjacent stacks of NOR memory strings and serving as a common gate electrode for respective FeFETs in the NOR memory strings of the adjacent stacks, wherein each FeFET in a NOR memory string includes a source terminal formed by the common source line, a drain terminal formed by the common bit line, the source terminal and the drain terminal being formed on a first side of the channel region away from the ferroelectric gate dielectric layer, and each FeFET in the NOR memory string is controlled by respective gate electrode formed adjacent the ferroelectric gate dielectric layer on a second side, opposite the first side, of the channel region, and wherein, in each NOR memory string, the common source line and the common bit line each extends along the first direction and are arranged spaced apart from each other in the second direction by a second isolation layer; and the oxide semiconductor layer comprises a first portion formed between the common source line and the second isolation layer, a second portion formed between the common bit line and the second isolation layer, and a third portion formed on the sidewall of the second isolation layer and extending in the second direction from the common source line to the common bit line, the third portion isolating the common source line and the common bit line from the ferroelectric gate dielectric layer.

2. The memory structure of claim 1, wherein the oxide semiconductor layer associated with the FeFETs in each NOR memory string contacts the common source line and the common bit line through the third portion to provide a junctionless channel region for each FeFET.

3. The memory structure of claim 1, wherein the oxide semiconductor layer is formed after the ferroelectric gate dielectric layer and the plurality of conductors are formed.

4. The memory structure of claim 1, wherein the NOR memory strings are arranged as rows of NOR memory strings arranged along a third dimension substantially orthogonal to both the first dimension and the second direction.

5. The memory structure of claim 1, wherein the ferroelectric gate dielectric layer comprises a ferroelectric gate dielectric layer provided adjacent each conductor as a continuous layer in the second direction.

6. The memory structure of claim 1, wherein the ferroelectric gate dielectric layer comprises a ferroelectric gate dielectric layer provided adjacent each conductor, the ferroelectric gate dielectric layer associated with each FeFET in each stack of NOR memory strings being separated from the ferroelectric gate dielectric layer of other FeFETs along the stack in the second direction.

7. The memory structure of claim 1, wherein the oxide semiconductor layer comprises one of an indium zinc oxide (IZO) layer and an indium gallium zinc oxide (IGZO) layer.

8. The memory structure of claim 7, wherein the ferroelectric gate dielectric layer contacts the oxide semiconductor layer directly substantially without an interface dielectric layer therebetween.

9. The memory structure of claim 1, wherein the oxide semiconductor layer and the ferroelectric gate dielectric layer are formed adjacent a respective conductor between adjacent stacks and the oxide semiconductor layer is isolated in the first direction from the oxide semiconductor layer associated with other conductors provided between the same adjacent stacks.

10. The memory structure of claim 1, wherein the common source line and the common bit line each comprises a metal layer.

11. The memory structure of claim 10, wherein the metal layer comprises one or more of: molybdenum, titanium, tungsten, lanthanum, tantalum, ruthenium, any silicide thereof, any nitride thereof, and any combination thereof.

12. The memory structure of claim 1, wherein the plurality of conductors each comprises a titanium nitride layer.

13. The memory structure of claim 12, wherein the plurality of conductors each comprises the titanium nitride layer formed adjacent the ferroelectric gate dielectric layer and a tungsten layer formed adjacent the titanium nitride layer.

14. The memory structure of claim 1, wherein the ferroelectric gate dielectric layer comprises a doped hafnium oxide layer.

15. The memory structure of claim 14, wherein the doped hafnium oxide layer comprises one or more of: zirconium-doped hafnium oxide (HZO), silicon-doped hafnium oxide (HSO), aluminum zirconium-doped Hafnium oxide (HfZrAlO), aluminum-doped hafnium oxide (HfO2: Al), lanthanum-doped hafnium oxide (HfO2: La), hafnium zirconium oxynitride (HfZrON), hafnium zirconium aluminum oxide (HfZrAlO) and any hafnium oxide that includes zirconium impurities.

16. The memory structure of claim 1, wherein each stack of NOR memory strings comprises FeFETs formed on the sidewalls on both sides of the stack.

17. The memory structure of claim 1, wherein circuitry for supporting memory operations is formed at the planar surface of the semiconductor substrate underneath the plurality of stacks of FeFETs.

18. The memory structure of claim 17, wherein the circuitry for supporting memory operations implements erase, program and read operations for the plurality of stacks of FeFETs in response to erase, program and read commands provided to the memory structure.

19. The memory structure of claim 17, further comprising a layer of interconnect conductors formed above and in electrically connection with the NOR memory strings and the circuitry for supporting memory operations, the layer of interconnect conductors being provided for routing control and data signals among the NOR memory strings and the circuitry for supporting memory operations.

20. The memory structure of claim 19, wherein the circuitry for supporting memory operations comprises two or more of: word line driver circuits, bit line driver circuits, input/output driver circuits, address decoders, sense amplifiers, voltage sources for generating operating voltages for the memory operation, latches, registers, or other memory elements, and a state machine for managing the memory operations at the FeFETs of the NOR memory strings.

\* \* \* \* \*